United States Patent
Vinciarelli et al.

(10) Patent No.: US 10,791,645 B1
(45) Date of Patent: *Sep. 29, 2020

(54) PANEL-MOLDED ELECTRONIC ASSEMBLIES

(71) Applicant: VLT, Inc., Andover, MA (US)

(72) Inventors: Patrizio Vinciarelli, Boston, MA (US);
Michael B. LaFleur, East Hampstead, NH (US); Sean Timothy Fleming, Worcester, MA (US); Rudolph F. Mutter, North Andover, MA (US); Andrew T. D'Amico, Beverly Hills, CA (US)

(73) Assignee: VLT, Inc., Andover, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/791,478

(22) Filed: Feb. 14, 2020

Related U.S. Application Data

(62) Division of application No. 15/150,875, filed on May 10, 2016, which is a division of application No. (Continued)

(51) Int. Cl.
*H05K 5/00* (2006.01)
*H05K 7/14* (2006.01)
(Continued)

(52) U.S. Cl.
CPC ..... *H05K 7/1427* (2013.01); *B29C 45/14639* (2013.01); *H05K 1/11* (2013.01);
(Continued)

(58) Field of Classification Search
CPC .......... H05K 7/1427; H05K 1/11; H05K 1/18; B29C 45/14639; B29C 2045/169; B29C 2793/009; B29C 45/0055; B29K 2063/00
See application file for complete search history.

(56) References Cited

U.S. PATENT DOCUMENTS 4,326,765 A 4/1982 Brancaleone
4,366,342 A 12/1982 Breedlove
(Continued)

FOREIGN PATENT DOCUMENTS

WO WO 1995/027308 10/1995

OTHER PUBLICATIONS

AFM Microelectronics Inc., "General Purpose Capacitors," www.afmmicroelectronics.com, 14 pages, published on or before Jul. 26, 2010.
(Continued)

*Primary Examiner* — Yuriy Semenenko
(74) *Attorney, Agent, or Firm* — Fish & Richardson P.C.

(57) ABSTRACT

A method of encapsulating a panel of electronic components such as power converters reduces wasted printed circuit board area. The panel, which may include a plurality of components, may be cut into one or more individual pieces after encapsulation with the mold forming part of the finished product, e.g. providing heat sink fins or a surface mount solderable surface. Interconnection features provided along boundaries of individual circuits are exposed during the singulation process providing electrical connections to the components without wasting valuable PCB surface area. The molds may include various internal features such as registration features accurately locating the circuit board within the mold cavity, interlocking contours for structural integrity of the singulated module, contours to match component shapes and sizes enhancing heat removal from internal components and reducing the required volume of encapsulant, clearance channels providing safety agency spacing and setbacks for the interconnects. Wide cuts may be made in the molds after encapsulation reducing thermal stresses and reducing the thickness of material to be cut during subsequent singulation. External mold features can include
(Continued)

various fin configurations for heat sinks, flat surfaces for surface mounting or soldering, etc. Blank mold panels may be machined to provide some or all of the above features in an on-demand manufacturing system. Connection adapters may be provided to use the modules in vertical or horizontal mounting positions in connector, through-hole, surface-mount solder variations. The interconnects may be plated to provide a connectorized module that may be inserted into a mating connector.

26 Claims, 38 Drawing Sheets

Related U.S. Application Data

14/635,467, filed on Mar. 2, 2015, now Pat. No. 9,516,761, which is a division of application No. 13/105,696, filed on May 11, 2011, now Pat. No. 8,966,747.

(51) Int. Cl.
| | |
|---|---|
| H05K 1/18 | (2006.01) |
| B29C 45/14 | (2006.01) |
| H05K 1/11 | (2006.01) |
| B29C 45/16 | (2006.01) |
| B29K 63/00 | (2006.01) |
| B29C 45/00 | (2006.01) |

(52) U.S. Cl.
CPC ............ *H05K 1/18* (2013.01); *B29C 45/0055* (2013.01); *B29C 2045/169* (2013.01); *B29C 2793/009* (2013.01); *B29K 2063/00* (2013.01)

(56) References Cited

U.S. PATENT DOCUMENTS

| | | | |
|---|---|---|---|
| 4,479,686 A | | 10/1984 | Hoshino |
| 4,551,747 A | * | 11/1985 | Gilbert .................. H01L 23/057 257/691 |
| 5,241,133 A | | 8/1993 | Mullen et al. |
| 5,471,366 A | * | 11/1995 | Ozawa ................ H01L 23/3677 174/521 |
| 5,557,142 A | | 9/1996 | Gilmore |
| 5,728,600 A | | 3/1998 | Saxelby, Jr. et al. |
| 5,864,092 A | | 1/1999 | Gore et al. |
| 6,031,726 A | | 2/2000 | Vinciarelli et al. |
| 6,229,216 B1 | | 5/2001 | Ma et al. |
| 6,403,009 B1 | | 6/2002 | Saxelby, Jr. et al. |
| 6,734,552 B2 | | 5/2004 | Combs |
| 6,830,959 B2 | | 12/2004 | Estacio |
| 6,903,938 B2 | | 6/2005 | Waffenschmidt |
| 6,940,013 B2 | | 9/2005 | Vinciarelli et al. |
| 7,015,587 B1 | | 3/2006 | Poddar |
| 7,030,469 B2 | | 4/2006 | Mahadevan et al. |
| 7,049,682 B1 | | 5/2006 | Mathews |
| 7,198,987 B1 | | 4/2007 | Warren |
| 7,298,038 B2 | * | 11/2007 | Filoteo, Jr. .......... H01L 23/3135 257/685 |
| 7,361,844 B2 | | 4/2008 | Vinciarelli et al. |
| 7,554,181 B2 | | 6/2009 | Satou et al. |
| 7,701,051 B2 | | 4/2010 | Bayerer et al. |
| 7,972,143 B2 | | 7/2011 | Smejtek |
| 7,994,888 B2 | | 8/2011 | Ikriannikov |
| 8,138,584 B2 | | 3/2012 | Wang |
| 8,240,035 B2 | | 8/2012 | Nishikawa |
| 8,299,882 B2 | | 10/2012 | Ikriannikov |
| 8,427,269 B1 | * | 4/2013 | Vinciarelli ............ H01F 27/022 336/178 |
| 9,402,319 B2 | * | 7/2016 | Vinciarelli ............. H05K 1/186 |
| 2002/0096348 A1 | | 7/2002 | Saxelby et al. |
| 2003/0011054 A1 | | 1/2003 | Jeun et al. |
| 2004/0100778 A1 | | 5/2004 | Vinciarelli et al. |
| 2006/0097831 A1 | | 5/2006 | Lotfi et al. |
| 2007/0241440 A1 | | 10/2007 | Hoang et al. |
| 2010/0197150 A1 | * | 8/2010 | Smejtek ................. H05K 3/366 439/61 |
| 2010/0246152 A1 | | 9/2010 | Lin et al. |
| 2010/0259909 A1 | * | 10/2010 | Ho ...................... H01F 27/2804 361/767 |
| 2011/0128033 A1 | | 6/2011 | Ohsawa |
| 2012/0287582 A1 | | 11/2012 | Vinciarelli et al. |

OTHER PUBLICATIONS

International Search Report and Written Opinion, PCT/US2012/37495, dated May 6, 2013, 18 pages.
Kahn, "Technical Information: Multilayer Ceramic Capacitors—Materials and Manufacture," Microelectronics Inc., 8 pages, published on or before Jul. 26, 2010.
Reply to Action in U.S. Appl. No. 13/105,696, dated Mar. 25, 2014, 10 pages.
Reply to Action in U.S. Appl. No. 14/116,642, dated May 9, 2016, 16 pages.
Reply to Action in U.S. Appl. No. 14/635,420, dated Nov. 13, 2015, 9 pages.
Reply to Ex Parte Quayle Action in U.S. Appl. No. 14/635,467, dated May 6, 2016, 5 pages.
U.S. Appl. No. 12/493,773, entitled "Encapsulation Method and Apparatus for Electronic Modules", Application and Preliminary Amendment filed Jun. 29, 2009, 63 pages.
USPTO Ex Parte Quayle Office Action in U.S. Appl. No. 14/635,467, dated Mar. 11, 2016, 5 pages.
USPTO Notice of Allowance in U.S. Appl. No. 13/105,696, dated Nov. 18, 2014, 6 pages.
USPTO Notice of Allowance in U.S. Appl. No. 14/635,420, dated Feb. 17, 2016, 6 pages.
USPTO Office Action in U.S. Appl. No. 13/105,696, dated Sep. 25, 2013, 8 pages.
USPTO Office Action in U.S. Appl. No. 14/116,642, dated Feb. 9, 2016, 15 pages.
USPTO Office Action in U.S. Appl. No. 14/635,420, dated Oct. 22, 2015, 6 pages.
USPTO Supplemental Notice of Allowance in U.S. Appl. No. 14/635,420, dated Apr. 27, 2016, 6 pages.

\* cited by examiner

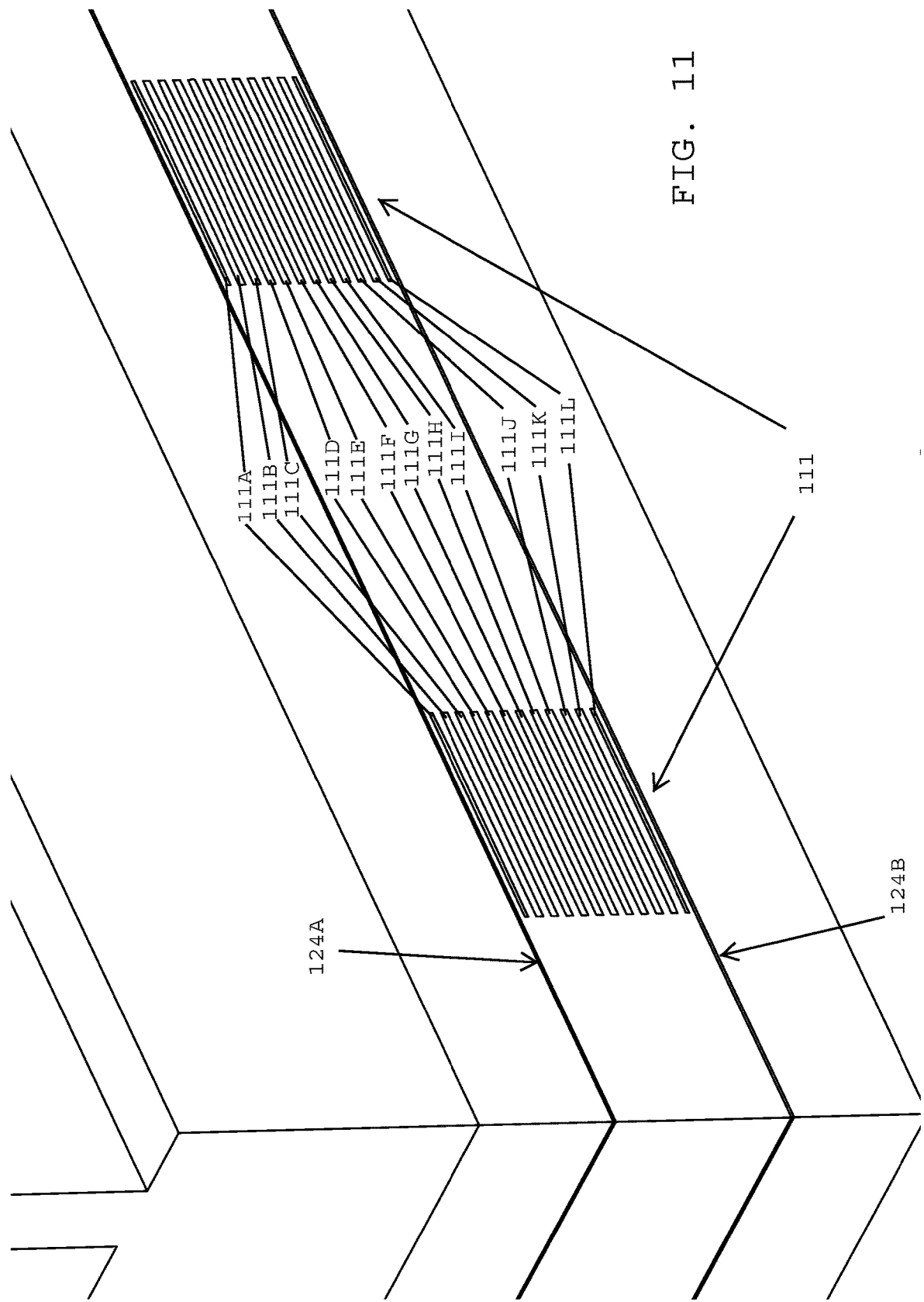

PANEL-MOLDED ELECTRONIC ASSEMBLIES

CROSS REFERENCE TO RELATED APPLICATIONS

This application is a divisional of and claims priority to U.S. patent application Ser. No. 15/150,875, filed on May 10, 2016, which is a divisional of and claims priority to U.S. patent application Ser. No. 14/635,467, filed on Mar. 2, 2015, which is a divisional of and claims priority to U.S. patent application Ser. No. 13/105,696, filed on May 11, 2011 (U.S. Pat. No. 8,966,747, issued on Mar. 3, 2015). The entire contents of the above applications are herein incorporated by reference.

FIELD OF THE INVENTION

This invention relates to the field of encapsulating electronic assemblies and more particularly to encapsulated power converters.

BACKGROUND

Contemporary electronic power systems require power converters capable of deployment at the point of load. Competing considerations require increasing power density, decreasing mounting area on customer motherboard, and lower cost.

An encapsulated electronic module, such as an electronic power converter module for example, may comprise a printed circuit assembly over-molded with an encapsulant to form some or all of the package and exterior structure or surfaces of the module. Encapsulation in this manner may aid in conducting heat out of the over-molded components, i.e., components that are mounted on the printed circuit assembly and covered with encapsulant. In the case of an electronic power converter module, the printed circuit assembly may include one or more inductive components, such as inductors and transformers. Encapsulated electronic power converters capable of being surface mount soldered to a customer motherboard are described in Vinciarelli et al., Power Converter Package and Thermal Management, U.S. Pat. No. 7,361,844, issued Apr. 22, 2008, (the "SAC Package Patent") (assigned to VLT, Inc. of Sunnyvale, Calif., the entire disclosure of which is incorporated herein by reference). Encapsulated electronic modules having at least one surface of a magnetic core structure exposed and methods for manufacturing the same are described in Vinciarelli et al., Encapsulation Method and Apparatus for Electronic Modules, U.S. patent application Ser. No. 12/493,773, filed Jun. 29, 2009, (the "Exposed Core Application") (assigned to VI Chip Inc. of Andover, Mass., the entire disclosure of which is incorporated herein by reference).

Methods of over-molding both sides of a printed circuit board assembly while leaving opposing regions on both sides of the printed circuit board free of encapsulant are described in Saxelby, et al., Circuit Encapsulation Process, U.S. Pat. No. 5,728,600, issued Mar. 17, 1998 and Saxelby, et al., Circuit Encapsulation, U.S. Pat. No. 6,403,009, issued Jun. 11, 2002 (collectively the "Molding Patents") (both assigned to VLT, Inc. of Sunnyvale, Calif. and incorporated by reference in their entirety).

Leads for connecting the encapsulated power converter substrate to the customer motherboard are described in Vinciarelli et al., Surface Mounting A Power Converter, U.S. Pat. No. 6,940,013, issued Sep. 6, 2005 (the "J-Lead Patent") (assigned to VLT, Inc. of Sunnyvale, Calif., the entire disclosure of which is incorporated herein by reference).

SUMMARY

In general, in one aspect, a method of making a plurality of electronic devices is provided. The method includes providing a plurality of mold panels, which when assembled, form an internal chamber; providing a substrate having a plurality of conductive traces and a plurality of components electrically connected to form at least one circuit, the substrate having at least one contact for making an electrical connection to the circuit; forming a panel assembly including the mold panels assembled with the substrate in the internal chamber and an encapsulant filling spaces between the substrate and interior surfaces of the chamber; curing the encapsulant; and cutting the panel assembly to expose at least a portion of the at least one contact and form a respective exposed contact.

Implementations of the method may include one or more of the following features. The cutting can include making a first cut in at least one of the mold panels, and in the first cut, making a second narrower cut through the panel assembly. The curing can include raising the temperature of the panel assembly and the first cut is made before the panel assembly cools after the curing. The cutting can divide the panel assembly producing at least one module having a plurality of layers including respective portions of each of the panel molds, the substrate, and the encapsulant, and the module can contain the at least one circuit. The cutting can define at least one side of the module. The cutting can defines two or more sides of the module. The method can further include treating the exposed contact to protect against oxidation. Treating the exposed contact can include applying a removable conformal coating to the exposed contact. Treating the exposed contact can include applying a layer of metal to the exposed contact. The metal applied to the exposed contact can include solder or a precious metal. Applying a layer of metal can include plating. The method can further include providing an adapter having at least one electrical terminal; and attaching the at least one electrical terminal to the exposed contact. The at least one contact can include a plurality of contacts; the module can include a plurality of exposed contacts; the adapter can have a plurality of electrical terminals arranged to match respective ones of the plurality of exposed contacts; and the adapter can be mechanically secured to the module. The mold panels can be metal. The respective portions of the mold panels can provide heat sink surfaces for the module. Contours can be provided in an internal surface of one or more of the mold panels. Providing the contours can include matching depths of portions of the internal surface to heights of one or more selected components. The selected components can include at least one magnetically permeable core and at least one semiconductor device. The traces and components can be electrically connected to form a plurality of separable circuits arranged in a pattern on the substrate; and the cutting can divide the panel assembly along spaces between the separable circuits into a plurality of modules each containing at least one respective circuit. The spaces between the separable circuits can have dimensions approximately matching a width of cuts produced by equipment used to cut the panel assembly. The at least one contact can include a plurality of contacts located in the spaces between the separable circuits. The plurality of contacts can be formed in the substrate. The plurality of contacts can be formed and buried below at least one surface of the substrate. The method can include treating at least one exterior surface of at least one of the mold panels for solderability. Forming the panel assembly can include dispensing encapsulant into a bottom panel mold; assembling the substrate into the bottom panel mold; dispensing encapsulant onto a top of the substrate; and assembling a top panel mold onto the substrate. The method can include centrifuging the assembly before curing the encapsulant. Forming the panel assembly can include assembling the substrate with a first substrate surface facing into a first panel mold, closing a second panel mold onto the substrate covering a second substrate surface, providing one or more conduits to the internal chamber, and forcing encapsulant through the one or more conduits into the chamber. The method can further include centrifuging the assembly before curing the encapsulant. The method can further include providing a connector for removably mating with and providing electrical connection to the metal. The method can further include providing a center plate having an opening to accommodate the substrate. Forming a panel assembly can include positioning the substrate in the opening of the center plate and closing the mold panels against the center plate. The method can further include providing at least one opening in the center plate connected to the internal chamber by at least one conduit; and forcing the encapsulant through the at least one opening and at least one conduit into the internal chamber. Forming a panel assembly can include securing the mold panels together prior to curing the encapsulant.

In general, in another aspect, a method of forming an electrical contact is provided. The method includes assembling a panel including a substrate having one or more conductive features enclosed within the panel and unexposed to an exterior surface of the panel, the one or more conductive features being located along a cut line; cutting the panel along the cut line exposing portions of the one or more conductive features for use as electrical connections to the substrate; and treating the portions of the one or more conductive features exposed from the cutting for preservation as electrical connections.

Implementations of the method may include one or more of the following features. The treating can include applying solder to the portions of the one or more conductive features exposed from the cutting. The treating can include applying a conformal coating to the portions of the one or more conductive features exposed from the cutting to protect against oxidation. The treating can include applying a metal layer to the portions of the one or more conductive features exposed from the cutting. The treating can include soldering a lead of an adapter to the portions of the one or more conductive features exposed from the cutting. The method can further include covering at least one surface of the substrate in an area including the cut line and the conductive features prior to cutting the substrate. The covering can include encapsulating the substrate with a molding compound. The method can further include providing a registration feature having a predetermined relationship to the substrate, and using the registration feature to align the cutting relative to the cut line. The method can further include establishing a pattern including at least one conductive layer in the substrate along the cut line to form the conductive features. The substrate can include a multilayer printed circuit board, and the pattern can include a plurality of conductive layers that are established along the cut line to form the conductive features. The method can further include establishing a pattern including at least one conductive via in the substrate along the cut line to form the conductive features. The conductive via can be filled with a conductive material. The conductive via can be buried in the substrate. The conductive via can be a through hole contacting the surfaces of the substrate. The through hole can be filled with a conductive material. The conductive features can be covered at the surfaces of the substrate by an insulative layer.

In general, in another aspect, an apparatus including a first mold panel is provided. The first mold panel includes an exterior surface, an interior surface defining an internal cavity, a clamp region located at points along a circumference of the internal cavity, and an opening. The first mold panel is adapted to (a) be engaged by pressure in the clamp region, (b) receive in the cavity a circuit panel containing a plurality of components and mold compound to fill empty spaces in the internal cavity, and (c) be cut after curing of the mold compound.

Implementations of the apparatus may include one or more of the following features. The interior surface in the region of the internal cavity can be adapted to adhere to the mold compound. The apparatus can further include a second mold panel. The second mold panel can include an exterior surface, an interior surface, and a clamp region, in which the second mold panel can be adapted to (a) close against and mate with the first mold panel, (b) be engaged by pressure in the clamp region, and (c) be cut after curing of the mold compound. The interior surface of the second mold can further define a second internal cavity, the clamp region of the second mold panel can be located at points along a circumference of the second internal cavity, and the internal cavity of the first mold panel can be adapted to receive a first side of the circuit panel and the second internal cavity can be adapted to receive a second opposite side of the circuit panel. The apparatus can further include contours formed in the interior surface of at least one of the mold panels. The contours can be adapted to match predetermined characteristics of selected ones of the plurality of components. The internal surface of the mold panel can be adapted to adhere to the molding compound. The contours can form interlocking features with cured mold compound. One or more of the mold panels can include a non-ferrous metal, aluminum, or a thermally conductive material. One or more of the mold panels can include a non-metallic substance. The apparatus can further include at least one channel connected to the internal cavity for allowing expansion of the mold compound. The apparatus can further include at least one channel connected to the internal cavity for injecting mold compound into the internal cavity. The exterior surface of the mold panel can include a plurality of fins. The exterior surface of the mold panel can include a flat surface. The flat surface can be adapted for a solder joint. The internal cavity can include features formed in the interior surface and arranged in a predetermined pattern. The internal cavity can include features formed in the interior surface along lines through which the mold panel maybe cut to establish a setback from a cut edge of the mold panel. The mold panel can include at least one registration feature adapted to engage and establish a predetermined relationship with the circuit panel. One or more selected portions of the mold panel can be adapted for incorporation into one or more products, the products being formed by a process which uses the mold panel to contain the molding compound. The exterior surface of the mold panel can include a flat surface with one or more pins protruding from the flat surface. The exterior surface of the mold panel can include a flat surface having one or more holes in the flat surface. The apparatus can further include a pin inserted into a respective one of the one or more holes.

In general, in another aspect, an apparatus including a panel assembly having external surfaces defined by a first mold panel and a second mold panel is provided. The first and second mold panels form an internal cavity enclosing an internal circuit board, the internal circuit board having a first surface and second surface and a plurality of components in an active circuit area on at least one of the surfaces, the components being electrically connected to interconnects contained within the internal cavity. The internal cavity is filled with mold compound in spaces unoccupied by the circuit board and components, and the panel assembly is adapted to have first selected portions of the first and second mold panels cut away to expose the interconnects and to have second selected portions of the respective mold panels situated near the active circuit area remain attached to the assembly following the cut.

Implementations of the apparatus may include one or more of the following features. The panel assembly can include a clamp region located at points along a circumference of the first and second internal cavities, and the first selected portions can include the clamp region.

In general, in another aspect, an apparatus including a panel assembly having external surfaces defined by a first mold panel and a second mold panel is provided. The first and second mold panels form an internal cavity enclosing an internal circuit board, the internal circuit board having a first surface and second surface and a plurality of components electrically connected to form a plurality of individual circuits, each individual circuit being electrically connected to respective interconnects located along a respective circuit perimeter, the interconnects being contained within the cavity.

Implementations of the apparatus may include one or more of the following features. The panel assembly can be adapted to be cut along the circuit perimeter separating the individual circuits, dividing the panel assembly into individual circuit modules, and exposing selected portions of the interconnects. The panel assembly can be constructed to retain an integral layered structure after being filled with mold compound which is subsequently cured, the layered structure comprising a first layer including a portion of the first mold, a second layer including a portion of the mold compound, a third layer including a portion of the circuit board, a fourth layer including a portion of the mold compound, and a fifth layer including a portion of the second mold. The internal circuit board can include a plurality of circuits having the same functionality. The apparatus can further include one or more conduits connecting the internal cavity to an external opening. Spaces unoccupied by the circuit board, components, and interconnects in the internal cavity can be filled with mold compound. The mold compound has been cured. Selected portions of at least one of the mold panels have been removed, the selected portions being located near the circuit perimeters.

In general, in another aspect, an apparatus including a modular package is provided. The modular package has a first external surface, a second external surface opposite the first external surface, and a side wall extending along the perimeter of and connecting with the first and second external surfaces. The modular package includes a first layer defining the first external surface and a second layer defining the second external surface, the first and second layers being separated by and in contact with cured mold compound. An electrical circuit is located between the first and second layers and within the cured mold compound and including at least one electrical component electrically connected to a plurality of interconnects. The side wall includes a strip formed by the first layer, a strip formed by the second layer, and a strip formed by the cured mold compound. The interconnects are disposed within the side wall.

Implementations of the apparatus may include one or more of the following features. The first and second layers can include a non-ferrous metal or aluminum. The first external surface can include a plurality of fins. The first external surface can include an essentially flat area. The essentially flat area can be adapted for a solder joint. The electrical circuit can include a circuit board, and the side wall can include a strip formed by the circuit board and an additional strip formed by cured mold compound. The interconnects can include conductive features in the circuit board. The circuit board can include a multilayer printed circuit board ("PCB") and each of the interconnects can include a plurality of conductive layers in the PCB. Each of the interconnects can include a plurality of conductive vias in the circuit board. The apparatus can further include interlocking features. The interlocking features can include a contour formed in an interior surface of the first layer, the contour being filled with cured mold compound. The circuit board can include a top surface and a bottom surface and the at least one electrical component can include a set of top-side components mounted on the top surface and a set of bottom-side components mounted on the bottom surface. The top-side components can include a number, T, of large-footprint components, the bottom-side components can include a number, B, of large-footprint components, and the number T can be approximately equal to the number B. Each of most of the top-side large-footprint components can share a respective set of conductive vias with a corresponding one of the bottom-side large-footprint components. Each of most of the top-side large-footprint components is located in a respective footprint shared by a corresponding one of the bottom-side large-footprint components. The circuit board can include a top surface and a bottom surface, the at least one electrical component can include a number, T, of large-footprint components mounted on the top surface, and most of the large-footprint components can be distributed symmetrically in relation to an axis on the top surface. The axis can be along a midline of the top surface. The axis can be defined in relation to a predetermined component. The apparatus can further include an adapter for providing mechanical and electrical connections between the modular package and an external mounting surface, the adapter having a body and a plurality of electrical terminals supported by the body; and electrical connections formed between the adapter terminals and respective interconnects on the modular package. The adapter body can be mechanically secured to the modular package, and the adapter terminals can be arranged to mate with the external mounting surface. The external mounting surface can be a circuit board and the terminals can include ends constructed and arranged to be inserted into conductive holes in the circuit board. The external mounting surface can be a circuit board and the terminals can include ends constructed and arranged to be surface mount soldered to the circuit board. The external mounting surface can include a connector and the terminals can include ends constructed and arranged to mate with the connector. The interconnects can be disposed along a long edge of the modular package, the adapter can be secured to the long edge of the modular package, and the first and second layers of the modular package can be oriented perpendicular to the mounting surface. The interconnects can be disposed along opposite edges of the modular package, the adapter can be secured to the opposite edges, and the first and second layers of the modular package can be oriented essentially parallel to the mounting surface. The adapter can be constructed and arranged to maintain one of the first or second layers in contact with the mounting surface. The interconnects can include a surface constructed and arranged for engagement with a connector terminal. The interconnects can include a layer of metal plating.

In general, in another aspect, an apparatus includes a modular package having a first external surface, a second external surface opposite the first external surface, and a side wall extending along the perimeter of and connecting with the first and second external surfaces, the modular package including a first layer of metal defining the first external surface and a second layer of metal defining the second external surface, the first and second layers being separated by and in contact with cured mold compound; and an electrical circuit for converting power, including a printed circuit board ("PCB"), a plurality of components including semiconductors mounted to the PCB, and a plurality of interconnects electrically connected to the components, the electrical circuit being located between the first and second layers and within the cured mold compound. The side wall includes a strip formed by the first layer, a strip formed by the second layer, a strip formed by the PCB, and one or more strips formed by the cured mold compound. The interconnects are disposed within the side wall.

Implementations of the apparatus may include one or more of the following features. The first and second layers can include aluminum, and the first external surface can include a plurality of fins. The first and second layers can include aluminum, and the first external surface can include an essentially flat area. The essentially flat area can be adapted for a solder joint. The PCB can include a top surface and a bottom surface, the semiconductors can include large-footprint switches. A number, T, of top-side large-footprint switches can be mounted on the top surface, a number, B, of bottom-side large-footprint switches can be mounted on the bottom surface, and the number T can be approximately equal to the number B. Each large-footprint switch can be connected to one or more other components by a respective set of conductive vias in the PCB, and each of a plurality of the top-side large-footprint switches can share its respective set of conductive vias with a corresponding one of the bottom-side large-footprint switches. Most of the large-footprint switches can be positioned on one surface in a location substantially overlapping a location on the other surface occupied by another large-footprint switch. The apparatus of claim 151 wherein the PCB includes a top surface and a bottom surface, the semiconductors include large-footprint switches mounted on the top surface, most of the large-footprint components are distributed symmetrically between a left side of the top surface and an opposite right side of the top surface. The PCB can include a top surface and a bottom surface, the semiconductors can include large-footprint switches mounted on the top surface, and most of the large-footprint components can be distributed symmetrically between quadrants on the top surface. The components can include a transformer core. The quadrants can surround the transformer core. The PCB can include a top surface and a bottom surface, and the components can include a set of high-profile components having similar heights. A number, T, of the high-profile components can be mounted on the top surface, a number, B, of the high-profile components can be mounted on the bottom surface, and the number T can be approximately equal to the number B. A spatial distribution of the high-profile components on the top surface can roughly match a spatial distribution of the high-profile components on the bottom surface. The apparatus can further include an adapter for providing mechanical and electrical connections between the modular package and an external mounting surface, the adapter having a body and a plurality of electrical terminals supported by the body; and electrical connections formed between the adapter terminals and respective interconnects on the modular package. The adapter body can be mechanically secured to the modular package, and the adapter terminals can be arranged to mate with the external mounting surface. The external mounting surface can be a circuit board and the terminals can include ends constructed and arranged to be inserted into conductive holes in the circuit board. The external mounting surface can be a circuit board and the terminals can include ends constructed and arranged to be surface mount soldered to the circuit board. The external mounting surface can include a connector and the terminals can include ends constructed and arranged to mate with the connector. The interconnects can be disposed along a long edge of the modular package, the adapter can be secured to the long edge of the modular package, and the first and second layers of the modular package can be oriented perpendicular to the mounting surface. The interconnects can be disposed along opposite edges of the modular package, the adapter can be secured to the opposite edges, and the first and second layers of the modular package can be oriented essentially parallel to the mounting surface. The adapter can be constructed and arranged to maintain one of the first or second layers in contact with the mounting surface. The interconnects can include a surface constructed and arranged for engagement with a connector terminal. The interconnects can include a layer of metal plating. The first layer can include contours formed in an interior surface of the first layer, the contours including a first feature having a shape and an elevation to accommodate a first component on the PCB, the first component having a height greater than or less than other components on the PCB. The first component can include a magnetic core structure and the elevation can be a recess in the interior surface. The first component can include a semiconductor switch and the elevation can be a protrusion from the interior surface. The apparatus can further include interlocking features having a contour formed in an interior surface of the first layer, the contour being filled with cured mold compound. The modular package can include a recess formed in the first layer adjacent one or more of the interconnects providing a setback between the first layer and the one or more interconnects.

In general, in another aspect, an apparatus includes a power converter is provided. The power converter includes a printed circuit board ("PCB") having a plurality of conductive layers and having a top surface and a bottom surface; a magnetic core structure magnetically coupled to a winding formed by traces in one or more of the conductive layers in the PCB; and a plurality of power semiconductor devices. A first set of the power semiconductor devices is mounted on the top surface and electrically connected to dissipate power at a level, Pt, during operation of the converter, and a second set of the power semiconductor devices is mounted on the bottom surface and electrically connected to dissipate power at a level, Pb, during operation of the converter. The power semiconductor devices are distributed between the first and second sets to distribute heat generation during operation of the converter such that each level Pt, Pb is less than 150% of the other level Pb, Pt.

Implementations of the apparatus may include one or more of the following features. A plurality of the power semiconductor devices in the first set can each be positioned in a location on the top surface substantially overlapping a location on the bottom surface occupied by a power semiconductor device in the second set. The power semiconductor devices can be electrically connected using a respective set of conductive vias in the PCB, and a plurality of the power semiconductor devices in the first set can share their respective sets of conductive vias with corresponding power semiconductor devices in the second set. The power converter can include circuitry having a pair of cells that have a common circuit topology and each including power semiconductor switches from each of the first and second sets. Each cell can have its respective components arranged in a pattern, in which the pattern of components of one cell is substantially a mirror image of the pattern of components in the other cell. A component from one of the cells can be located on an opposite surface of a respective component from the other one of the cells. The cells can include input cells. The power semiconductor devices can include output switches.

In general, in another aspect, a method of manufacturing a plurality of products is provided. The method includes inserting a plurality of components into a cavity formed by one or more molds; closing the one or more molds to form a seal around the cavity; filling the cavity with mold compound; curing the mold compound in the cavity to secure the components, cured mold compound, and molds together into an assembly; and cutting the assembly to separate the plurality of products from the assembly, the products each including a respective section of the one or more molds which remains as an integral part of each respective product.

Implementations of the method may include one or more of the following features. The method can further include maintaining a predetermined alignment between the plurality of components and the one or more molds. The plurality of components can include a substrate having conductive features. The cutting can include exposing portions of the conductive features in each respective product.

The details of one or more embodiments of the invention are set forth in the accompanying drawings and description below. Other features, objects, and advantages of the invention will be apparent from the description and drawings, and from the claims.

DESCRIPTION OF DRAWINGS

FIG. 11 shows an enlarged portion of the module 115 revealing details of exposed buried-embedded interconnects.

Like references symbols in the various drawings indicate like elements.

DETAILED DESCRIPTION

I. Vertical PCB Package.

Figure 1:
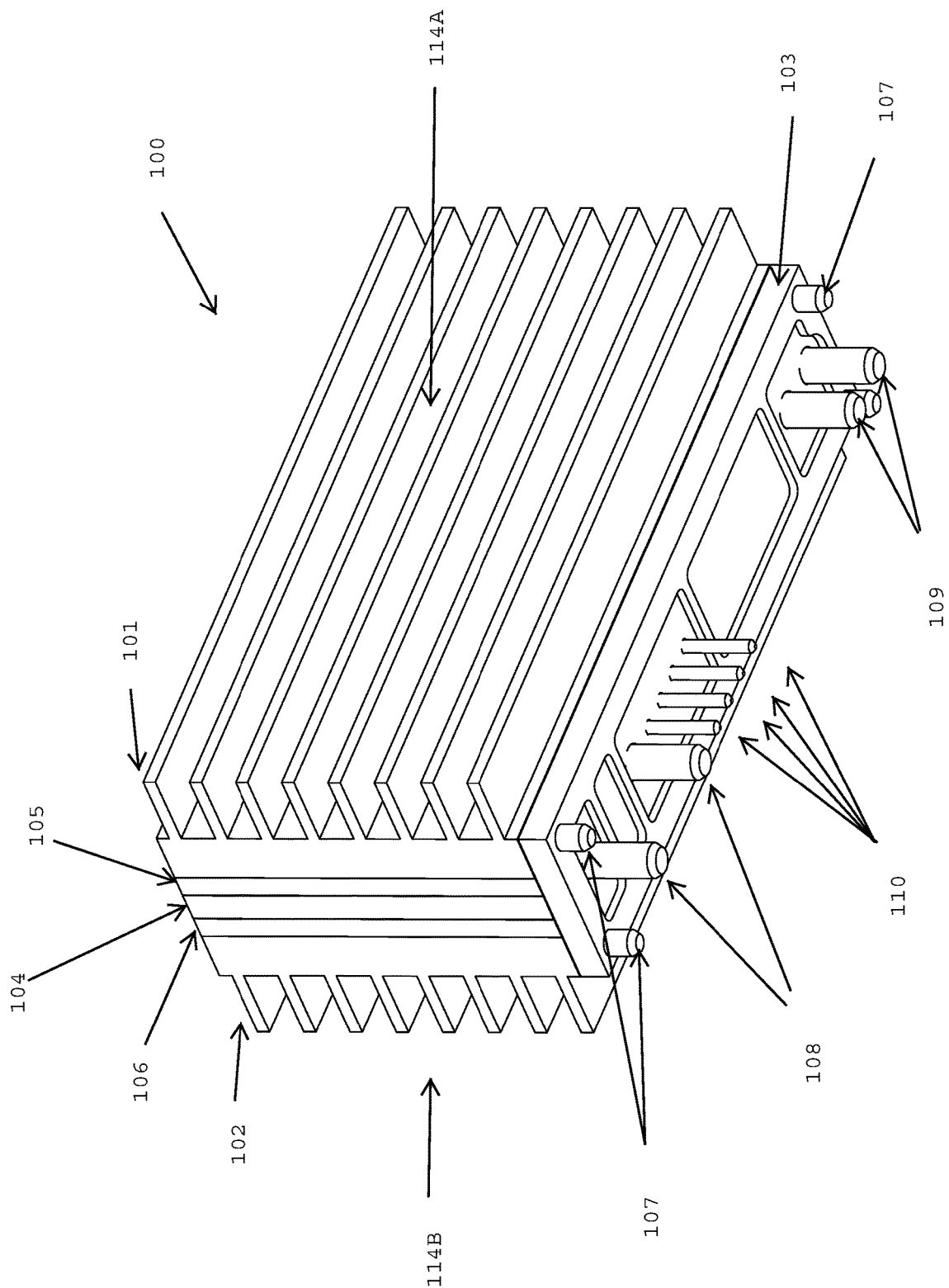
FIG. 1 shows an electronic module 100.

Referring to FIG. 1, an electronic module 100, e.g. a power converter, is shown having a generally rectangular form factor with two large faces 114A, 114B covered by heat sinks 101, 102. As shown between the heat sinks 101 and 102, the module 100 includes a printed circuit board ("PCB") 104 having its large faces arranged generally coplanar to the two large faces 114A, 114B of the electronic module 100. Electronic components (FIGS. 3, 5, 6) may be mounted to one or both sides of the PCB 104 and electrically interconnected, e.g. by conductive traces on or in the PCB 104 to form the module circuitry. Using a power converter as an example, the electronic components may include power transistors, control ICs, and discrete resistors and capacitors. One or more magnetic core structures may be provided, which in combination with conductive traces on PCB 104, may form planar magnetic components such as inductors and transformers.

The electronic components may protrude from one or both sides of the PCB 104 to varying degrees depending upon component size. Spaces between the faces of PCB 104 and the components on the PCB on one hand and the interior surfaces of the heat sinks on the other hand may be filled with molding compound, which when cured may form integral structural layers 105, 106 as shown in FIG. 1 and further provides a thermally conductive medium in which heat may be readily conducted away from the PCB and components to the heat sinks 101, 102. The interior surfaces of the heat sinks may be contoured to match the height of one or more of the components while maintaining an appropriate clearance for insulation and safety agency requirements. Contouring the heat sinks 101, 102 in this way: (1) to match the height of the magnetic core structure may be used as an alternate approach to the exposed core encapsulation method described in Vinciarelli, Encapsulation Method and Apparatus for Electronic Modules, U.S. patent application Ser. No. 12/493,773 filed Jun. 29, 2009 (assigned to VI Chip Corp. of Andover, Mass., the entire disclosure of which is incorporated herein by reference); (2) to match the height of lower profile components, such as power semiconductors, may (a) increase thermal performance in the case of heat dissipating components by replacing molding compound with heat sink metal; and (b) reduce cost generally by reducing the volume of molding compound required; and (c) further reduce cost by allowing less expensive molding compound to be used because of reduced thermal pathways through the encapsulant, easing the thermal conductivity requirements of the encapsulant (e.g., an encapsulant having a 1 degree Celsius per watt thermal resistance may be used with the contoured heat sink instead of an encapsulant having a 3 degrees Celsius per watt thermal resistance used without the contoured heat sink).

A connector 103, including terminals 108, 109, 110 and standoffs 107, may be provided as shown along an edge of the PCB 104 to make electrical connections between the electronic module 100 and external circuitry. As shown in FIG. 1 with the connector 103 situated along one edge of the module 100, preferably one of the longest edges, the module 100 may be mounted vertically, i.e. with its internal PCB 104 perpendicular to a chassis or another circuit board such as a motherboard. Using the vertical mount module construction illustrated in FIG. 1 for a power converter may provide advantages over the more conventional horizontal mounting technique. For example, using the vertical PCB arrangement may allow use of a magnetic core structure that is thicker than in a horizontal PCB configuration, e.g. because of height restrictions, enabling increased power throughput, as compared to a similar converter using a horizontal PCB orientation. The length of the magnetic path may be also reduced in the vertical PCB configuration further reducing losses in the magnetic components. Shorter windings may also be used further reducing transformer or inductor losses. Further details and variations of, and a process for making, the electronic module will be discussed below in connection with a panel molding process.

II. Panel Molding Process.

A. Overview

Figure 4:
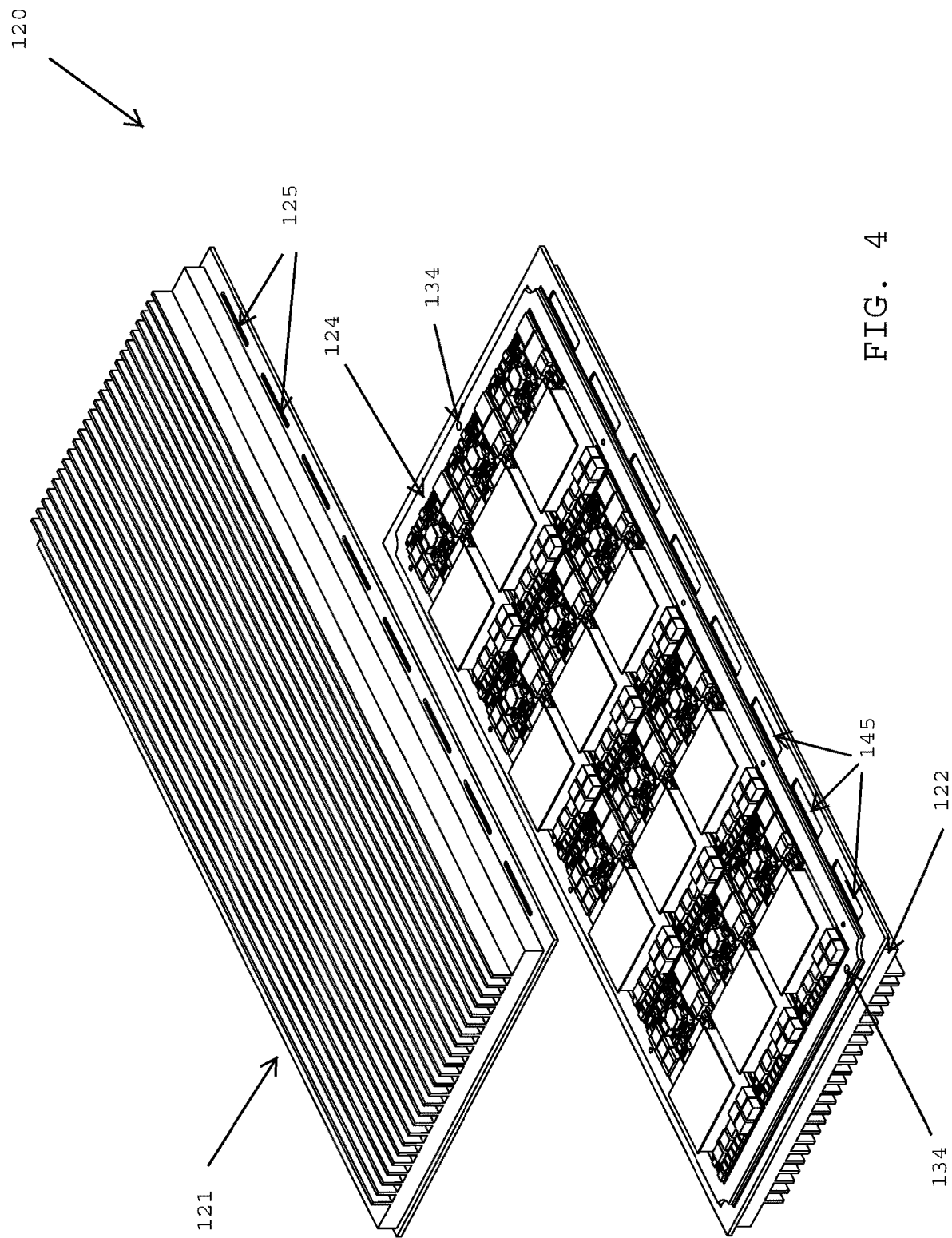
FIG. 4 shows the panel assembly 120 with the top heat sink panel 121 removed.
Figure 5:
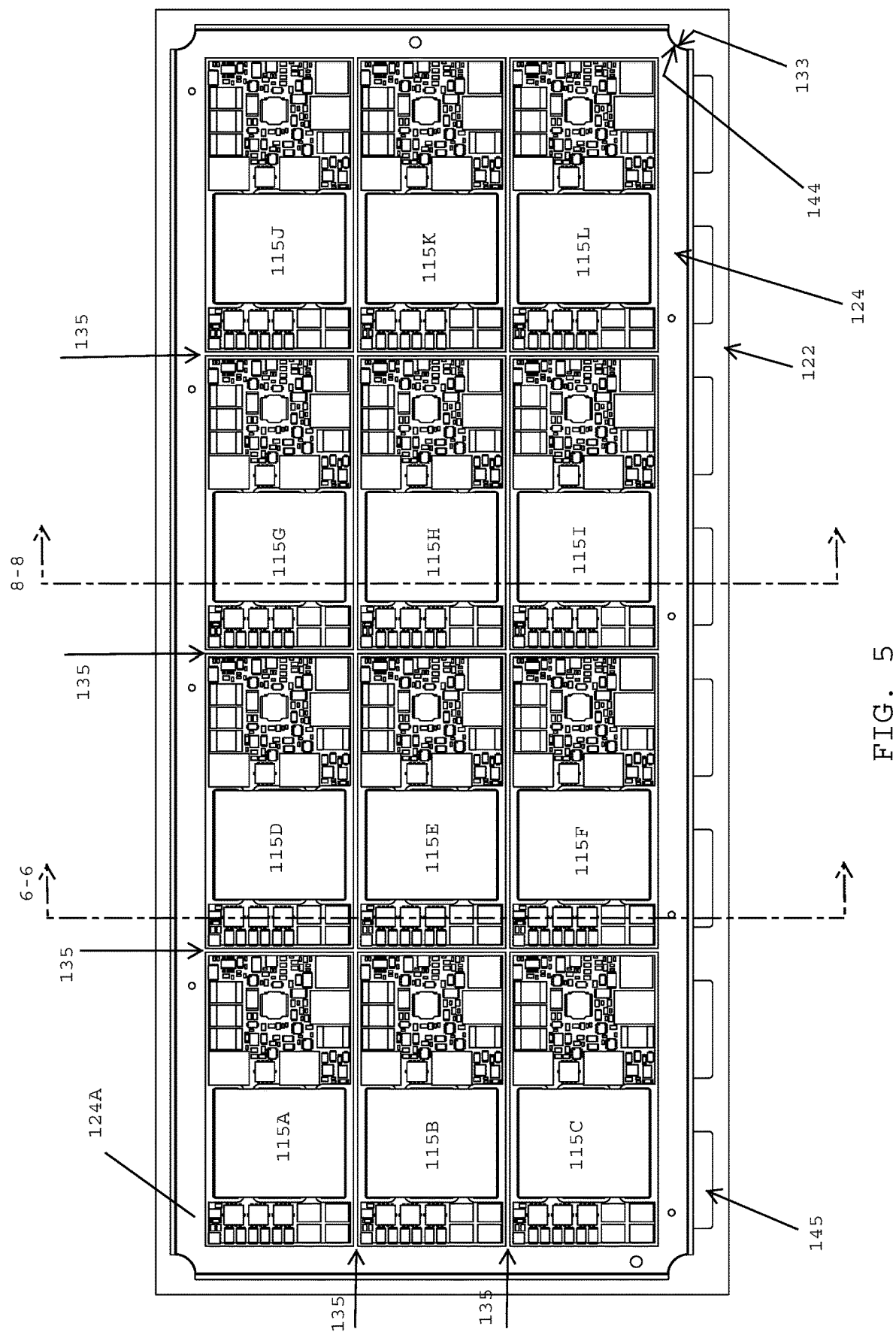
FIG. 5 shows a plan view of the PCB panel 124 assembled with the bottom heat sink panel 122.

The electronic module 100 shown in FIG. 1 may be fabricated using a panel molding process described with reference to FIGS. 2-9. The panel molding process may be used to produce a multiplicity of modules at a time. A PCB panel 124 may be provided with a plurality of individual circuits for building the electronic modules. FIGS. 3, 4, and 5 show the PCB panel 124 populated with electronic components revealing a 3-by-4 pattern of twelve circuits to make twelve individual modules 115 (labeled 115A through 115L in FIG. 5). The illustrative example of FIGS. 3-5, being for power converters, includes magnetic core structures 131 (FIG. 3) in addition to electronic components 132. As shown in FIG. 5, the pattern of individual circuits 115A-115L are arranged close together and separated by small spaces 135 preferably sufficient to allow the PCB panel to be cut during the singulation process without necessitating two cuts between modules or unnecessary waste of PCB material. The spacing may be adjusted based upon the cut dimensions produced by the equipment used to make the cuts.

Figure 2:
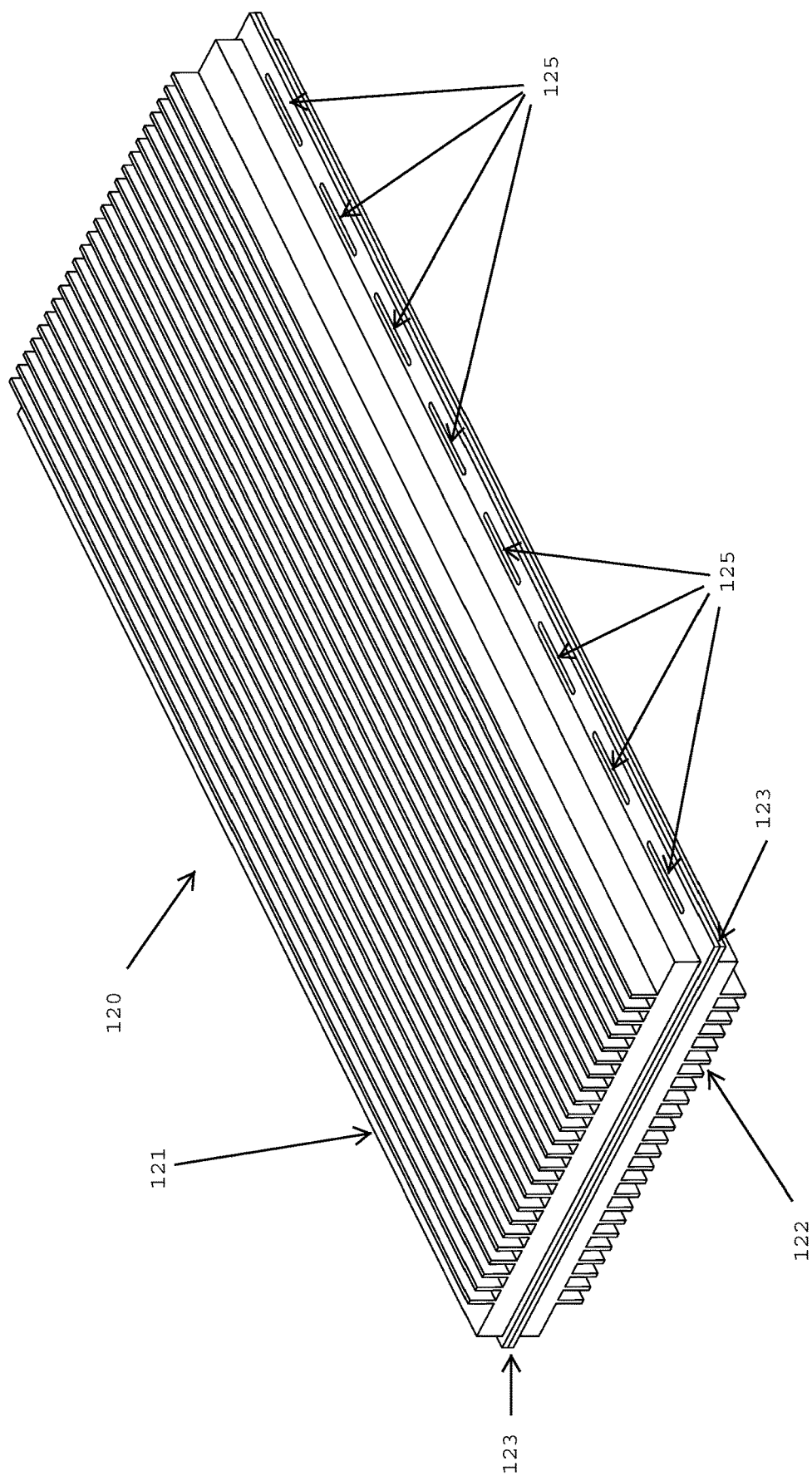
FIG. 2 shows a panel assembly 120 comprising a plurality of electronic modules before singulation.
Figure 3:
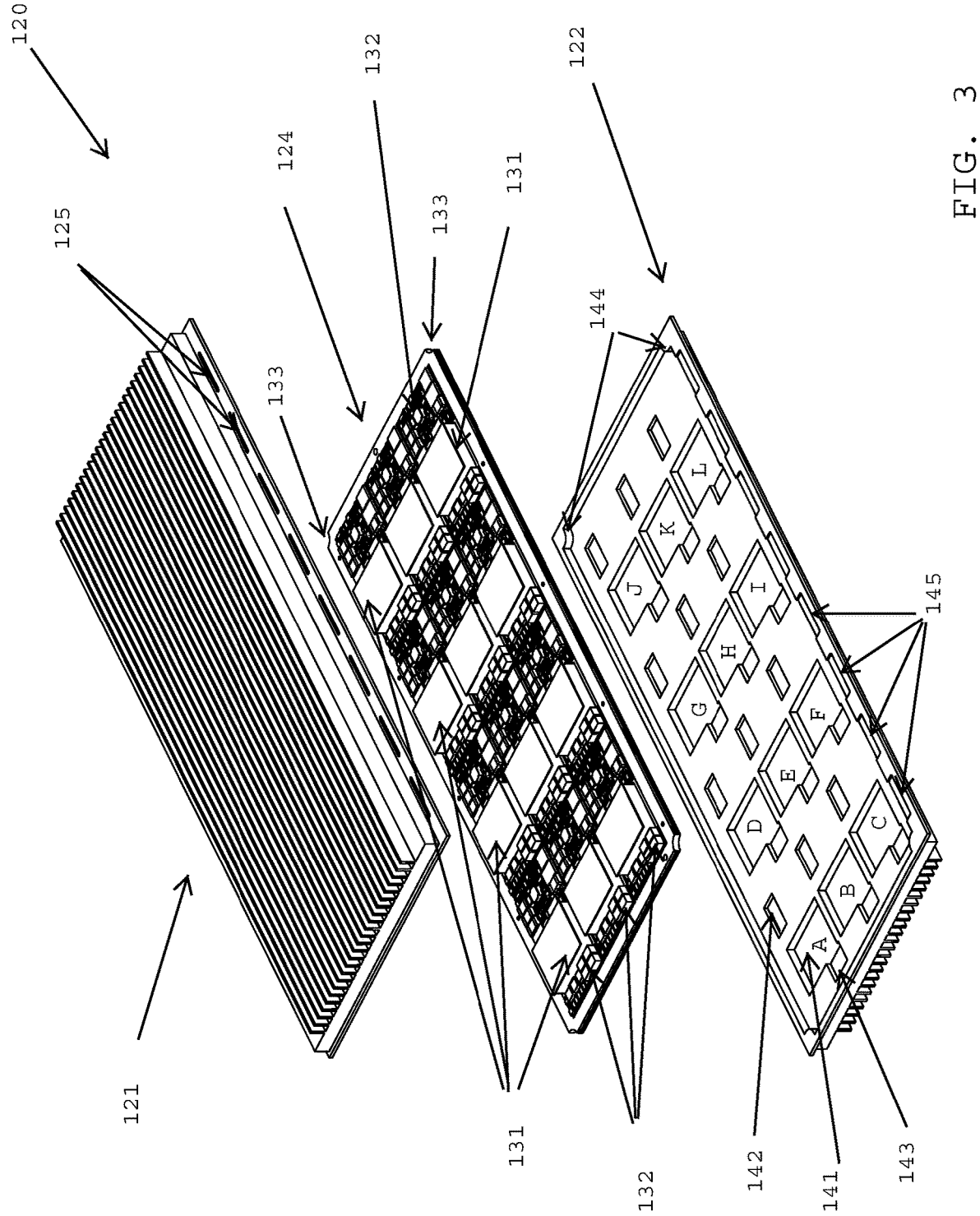
FIG. 3 shows an exploded view of the panel assembly revealing the heat sink panels 121 and 122 and internal PCB panel 124.
Figure 6:
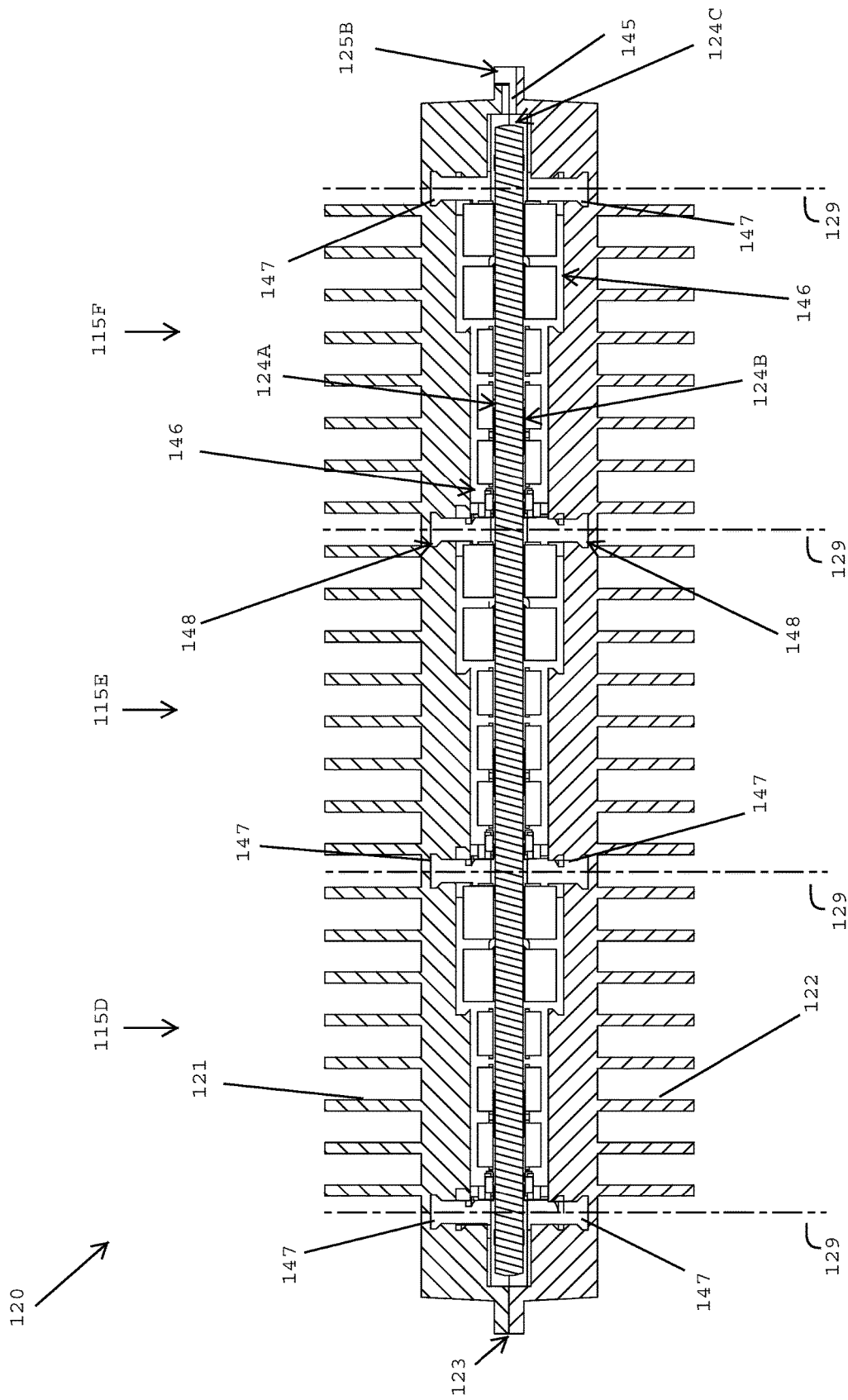
FIG. 6 shows a cross-section of the panel assembly 120.
Figure 7:
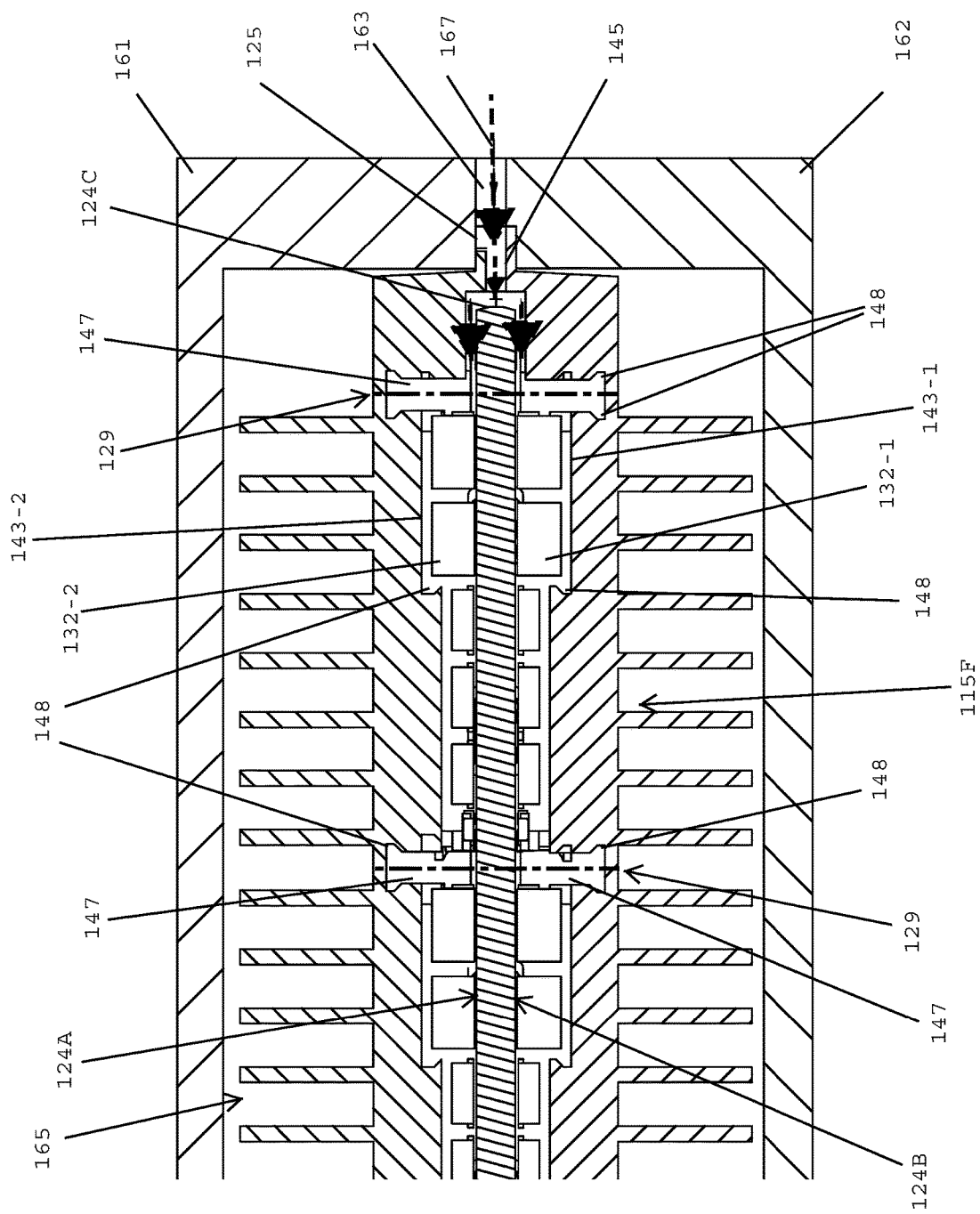
FIG. 7 shows a partial cross section of the panel assembly closed in a mold.

The PCB panel 124 containing the multiplicity of the electronic circuits (115A-115L in FIG. 5) may be assembled with matching heat sink panels 121, 122 as shown in FIG. 3 to form a panel assembly 120 (FIG. 2). As shown in FIGS. 3 and 6, the two heat sink panels 121 and 122 when assembled together may form an internal cavity 146, which completely encloses the populated PCB panel 124. FIGS. 2 and 6 show that the heat sink panels 121 and 122 may be pressed together (e.g. by a mold press 161, 162 as shown in FIG. 7) to form a seal 123 (FIGS. 2, 6-8) around the perimeter of the internal cavity 146. In this example, the heat sink panels 121 and 122 also function as mold panels by forming a mold cavity (e.g., the internal cavity 146) that may be filled at least in part by an encapsulant encapsulating the surfaces of the PCB panel 124 and the electronic components on the PCB panel 124.

B. Heat Sink Panels

Figure 17:
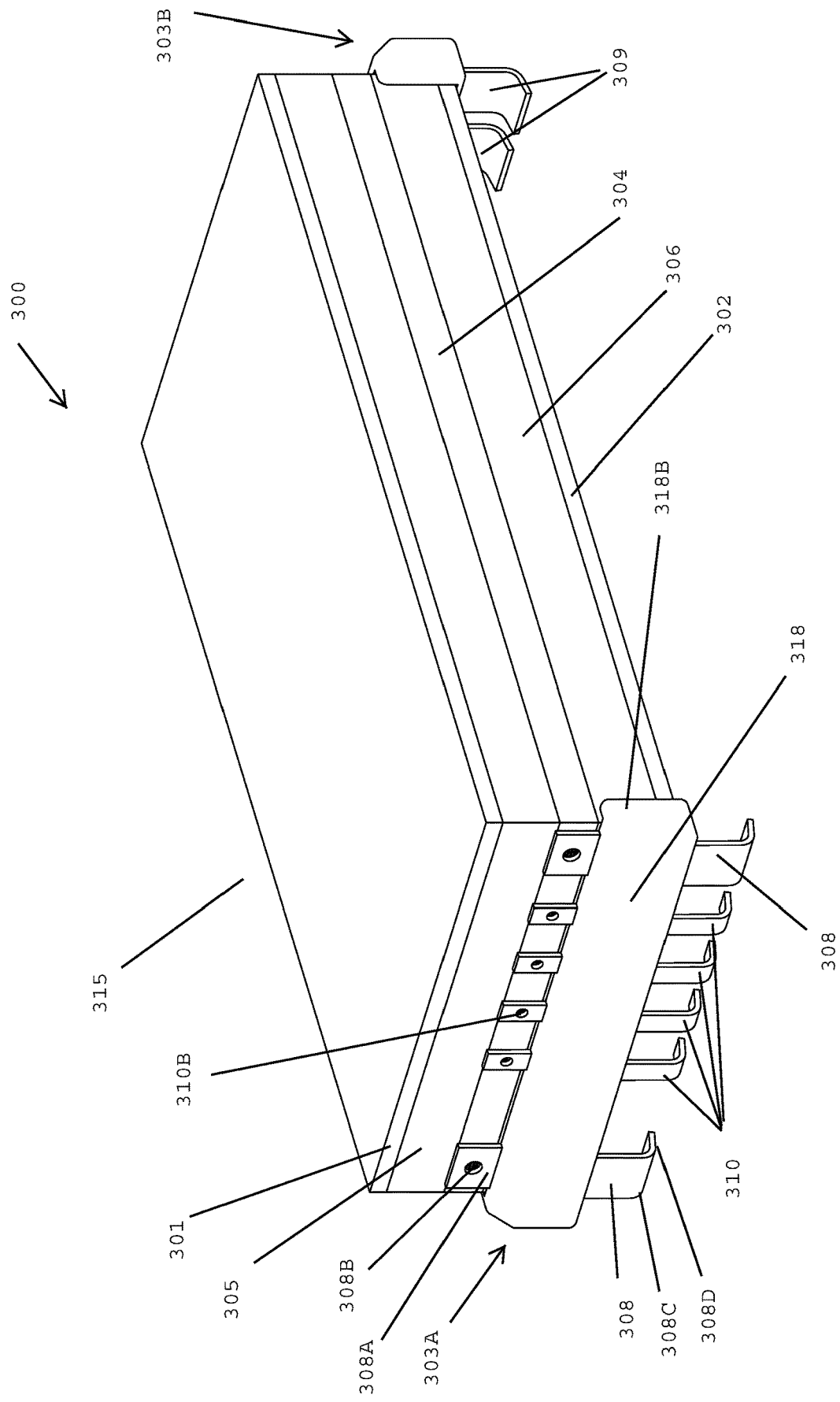
FIG. 17 shows a horizontal surface-mount module 300.
Figure 25:
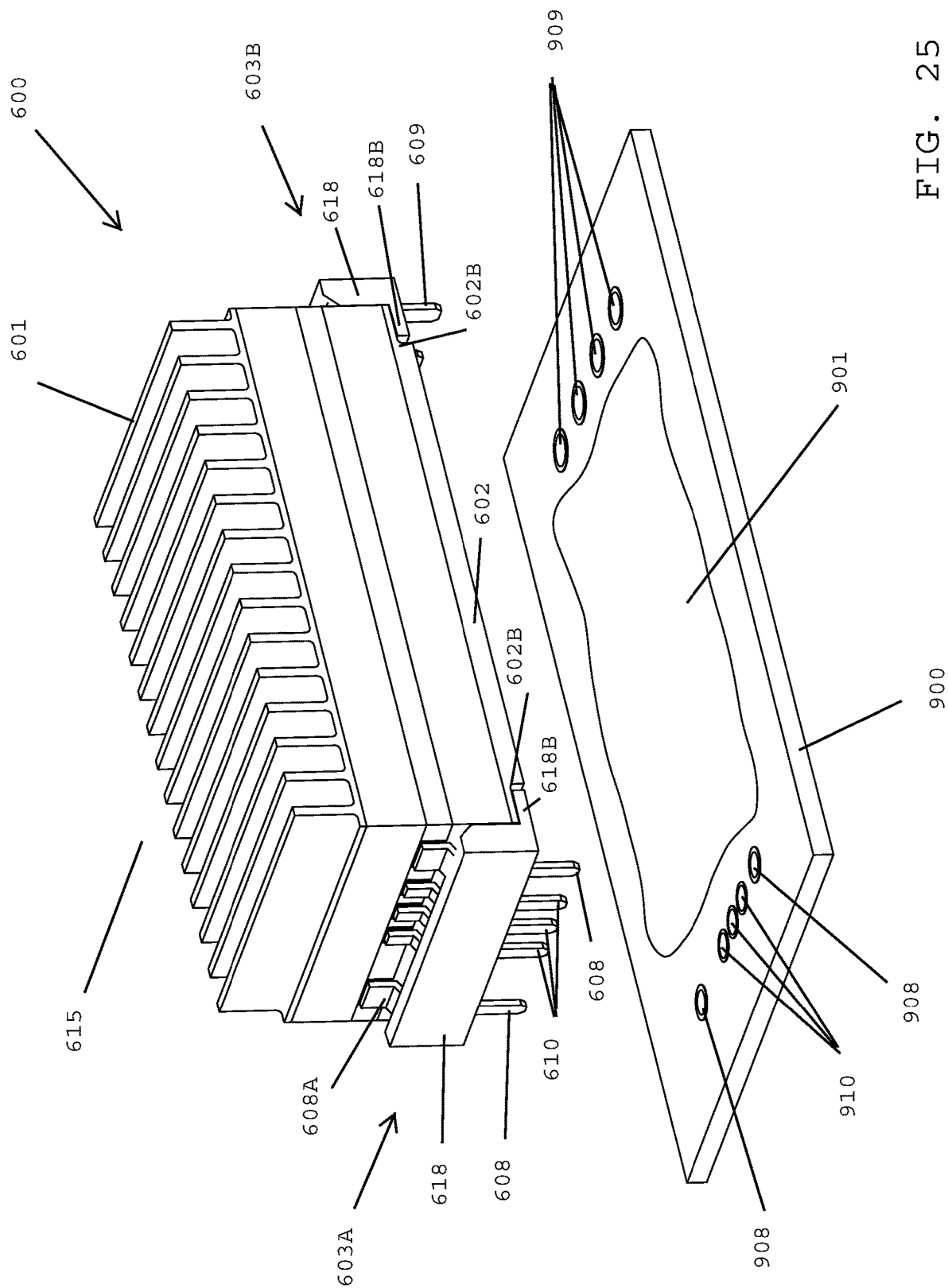
FIG. 25 shows an alternative horizontal through-hole flush-mount module 600 exploded from a customer PCB.

Referring to FIG. 2, the heat sink panels 121, 122 may include fins on the exterior surfaces as shown. The fins may be arranged in any direction relative to the panel or in any pattern and may vary in height, thickness, and spacing as required for the particular application. For example, modules 115 and 115B shown in FIGS. 10A and 10B respectively illustrate longitudinal and transverse fin orientations. Alternatively, one or both of the heat sink panels may have a generally flat exterior surface omitting the fins altogether. For example, FIGS. 17 and 25 show modules 315 and 615 produced when both heat sink panel exterior surfaces are flat and one is flat and one is finned, respectively. The thickness of the panels between the internal cavity and the external surface may be varied to suit the particular requirements of the application.

C. Heat Sink Internal Contours

Referring to FIG. 3, the contoured interior surface of the bottom heat sink panel 122 is shown including a 3-by-4 repeating pattern of twelve (A through L) prominent recesses 141 and shallower recesses 142 and 143. Recesses 141 may be matched to the downward protruding portion of magnetic core structures 131. Similarly, recesses 142 and 143 may be matched to other downwardly protruding components on the PCB panel 124. Note that in the example of FIG. 3, because the core structure 131 protrudes from the PCB 124 more than the other components, the recesses 141 are deeper than recesses 142, 143. Although not visible in FIG. 3, the interior surface of heat sink panel 121 may similarly include contour features to match the components and core structure on the upward facing side of the PCB panel 124 (e.g. as shown in the cross-section of FIGS. 6, 7). Although the interior contour of panel 122 in FIG. 3 is shown including three recesses 141, 142, 143 repeated for each circuit (A through L in the 3-by-4 pattern), the interior contours of the heat sink panels 121 and 122 may range from simple flat surfaces (accommodating the height of the tallest component) to a complex arrangement of a multiplicity of recessed and protruding features (accommodating a multiplicity of component heights) which at the extreme could match every component individually.

Figure 12:
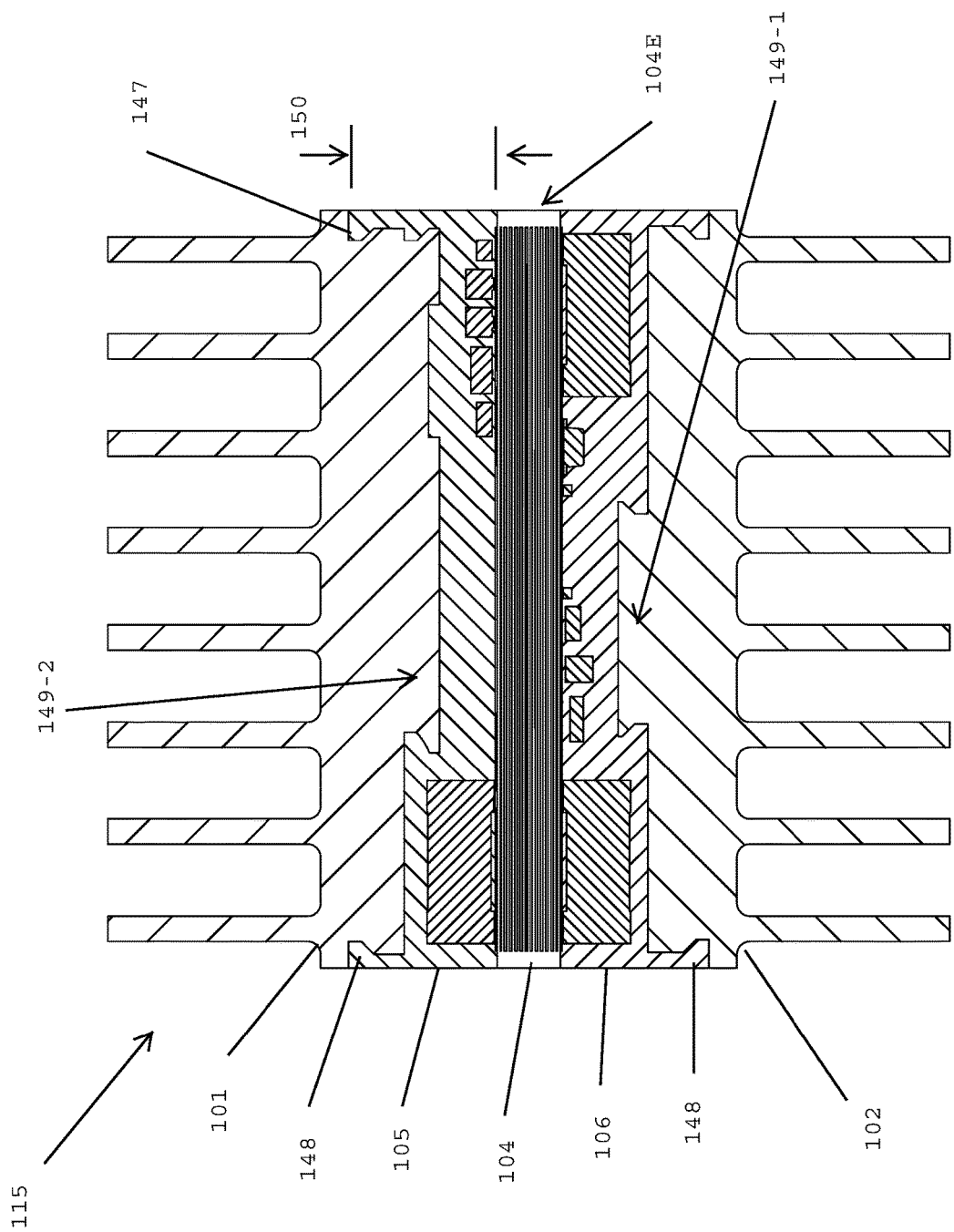
FIG. 12 shows a cross section of the singulated module 115 of FIG. 10A.

Additional features may be provided in the heat sink panels to facilitate the panel molding process, to enhance the mechanical integrity or performance of the finished module 100, or to satisfy safety agency clearance requirements for the finished product. By way of example undercut features, such as undercuts 148 shown in FIGS. 6, 7, and 12 may be provided at each circuit site (i.e. within each individual module location) in the heat sink panels 121, 122. As shown the undercuts 148 may be provided in selected recesses, such as recesses 143-1 and 143-2, and may be dispersed along one or more of the boundary lines of each circuit 115. During encapsulation, molding compound fills the recesses and trenches and their respective undercuts 148. When cured, the hardened molding compound in the undercuts forms a dovetail-like joint securing the heat sinks to the encapsulated PCB 124. When provided at each circuit site, the undercuts secure the heat sinks 101, 102 to the PCB 104 in the individual module 115 providing mechanical integrity after singulation. Referring to the cross-section of a singulated module 115 in FIG. 12, dovetail interfaces 149-2 and 149-1 are shown securing the top and bottom heat sinks 101, 102 to the encapsulated PCB assembly.

Additionally, clearance features may be provided in the heat sink panels to satisfy minimum safety agency clearances between electrical contacts on the PCB 124 and the metal heat sinks 121, 122. As shown in FIGS. 6 and 7, trenches 147 may be provided in heat sink panels 121 and 122 along the side of each module 115 (the long side as shown in FIGS. 6 and 7) where electrical contacts (discussed in more detail below) are exposed in or on the PCB 124. The trenches 147 may also include the undercut features 148 discussed above. For example, cut trench 147 in FIG. 12 results in a recess 150 of the heat sink 101 away from the edge 104E of the PCB 104 after singulation.

D. PCB-Heat Sink Registration

Registration features may be provided in one or both of the heat sink panels 121, 122 helping to correctly position the PCB panel 124 in the cavity 146 relative to the heat sink panels 121, 122 (which is particularly important when the panel is cut during the singulation process) and to correctly position the heat sink panels relative to each other during assembly and during subsequent molding processes. Referring to FIGS. 3 and 4, beveled corners 144 may be provided in heat sink panel 122 to interface with matching indentations 133 which may be provided in PCB panel 124 for registration when assembled together (FIGS. 4 and 5). FIG. 5, which is a top plan view of the PCB panel 124 assembled with the bottom heat sink 122, shows the beveled corners 144 interfacing with the indentations 133.

Figure 4A:
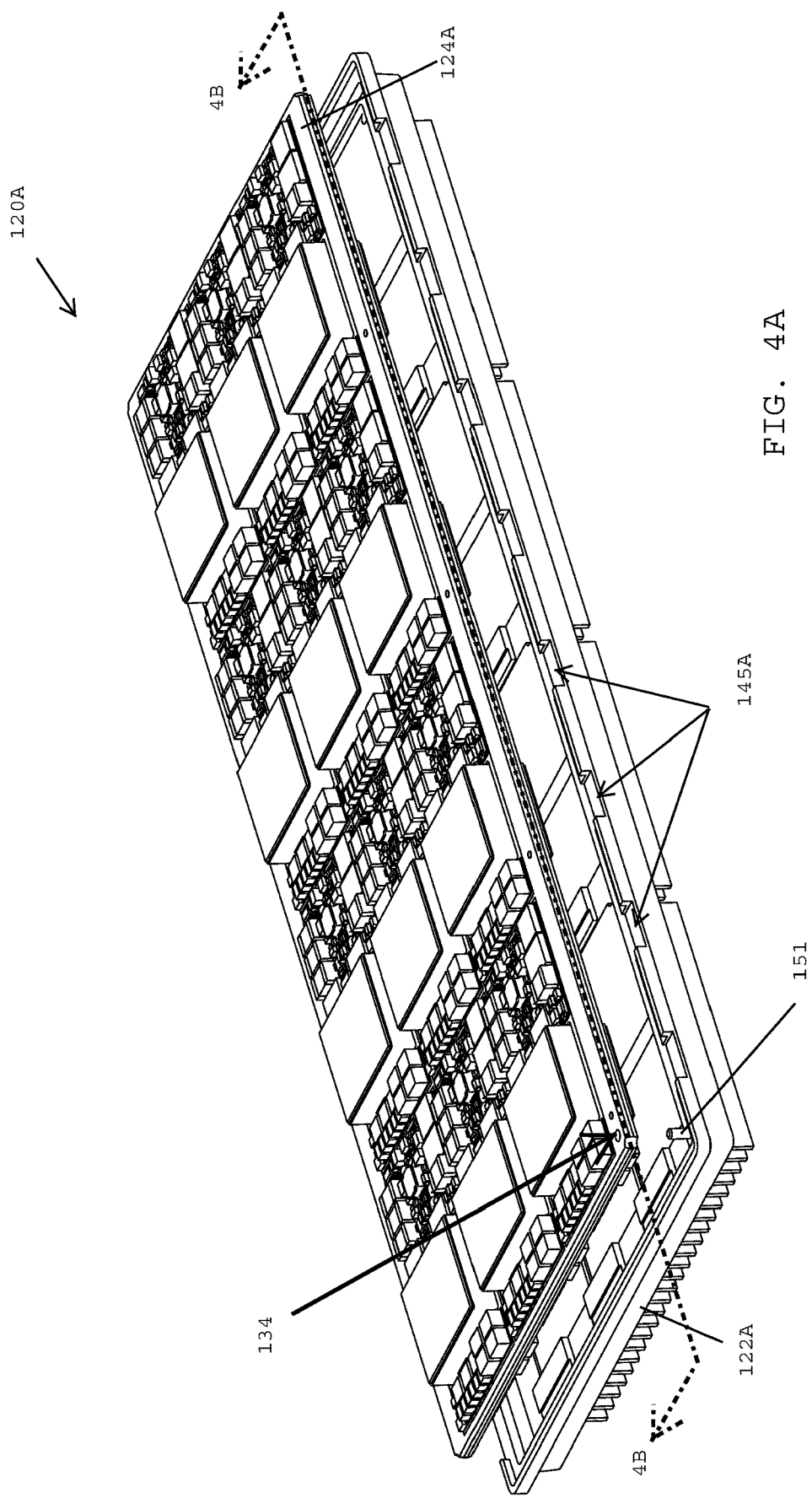
FIG. 4A shows an exploded view of the PCB panel and lower heat sink panel in a modified panel assembly 120.
Figure 4B:
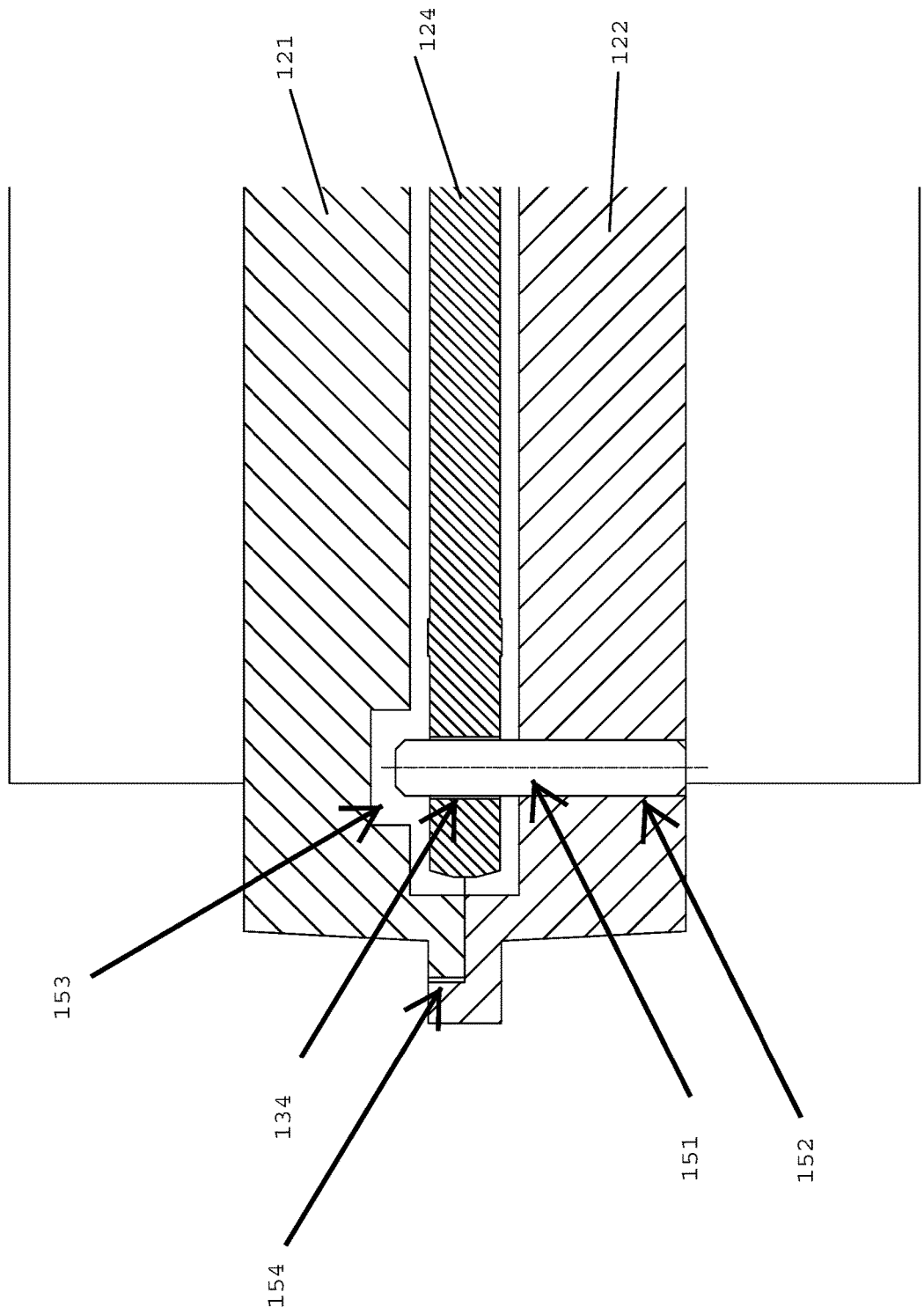
FIG. 4B shows a cross-section of the panel assembly 120A along lines 4B-4B in FIG. 4A.

Referring to FIG. 4A, a modified version of the assembly is shown. As shown, a registration pin 151 is press fit into a registration hole 152 in the lower heat sink panel 122 and a matching registration hole 134 is provided in the PCB panel 124. The completed panel assembly, including the lower heat sink panel 122, PCB panel 124, and upper heat sink panel 121, is shown in FIG. 4B in cross-section taken along the broken lines 4B-4B in FIG. 4A. As shown in FIG. 4B, the registration pin 151, which fits snugly in registration holes 152 and 134, provides registration for the PCB panel 124 relative to the lower heat sink panel 122. An indentation 153 may be provided in the opposite heat sink panel (121) to accommodate protrusion of the pin 151 past the PCB 124. As shown generally at 154 in FIG. 4B, the heat sink panels may include additional features to provide registration between the top and bottom heat sink panels. Although a registration pin is shown at one corner of the panel 122 in FIG. 4A, it will be appreciated that additional pins may be used at other locations. For example, FIG. 4 shows two registration holes 134, one on a corner and another in the middle of the opposite side of the PCB panel 124.

E. Encapsulation

FIG. 6 shows a cross-sectional view (through lines 6-6 in FIG. 5) of the panel 120 through an opening 125 and a conduit 145 in the heat sink panels. The openings 125, which may be slot shaped as shown (FIGS. 2, 3, 4, 5, 9), may be connected to the interior cavity 146 of the panel assembly 120 by conduits 145 for conveying molding compound or venting during the panel molding process. The openings may be formed in one of the heat sink panels, e.g. openings 125 in the top heat sink panel 121 as shown in FIGS. 2, 3, 4, 5, and 9, or in both heat sink panels, e.g. openings 125B in the top and bottom heat sink panels 121, 122 as shown in FIGS. 6 and 7. Referring to FIG. 6, the conduits 145 may be formed by recesses in the interior surfaces of heat sink panels 121 and 122, connecting the openings 125 to the interior cavity 146. The recesses forming the conduit 145 may be situated near the edge 124C of PCB panel 124 to allow the molding compound to flow over both top 124A and bottom 124B surfaces of the PCB 124.

Figure 8:
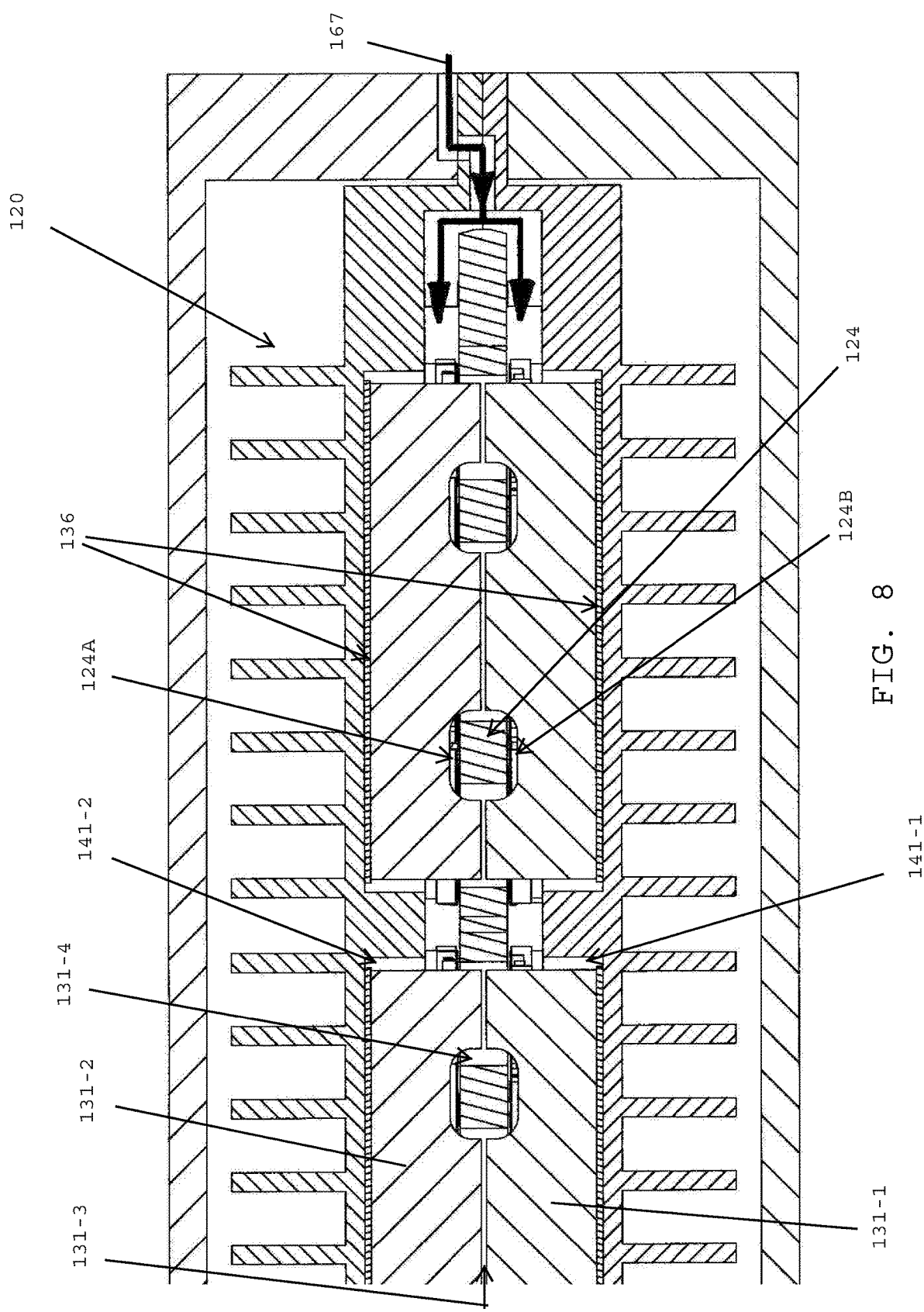
FIG. 8 shows another partial cross section of the panel assembly closed in a mold.

FIG. 7 shows an enlarged cross-section of one end of the panel assembly 120 closed between an upper mold press 161 and lower mold press 162 taken through some of the smaller components, e.g. components 132-1, 132-2, i.e. through lines 6-6 in FIG. 5. A channel 163 may be provided, e.g. between the upper mold press 161 and lower mold press 162 as shown, to interface with openings 125. Molding compound may be forced through the channel 163 under pressure after the panel assembly 120 is closed in the mold presses 161, 162. The dashed line 167 with directional arrows in FIGS. 7 and 8 illustrates the flow of molding compound through the channel 163 into openings 125 through conduits 145 over the top 124A and bottom 124B surfaces of the PCB panel 124 during encapsulation. The molding compound may be forced into the internal cavity 146 to fill all of the unoccupied spaces between the heat sinks 121, 122 and the PCB panel 124.

FIG. 8 shows an enlarged cross-section of one end of the panel assembly 120 closed between an upper mold press 161 and lower mold press 162 taken through the magnetic core structures, i.e. through lines 8-8 in FIG. 5. Each magnetic core 131 is shown having an upper E-core 131-2 and a lower E-core 131-1 separated by a gap 131-3. The cores have openings 131-4 to accommodate windings formed on the PCB 124. As shown, the lower core 131-1 and upper core 131-2 are accommodated by recesses 141-1 and 141-2 in the lower heat sink 122 and upper heat sink 121, respectively. As shown, compliant pads 136 may be provided on the surfaces of the cores 131-1 and 131-2 or in recesses 141-1, 141-2 to accommodate dimensional differences in the components. The compliant pads may be chosen for good thermal conduction and optionally adhesive properties facilitating heat removal from the cores into the heat sink while optionally providing structural integrity to the assembly. Gap Pad A2000 available from the Bergquist Company, 18930 West 78th St, Chanhassen, Minn. 55317 is one example of the type of compliant pad that may be used. Alternatively and perhaps depending upon the tolerances involved, a phase change material may accommodate the dimensional difference during assembly and when cured afterward provide structural integrity between the heat sinks and the cores.

Molding compound may be deposited in one or more of the recesses, e.g. recesses 141-1 or 141-2, in the internal cavity prior to assembly of the PCB panel 124 into one or both of the heat sink panels 121, 122 to ensure that the molding compound fills narrow spaces between the heat sink and the components, e.g. the cores 131-1, 131-2. One or more vent openings (not shown) may be provided in the heat sink panels, preferably at an end opposite the fill openings 125, to allow the molding compound to flow completely through the internal cavity 146. The cavity may be filled with encapsulant either (1) by transfer through one or more conduits, (2) by measured deposition of encapsulant during assembly of the panels, or (3) by both measured deposition during assembly and transfer through conduits.

As shown in FIGS. 4, 5, and 6, the border areas between the modules and around the periphery of the PCB panel 124 may be minimized to avoid wasted PCB material. Because the heat sink panels 121 and 122 close against each other rather than the PCB panel 124, areas on the PCB normally reserved for closing the mold may be eliminated further reducing PCB waste and thus overall cost.

After the panels are assembled together and the interior cavities are filled with molding compound, the panel assembly 120 may be cured, e.g. by elevating the temperature.

F. Singulation

Figure 9A:
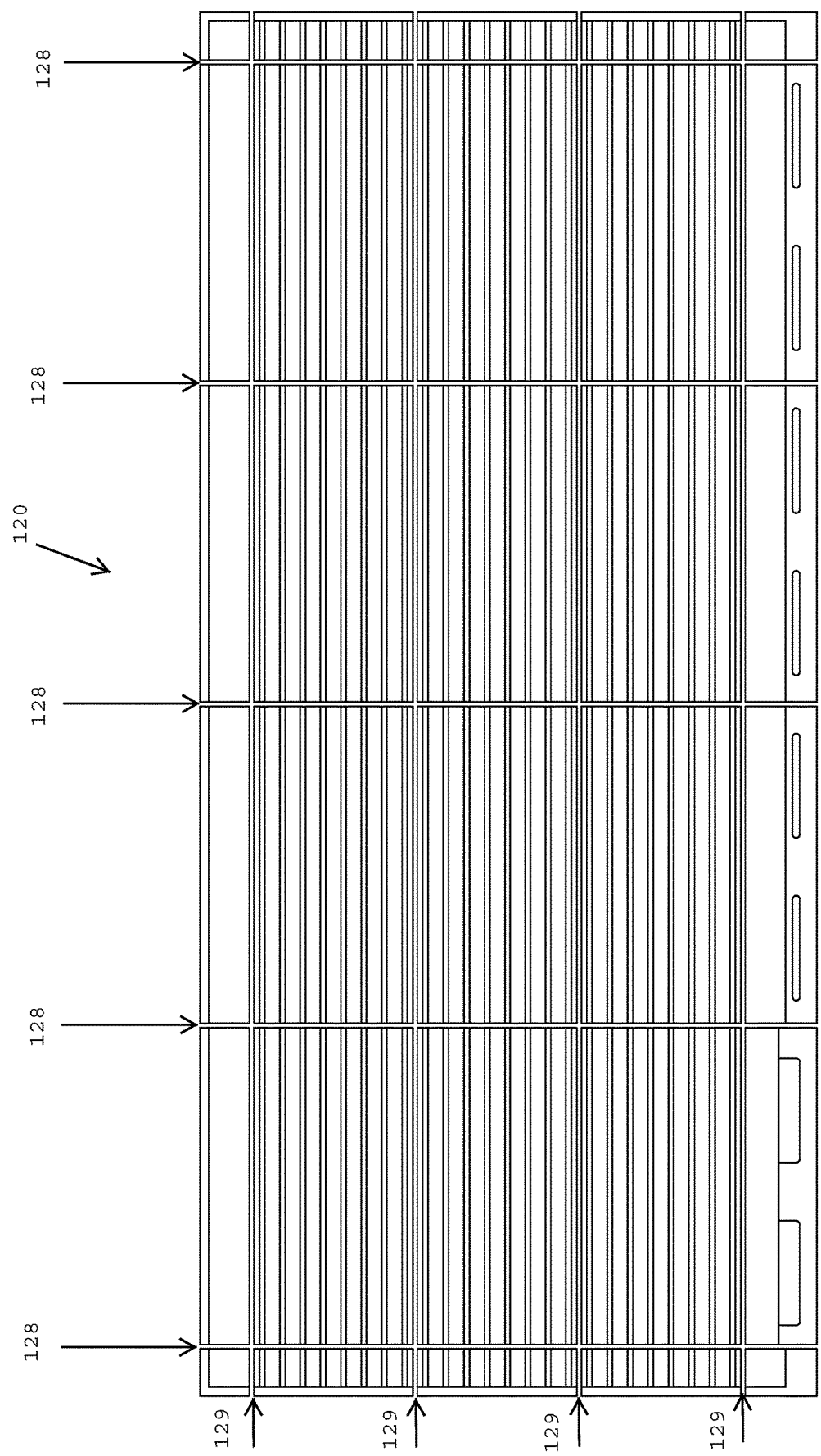
FIG. 9A shows a plan view of the panel assembly 120 following singulation.
Figure 10A:
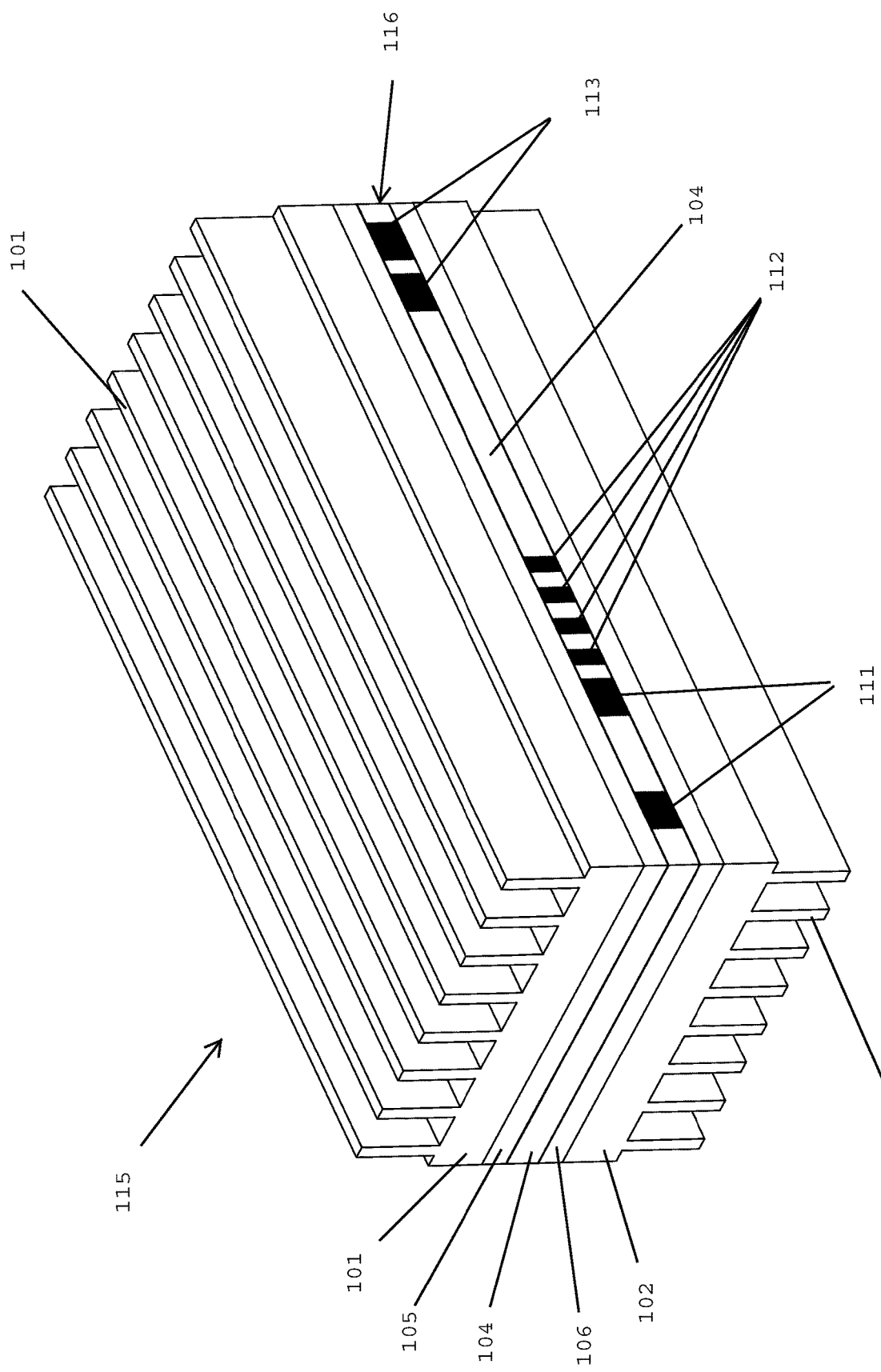
FIGS. 10A, 10B show single modules 115, 115B after singulation.

Singulation is the process by which individual modules, e.g. singulated module 115 in FIG. 10A, are separated from the panel assembly 120, e.g. by cutting. The panel assembly 120 may be singulated after the molding compound is cured. The panel assembly 120 is separated from the upper and lower mold presses 161, 162 and may be cut, e.g. along lines 128, 129 as shown in FIG. 9A, to singulate the modules 115A-115L. For example, a narrow saw may be used to cut through the layers (e.g. as shown in FIGS. 1, 10A, 10B, 12) of panel 120, which may include heat sink 101, cured molding compound 105, PCB 104, cured molding compound 106, and heat sink panel 102. For example, a 0.025 inch thick saw such as model number EAD-3350 available from Disco Corp., Ota-ku, Tokyo, Japan may be used. Referring to the cross-sectional views of FIGS. 6 and 7, dashed lines 129 illustrate the lines along which the panel 120 may be cut to singulate modules 115D, 115E, and 115F. As shown, the cuts 129 (along the long side of the individual modules 115) go through the middle of the trenches 147. The trenches 147 may be made wide enough and the cuts 129 may be made at an appropriate distance from the edges of the trench 147 to ensure that a minimum thickness of cured molding compound remains in the trench after singulation to be mechanically robust. The trenches 147 may also be used to reduce the thickness of metal through which the saw must cut during singulation, e.g. by optionally providing trenches along the perimeter of each module.

G. Electrical Connections

Interconnection features may be embedded in the PCB panel 124, preferably along the boundaries of the individual circuits, so that electrical contacts are at least in part formed by or exposed during singulation. To maximize the area on a PCB panel 124 available for circuitry, the interconnection features may preferably be buried in the PCB panel 124 below the top and bottom surface layers. For example, the interconnection features may be formed in the inner conductive layers but not occupying valuable area on the surface conductive layers, potentially reducing setback and other spacing requirements. The interconnect features therefore are preferably formed in the PCB panel 124 before the panel 120 is assembled and exposed when the panels are cut, e.g. during singulation. The interconnection features may comprise a pattern of conductive layers or buried vias (frequently used to form connections between internal conductive layers) or both in the PCB situated along the circuit boundary, i.e. lying in the cut line, e.g. cut line 129 (FIG. 9A).

Referring to FIG. 10A, a module 115 is shown after singulation. Exposed interconnects 111, 112, and 113 are shown embedded in the edge of the PCB 104 along one of the edges 116 of the module 115. As shown in FIG. 10A, longer connections 111 and 113 provide greater interconnect surface area and higher current carrying capacity, making them amenable for use as power connections, than shorter connections 112 which have less interconnect area and lower current carrying capacity, making them useful for control signal connections. FIG. 11 shows an enlarged view of a portion of the module 115 along edge 116 revealing detail of the two interconnections 111 after singulation. The width along the boundary and number of the conductive features arranged vertically through the PCB layers may be adjusted to provide the requisite contact area for each connection. In the example of FIG. 11, conductive features, e.g. conductive lands 111A through 111L, formed along the cut line on a plurality of the conductive layers of the PCB form a stack of conductive strips resembling a bar code after singulation. The stack of conductive lands may provide more contact area than possible with a single buried via. In FIG. 11, each interconnect 111 is made up of twelve lands, each land being formed on a respective one of twelve inner conductive layers. Note that FIG. 11 shows the twelve lands (111A through 111L) buried below the top 124A and bottom 124B surfaces of the PCB, i.e. not occupying surface area on those layers. During singulation, the saw cuts through the buried embedded lands, exposing the edges of the remaining conductive material forming the interconnects 111A through 111L shown in FIG. 11. Note that the buried embedded lands may be shared between two adjacent modules 115 on the panel 120, e.g. where the PCB patterns are laid out in mirror image to each other, allowing the modules to be laid out on the PCB panel close to a singulation cut width apart. Also, the interconnect features may be aligned along a single module boundary as shown or may occupy two or more boundaries of each individual module in the panel. The exposed edges may then be used to form electrical connections immediately after singulation, i.e. before the cut interconnects oxidize or may be protected against oxidation, e.g. with a conformal coating, such as an organic solderability preservative ("OSP"), applied after singulation, to ensure subsequent ability to form electrical connections to the edges. For example, Entek Plus HT available from Enthone, Inc., a Division of Cookson Electronics, West Haven, Conn. 06516 may be used as an OSP to protect the interconnects.

The number of lands, i.e. conductive layers, used to form each interconnect may be increased for better electrical connections or reduced for less critical connections. Although embedded conductive lands are shown in the example of FIGS. 10A, 11, additional or alternative conductive features may be used to form the interconnects. For example, buried conductive vias located along the cut line may be used, either alone or in combination with the lands. The buried vias may be located so that the singulation cut leaves the walls of the conductive vias exposed resulting in vertical conductive strips, i.e. generally perpendicular to the PCB top and bottom surfaces 124A, 124B, in the PCB edge. Buried conductive vias may tend to fill with adhesive during fabrication of the PCB panel 124. Empty conductive vias, i.e. free of non-conductive adhesives, may be preferable for the resulting concave conductive features, i.e. embedded conductive half cylinders. Similarly, solid buried conductive vias or conductive vias filled with conductive material during the PCB manufacturing process may be preferable for the resulting continuous flat conductive surface.

In the alternative to buried conductive features, conductive through-holes, which are generally free of adhesives following fabrication of the PCB panel 124 may be used along the cut line to form interconnects extending through the thickness of the PCB from top surface to bottom surface providing generally half-cylindrical interconnects. A penalty of using through-holes for the interconnects is the loss of surface area on the top and bottom of the PCB which may otherwise be used for setback or other safety and agency approval requirements. Preferably, the through-holes may be filled, for example with a conductive material such as solder or silver paste, or conductive pins may be inserted into through holes and soldered to the through holes, to prevent molding compound from filling the through hole during the encapsulation process and to provide a greater contact surface area yielding generally flat conductive interconnects following singulation.

The exposed interconnect features, e.g. 111A through 111L may be used to make a variety of electrical connections. For example, the exposed interconnects may be solder plated and then subsequently soldered to a motherboard, e.g. using surface mount soldering techniques. The interconnects may be soldered to a connector, such as connector 103 shown in FIGS. 1, 13, 14. Alternatively, a lead frame or PCB may be soldered to the exposed interconnects 111, 112, 113 of the module quickly after singulation. Yet another alternative includes a precious metal such as gold or silver or other suitable conductive material deposited to the exposed contacts, e.g. by plating, to build up the contacts into a larger area, e.g. continuous conductive contacts, well suited to connectorized modules described in more detail below.

G1. Vertical Mount Connector

Figure 13:
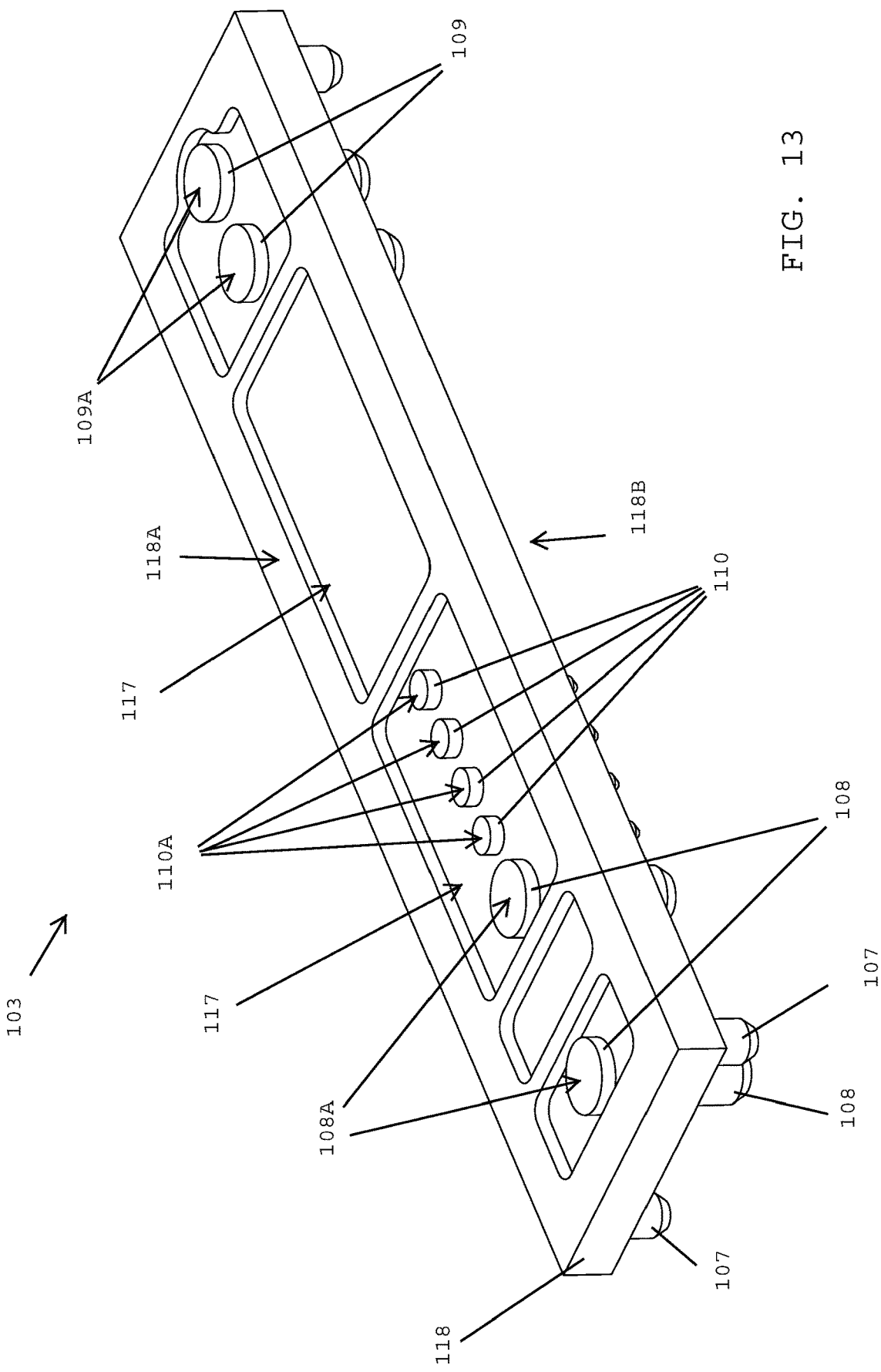
FIG. 13 shows a connector assembly.
Figure 14:
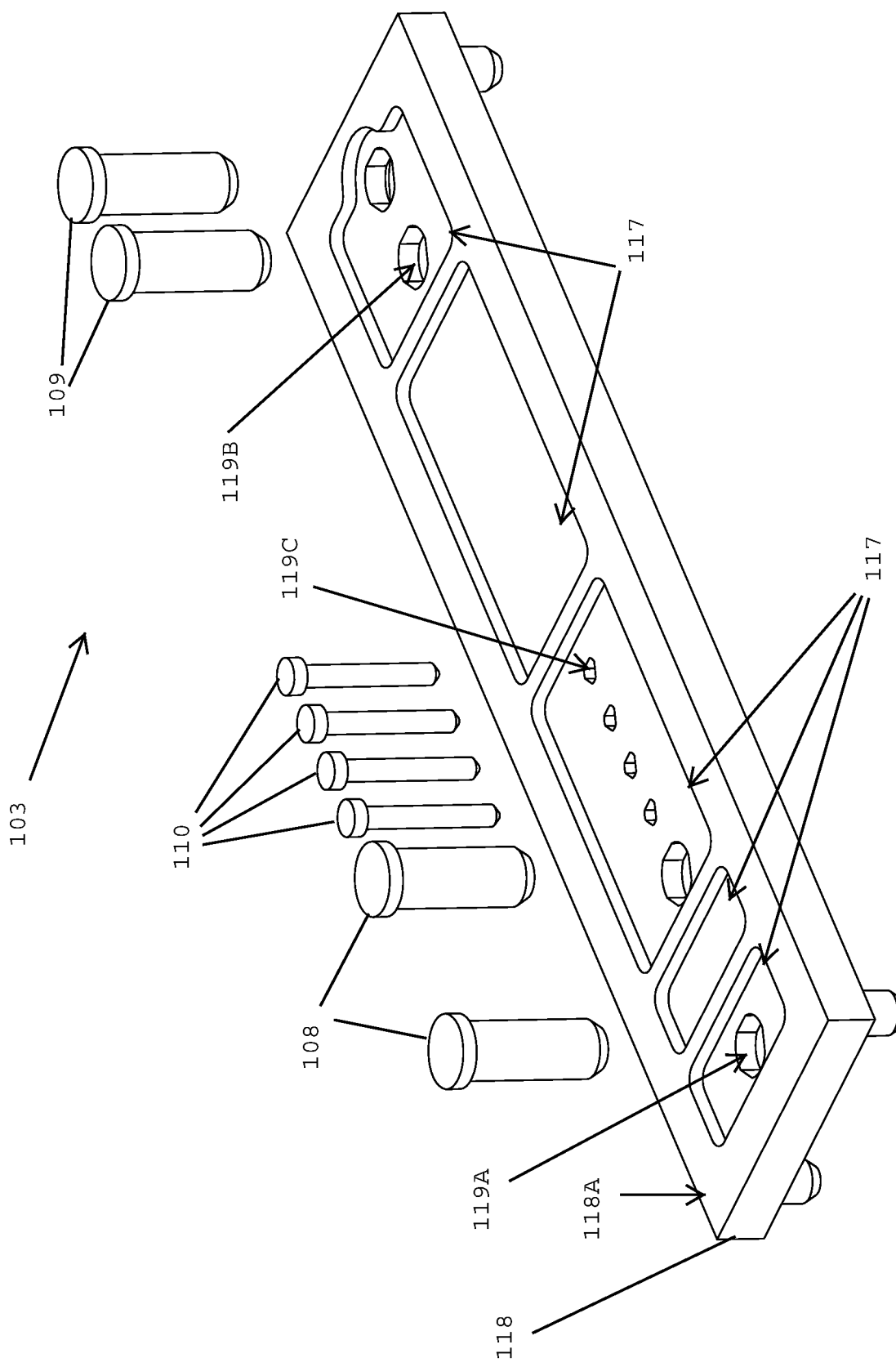
FIG. 14 shows an exploded view of the connector assembly.

Referring to FIGS. 1, 13 and 14, a connector 103 suitable for attachment to the edge 116 of the module 115 is shown having a connector body 118 with a plurality of recesses 117 and a plurality of holes 119A, 119B, and 119C. A plurality of connector pins 108, 109, 110 may be inserted into holes 119A, 119B, 119C, respectively, from the top 118A. As shown, the holes may be contoured to provide a pressure fit having a gripping force suitable for retaining the pins. The broad top surfaces 108A, 109A, 110A of the pins are suitable for making solder connections to the exposed interconnects 111, 113, 112, respectively on the edge 116 of the PCB 104 of module 115. As shown, the recesses 117 provide countersinking for the top portions of the pins allowing the connector body to mount flush to the edge 116 of module 115 and allowing space for a solder joint between the pin and the respective interconnect. The interconnection features may preferably be provided along a long edge of the module 115 yielding a more stable vertical mount module 100 such as shown in FIG. 1. However, the interconnection features may be deployed along any or all of the edges of the module 115 for different mounting configurations as discussed more fully below.

G2. Horizontal Through-Hole Mount

Figure 15:
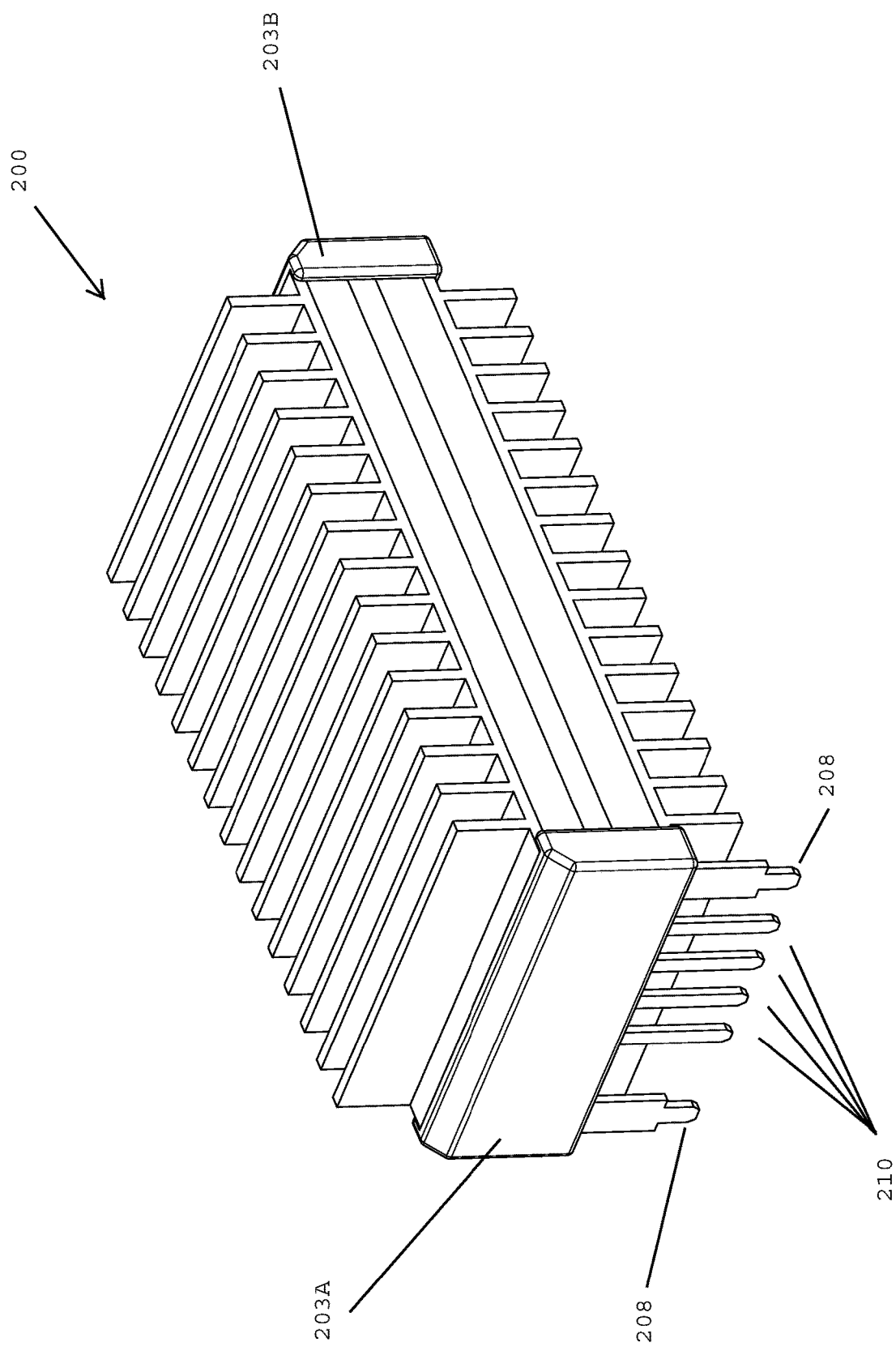
FIG. 15 shows a horizontal through-hole mount module 200.
Figure 16:
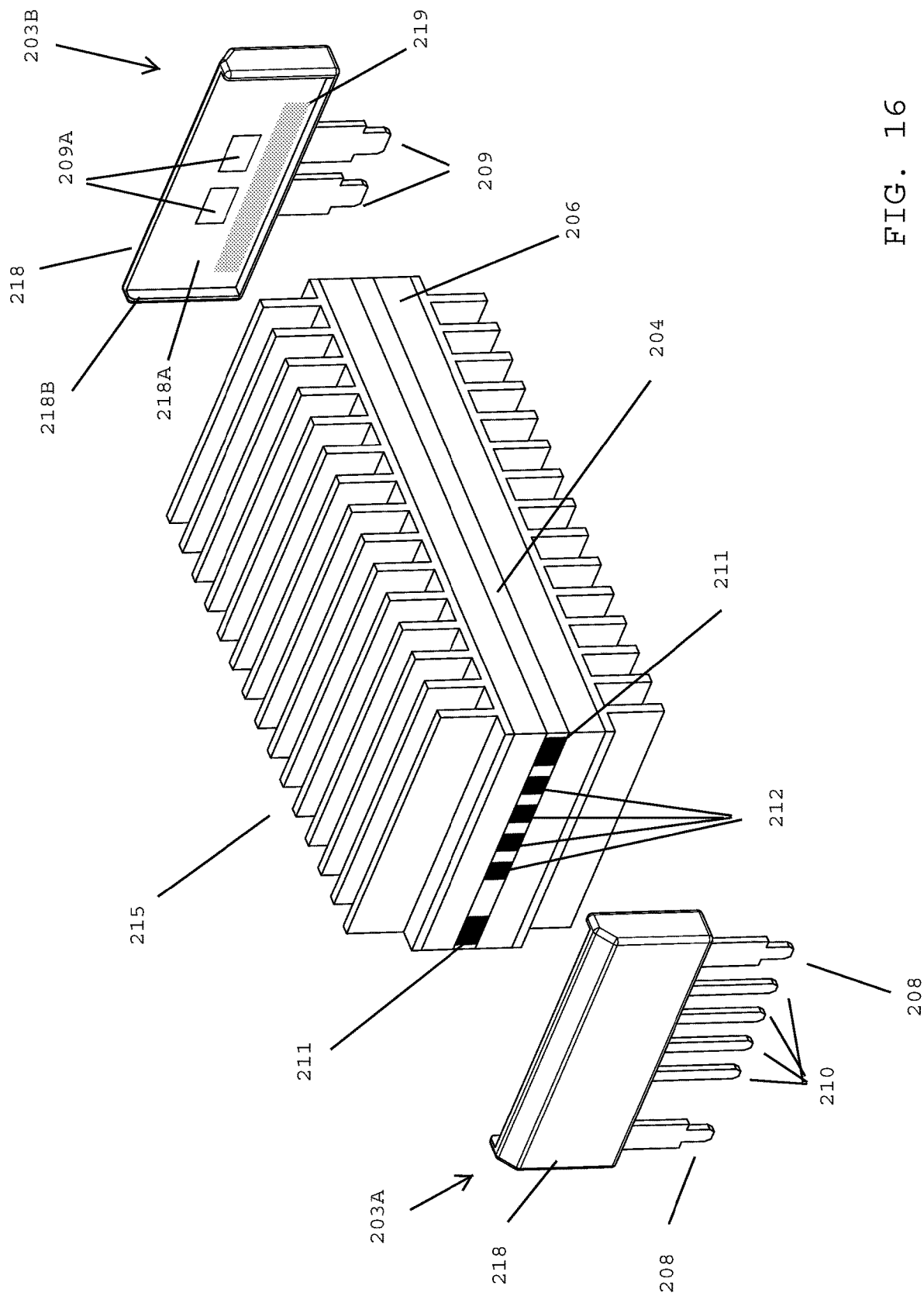
FIG. 16 shows an exploded view of the through-hole mount module 200.

Referring to FIGS. 15 and 16, a horizontal mount component 200 suitable for through hole mounting in a motherboard is shown including a singulated module 215 and through-hole adapters 203A and 203B. The horizontal mount module 200 may be constructed in the same manner as described above for the module 100, except that the interconnects are preferably disposed along two edges of the module PCB and connectors adapted for horizontal mounting may be used. As shown in FIG. 16, the interconnects are disposed along the two shorter edges of the PCB 204 in module 215. However, the longer edges may be used instead of, or in addition to, the shorter edges for the interconnects. Although only one set of the interconnects 211, 212 is visible in the perspective view of FIG. 16, it will be understood that a second set, including two additional power interconnects, is disposed along the opposite hidden edge of the PCB.

Through-hole adapters 203A and 203B, suitable for attachment to the edges of the singulated module 215 are shown having adapter bodies 218 supporting conductive terminals 208, 210 and 209, respectively. A portion of each terminal may be exposed on an internal surface via an opening in the adapter body optionally providing a small recess. In FIG. 16 for example, adapter 203B is shown having two power terminals 209, each having an exposed areas 209A recessed in openings in surface 218A of the adapter body 218. The exposed areas 209A align with their respective interconnects when the adapters 203A, 203B are assembled onto the module 215. The recesses provide countersinking for the exposed terminals allowing the internal surface 218A of the adapter body 218 to mount flush to the edge of module 215 and allowing space for a solder joint between the terminal and the respective interconnect. The adapter body 218 may include a flange 218B which may form a pressure fit with the adjacent edges of the modules 25. Additional features may be provided for maintaining the structural integrity of the module and connectors.

As shown in FIG. 16, epoxy may be deposited along an internal edge of the connector body, e.g. in the shaded area 219 preferably aligned with the encapsulant layer 206 to secure the adapters 203A, 203B to the module 215. The horizontal mount module 200 may be readily adapted to match industry standard brick footprints for power converters, in particular the module 200 may fit within the standard $\frac{1}{8}^{th}$ brick footprint.

G3. Horizontal Surface-Mount

Figure 18:
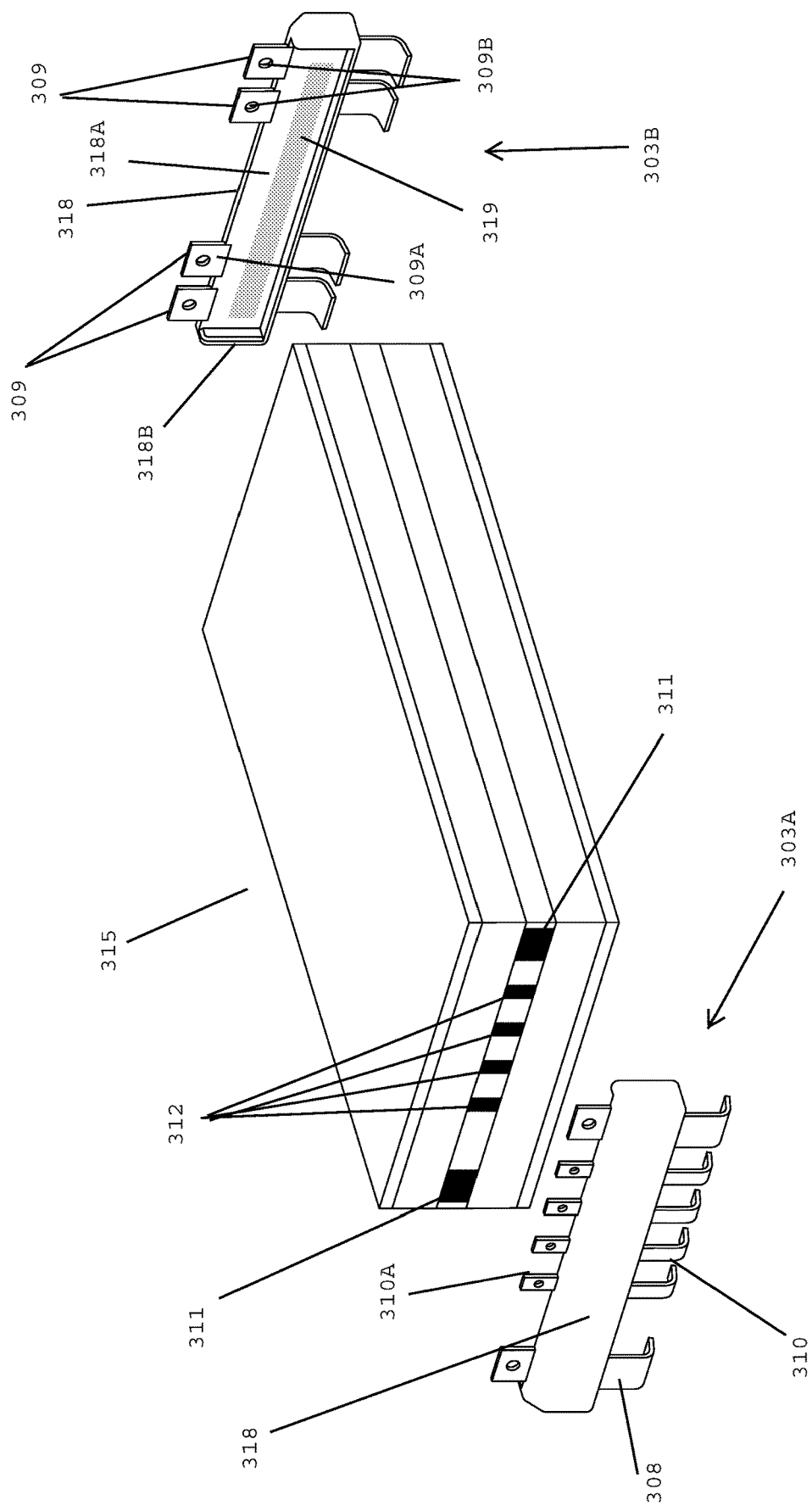
FIG. 18 shows an exploded view of the surface-mount module 300.

Referring to FIGS. 17 and 18, a horizontal-mount component 300 suitable for surface-mount soldering to a motherboard is shown including a singulated module 315 and surface-mount adapters 303A and 303B. The horizontal-mount module 300 may be constructed in the same manner as described above for the module 200 (FIGS. 15, 16) substituting surface mount adapters 303A, 303B for through-hole adapters 203A, 203B. As shown in FIG. 17, the singulated module 315 may have flat heat sinks 301, 302 instead of the finned heat sinks (shown in FIGS. 1-4, 6-12, 15-16). Although shown disposed along the two shorter edges in FIGS. 17 and 18, the interconnects may be deployed along the longer edges of the PCB 304 in the singulated module 315 instead of, or in addition to, the longer edges.

In FIGS. 17 and 18, the surface-mount adapters are shown with smaller bodies 318 than the through-hole adapters (218: FIG. 15, 16) exposing the connections between the terminals and their respective interconnects during assembly and for post assembly inspection. The terminals 308, 309, 310 each may include a portion, e.g. solder pads 308A, 310A, 309A, adapted for connection, such as a solder joint, to a respective interconnect on the module, e.g. interconnect 311, 312, and 313 (not visible in FIGS. 17 and 18). Holes 308B, 309B, 310B may be provided in solder pads 308A, 309A, 310A for better solder joints. Each terminal 308, 309, 310 may include a bend (e.g. 308C) to produce a surface-mount pad (e.g. 308D) for attachment, e.g. by surface-mount soldering, to a customer motherboard.

The adapter bodies 318 may include flanges 318B, preferably along two or more sides to form a pressure fit with the adjacent edges of the modules 315. Additional features may be provided for maintaining the structural integrity of the module and adapters. As shown in FIG. 18, epoxy may be deposited along an internal edge of the connector body, e.g. in the shaded area 319 preferably aligned with the encapsulant layer 306 to secure the adapters 303A, 303B to the module 315.

G4. Surface-Mount Lead Frame

Figure 19:
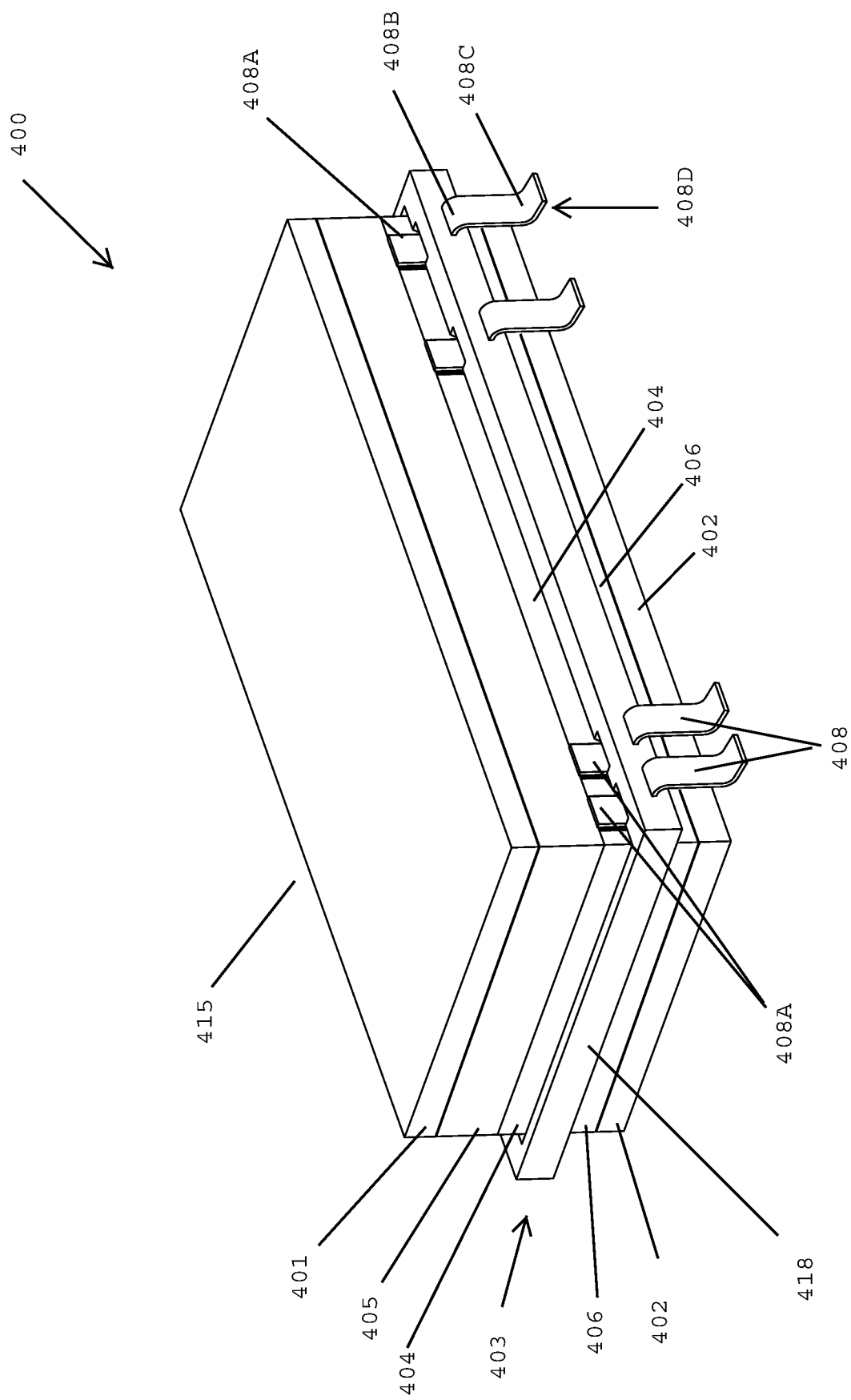
FIG. 19 shows an alternative horizontal surface-mount module 400.
Figure 20:
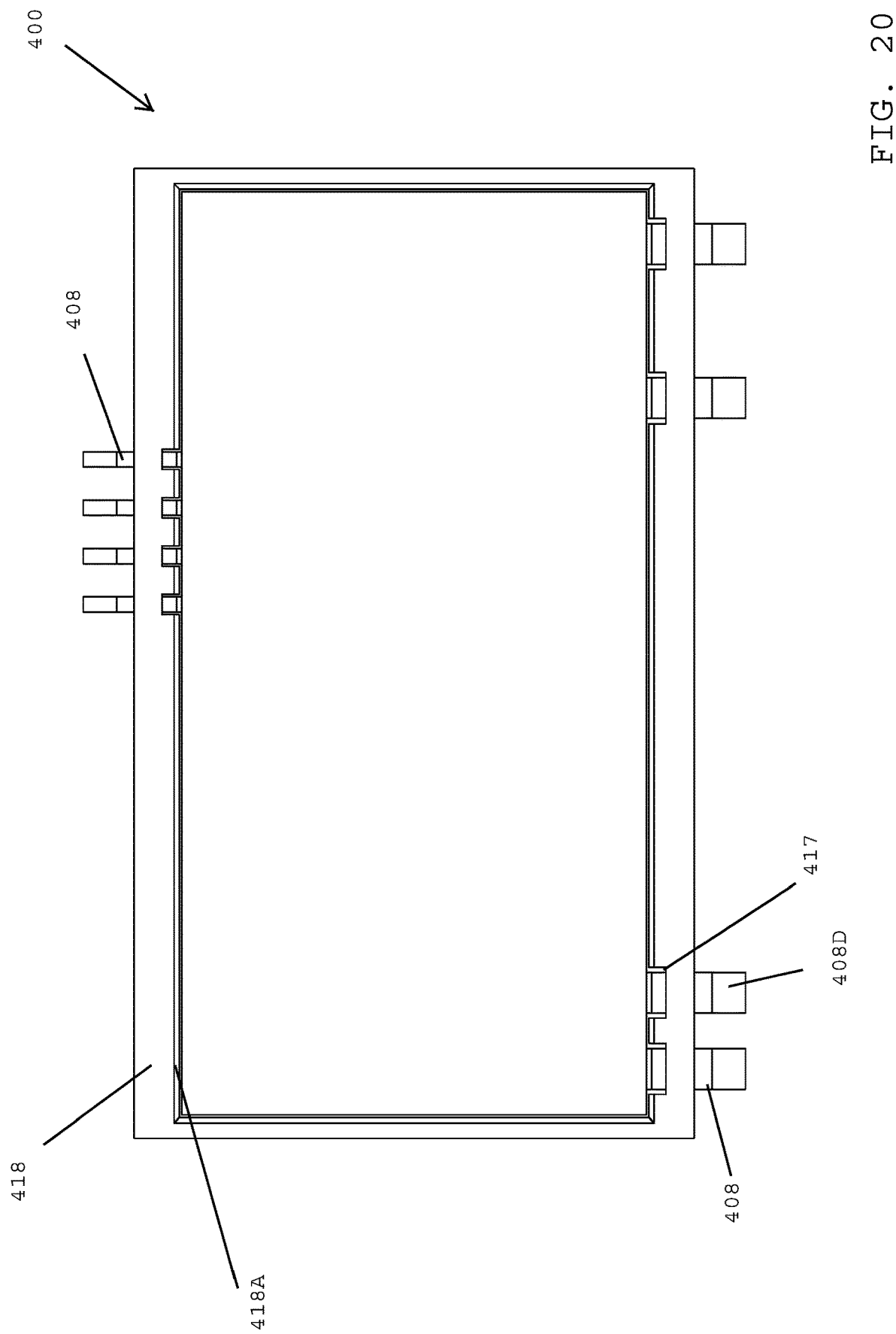
FIG. 20 shows a top view of the surface-mount module 400.

An alternate embodiment of a horizontal-mount component 400 suitable for surface-mount soldering to a motherboard is shown in FIGS. 19 and 20 including a singulated module 415. The horizontal-mount module 400 may be constructed in the same manner as described above for the module 300 (FIGS. 17, 18) substituting lead frame adapter 403 for the surface-mount adapters 303A, 303B. Like module 315 (FIG. 17), the singulated module 415 may have flat heat sinks 301, 302 instead of the finned heat sinks of the previous examples. However, in the example of FIGS. 19 and 20, the interconnects are shown deployed along the longer sides of the singulated module 415. However, as noted above the interconnects may be deployed along any edges of the PCB 404 as desired in the singulated module 415.

The surface-mount adapter is shown in FIGS. 19 and 20 having a unitary rectangular frame-like body 418 supporting a plurality of terminals 408. The profile of the frame body 418 may as shown leave a portion of the terminals exposed for making connections to their respective interconnects during assembly and for post assembly inspection. The terminals 408 each may include a portion, e.g. solder pad 408A, adapted for connection, such as a solder joint, to a respective interconnect on the module (not visible in FIGS. 19, 20). Although shown without holes in FIG. 19, the solder pads may optionally include holes such as those shown in FIGS. 17 and 18. Each terminal 408 may include a bend (e.g. 408C) to produce a surface-mount pad (e.g. 408D) for attachment, e.g. by surface-mount soldering, to a customer motherboard.

The opening in the frame body 418 may be sized to accommodate the perimeter edges of the singulated module 415 and optionally form a pressure fit. The frame body 418 may include recesses 417 for accommodating the terminals 408, allowing the interior surface 418A of the frame body 418 to rest flush against the module 415 surface. Additional features may be provided for maintaining the structural integrity of the module and adapters. Gaps may be provided in the interior surface 418A to allow the application of epoxy to secure the frame body 418 to the module 415.

G5. Connectorized Module

Figure 21:
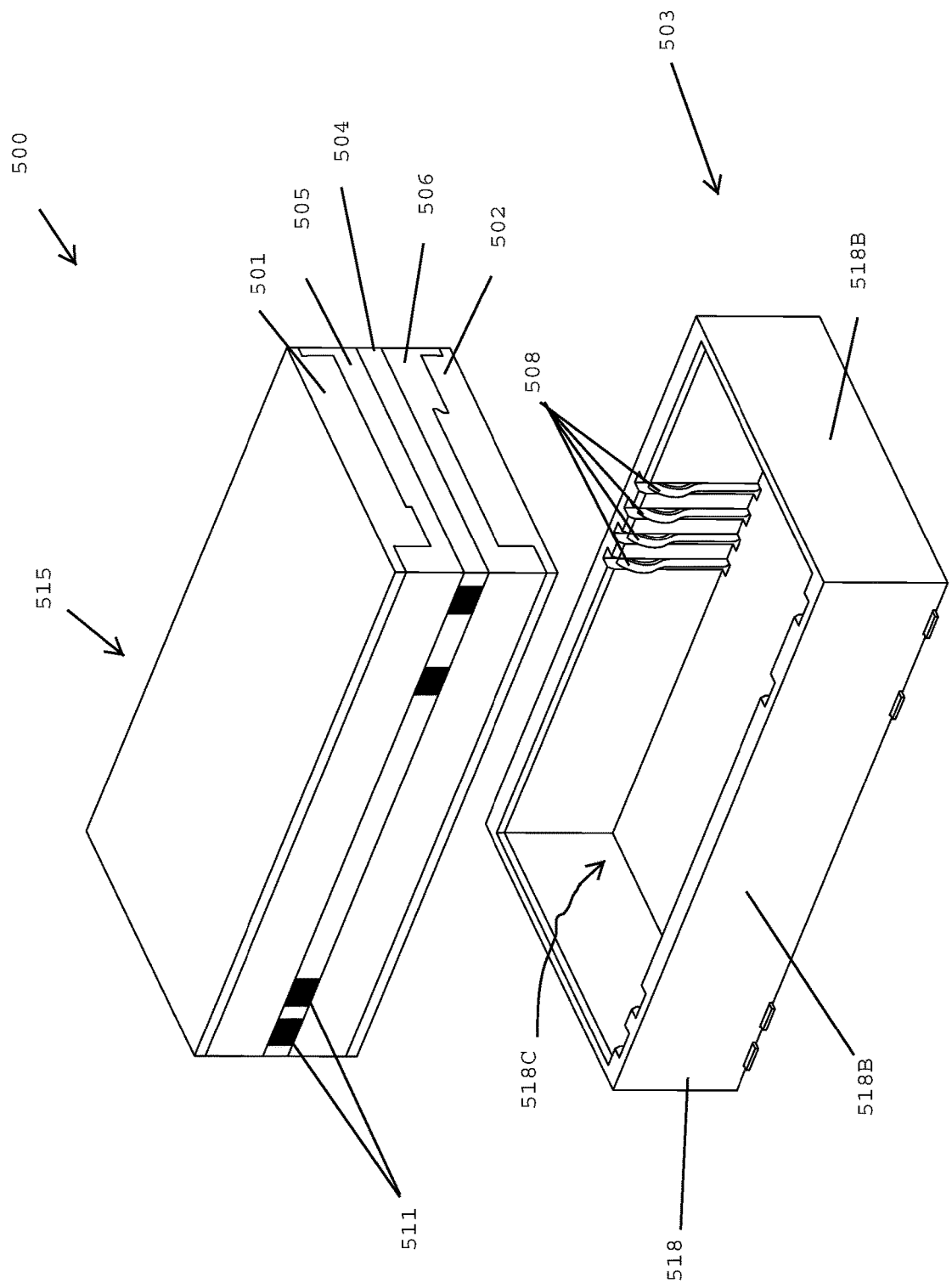
FIG. 21 shows an exploded top view of module-connector set 500.
Figure 22:
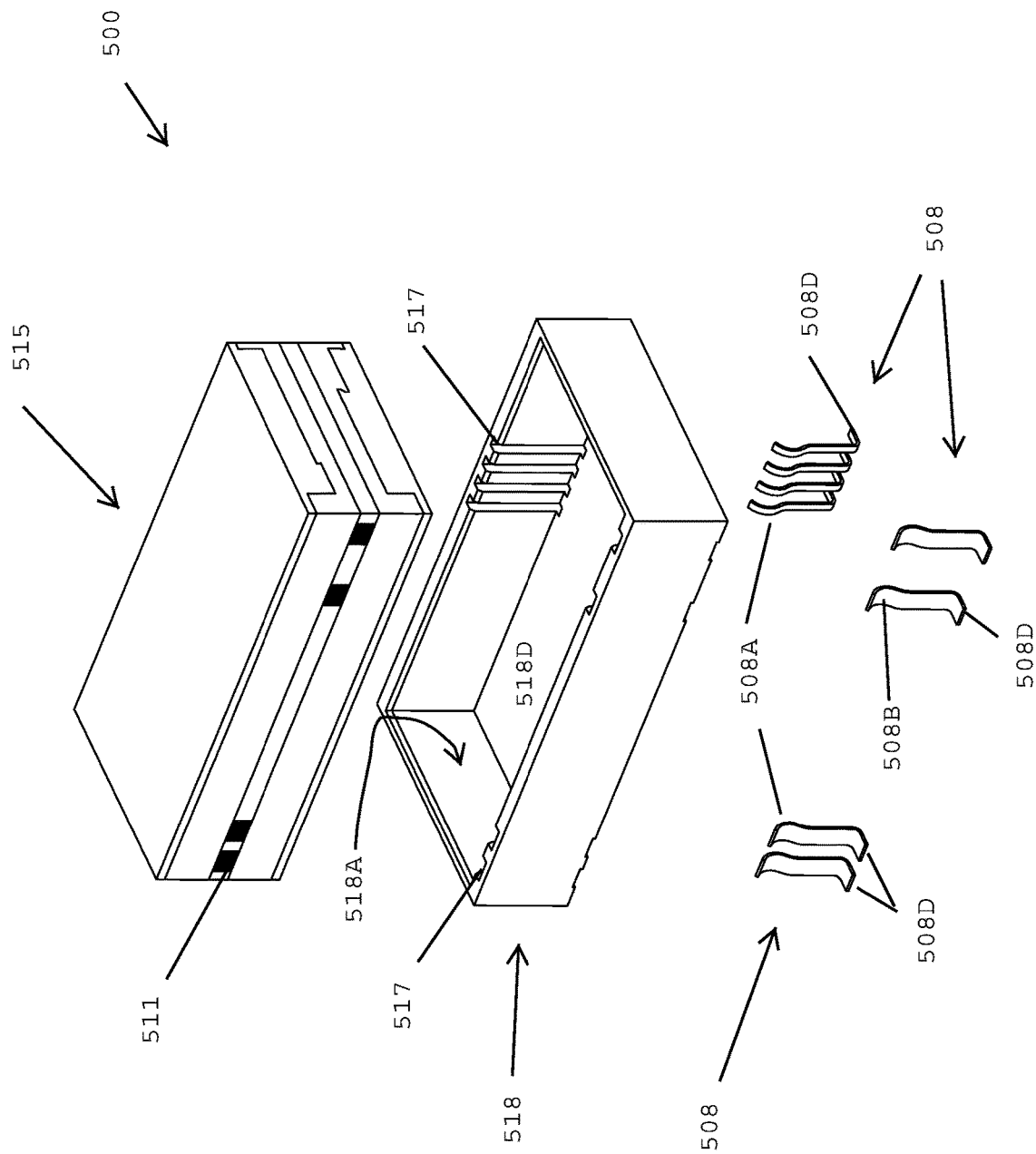
FIG. 22 shows an exploded view of the connector set 503.

The modules 100, 200, 300, and 400 discussed above in connection with FIGS. 1, and 15-20 are all examples in which connectors or adapters are mechanically and electrically connected to the interconnects on the singulated modules forming an integral modular component. Yet another option is to adapt the module to be removably mated with a connector that may be mounted on a customer circuit board. For example, the module interconnects may be plated up with an appropriate conductive material, such as silver or gold, to form contacts that may be reliably engaged with connector contacts, i.e. "connectorized." Referring to FIGS. 21 and 22, a module-connector set 500 is shown including a connectorized module 515 in exploded view with a mating connector 503 into which the module 515 may be removably inserted.

Figure 23:
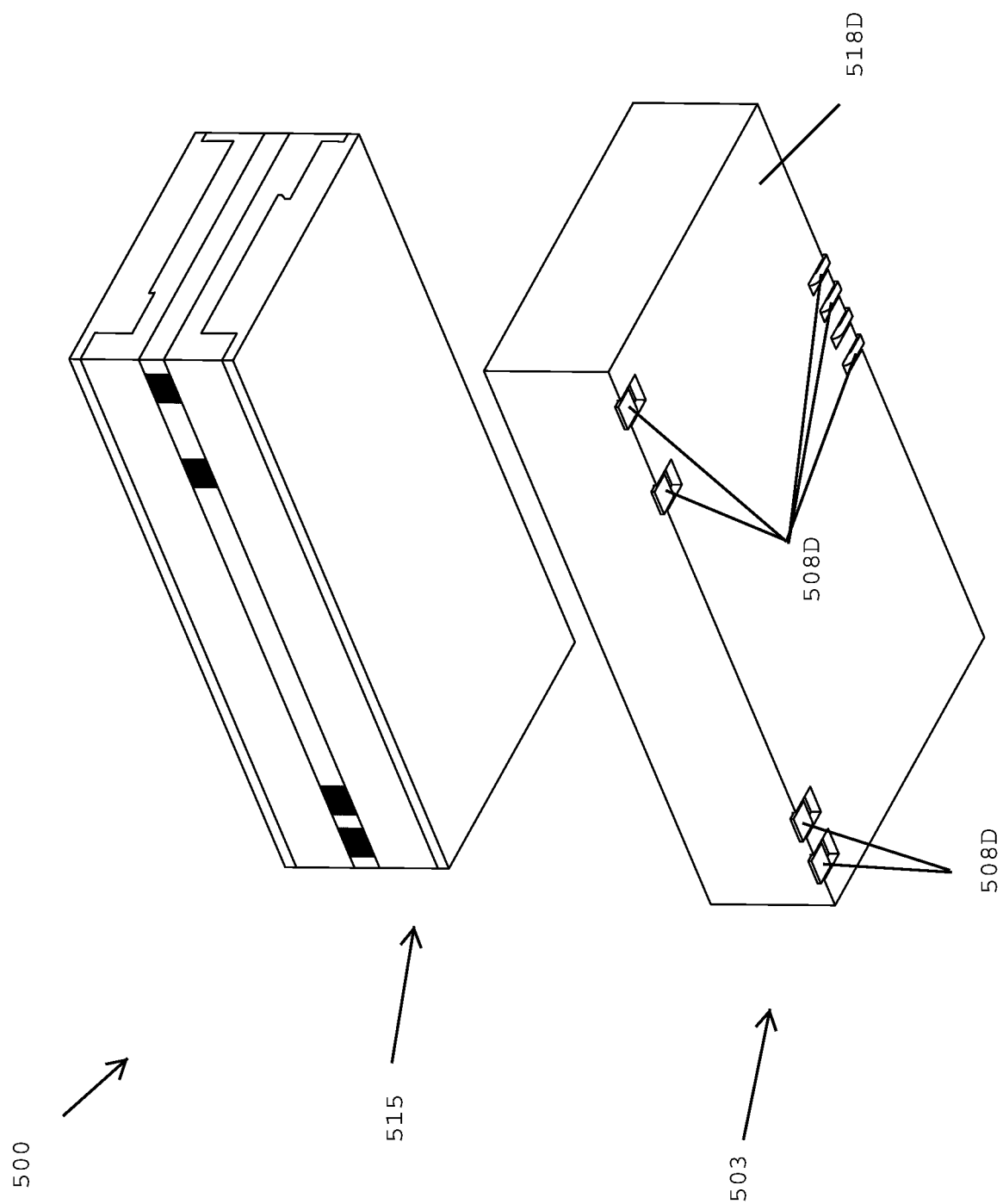
FIG. 23 shows an exploded bottom view of module-connector set 500.
Figure 24:
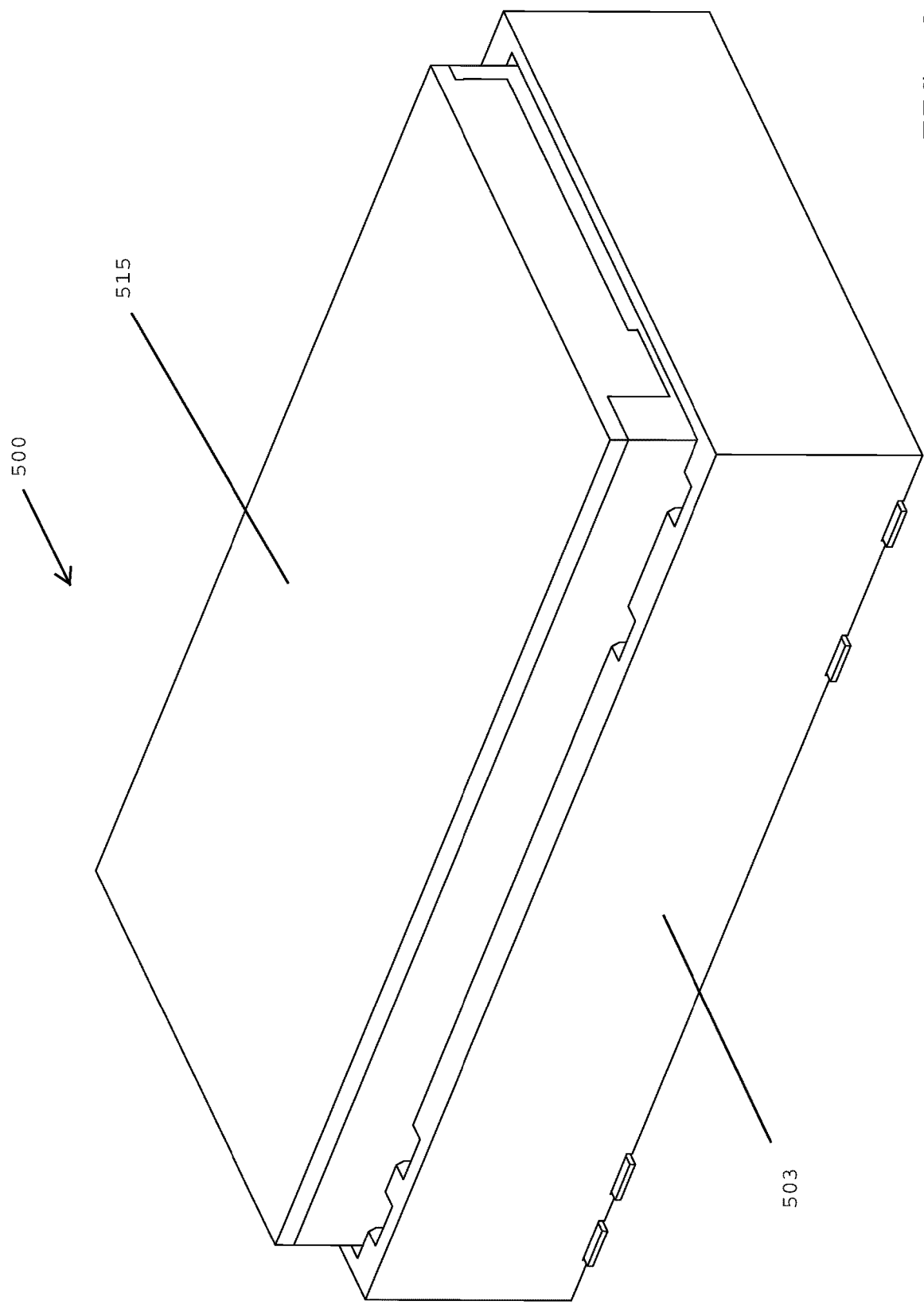
FIG. 24 shows an isometric view of the module-connector set 500 assembled.

The connector 503 as shown includes a body 518 having side walls 518B creating an opening 518C adapted to receive the connectorized module 515. Terminals 508 formed, e.g. bends 508B (FIG. 22), to provide a pressure fit between a contact area 508A of each terminal 508 and a respective interconnect 511. The terminals as shown may be retained in recesses 517 in the interior surface 518A of the side walls 518B. The recesses 517 may provide support to keep the terminals 508 in place and allow the interior surfaces to engage the surfaces of the module 515. The terminals 508 may include a flat portion 508D (FIGS. 22, 23) adapted for making a solder connection to surface contacts on a customer circuit board (not shown). The connector body may include a bottom surface 518D enhancing the structural integrity of the connector walls 518B which are subjected to the forces exerted by the terminals 508 against the interconnects 511. The bottom 518D may include openings as shown in FIG. 23 through which the terminals may be inserted during assembly of the connector 503. The bottom 518D may provide electrical insulation between the metal heat sink 502 and the customer circuit board (not shown) on which the connector 503 may be mounted. Alternatively, the bottom may be partially or completely removed to allow better conduction of heat from the module 515 out through the customer circuit board. Yet another alternative is to use a thermally conductive material in the bottom 518D of the connector 503. FIG. 24 shows the connectorized module 515 inserted into the connector 503.

As shown, the connector terminals 508 exert inward pressure from opposing ends of the module, however, the contacts may be arranged along a single side of the module with the connector body providing the necessary resistive force for the pressure fit. Although the connectorized module is shown having plated interconnects 511 forming contacts for engagement with the connector terminals, it should be appreciated by those of skill in the art that many variations are possible. For example, adapters of the type illustrated in connection with FIGS. 15-20 may be used to provide contacts for a hybrid connectorized module allowing other orientations of the module relative to the connector and to the customer circuit board.

G6. Flush Mount

Figure 26:
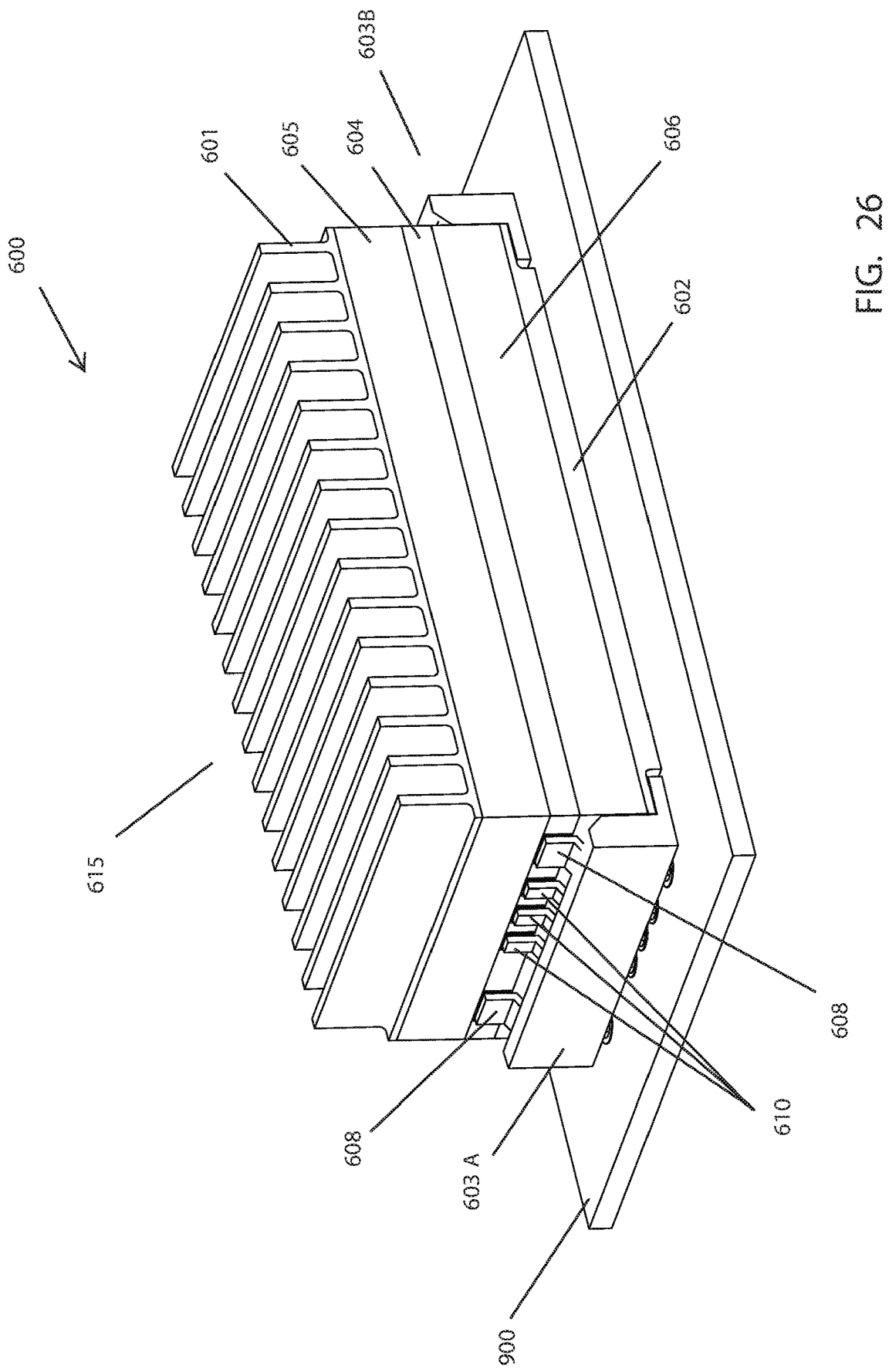
FIG. 26 shows the horizontal through-hole flush-mount module 600 assembled onto a customer PCB.

A flush-mount technique may be used with the horizontal PCB-mounting techniques discussed above in connection with FIGS. 15-24 to allow the bottom heat sink to come into contact with the customer PCB, e.g. for heat removal. As shown in FIGS. 25 and 26, a through-hole mount module 600 is shown adapted for flush-mounting to a customer PCB 900. The module 600 as shown includes two through-hole adapters 603A, 603B attached to the singulated module 615. The singulated module 615 may, as shown, have a finned top heat sink 601 and a generally flat bottom heat sink 602 for flush mounting against the PCB 900. Similar to the adapters discussed above in connections with FIGS. 16-20, through-hole adapters 603A, 603B have terminals, 608, 609, 610 which include features, such as solder pad 608A, adapted to be attached, e.g. by solder, to respective interconnects on the module 615. The terminals 608, 609, 610 may be adapted to be soldered into through holes 908, 909, 910, respectively, in the customer PCB 900. As shown in FIGS. 25 and 26, the generally flat heat sink 602 may include recesses 602B to accommodate flanges 618B of the adapter bodies 618 allowing most of the surface of heat sink 602 to rest flush against the surface of the PCB 900. Epoxy or other adhesive may be used in the recess to secure the adapter body to the module. The recesses may be an integral feature of the heat sink panel or may be added at an appropriate point during the manufacturing process, preferably before singulation.

A thermally conductive material 901, e.g. thermal adhesive, may be applied between the PCB 900 and the module heat sink 602 to facilitate removal of heat through the PCB 900. Additionally, the PCB surface may include thermally conductive features to conduct heat away from the module 615. For some applications particularly involving smaller module sizes, it may be desirable to solder the bottom heat sink 602 to one or more pads on the PCB 900, in which case the heat sink may include a solderable finish, applied for example by plating. Threaded holes may be provided, preferably in the flush mount heat sink panel, allowing the module to be secured using screws to a customer board or cold plate. The flush-mount modification may allow taller heat sink fins to be used on the top of the module without increasing the module profile above the customer PCB which may provide better thermal management in some environments. Additionally, the flush-mount may provide a more robust shock and vibration resistant mechanical solution.

Figure 25A:
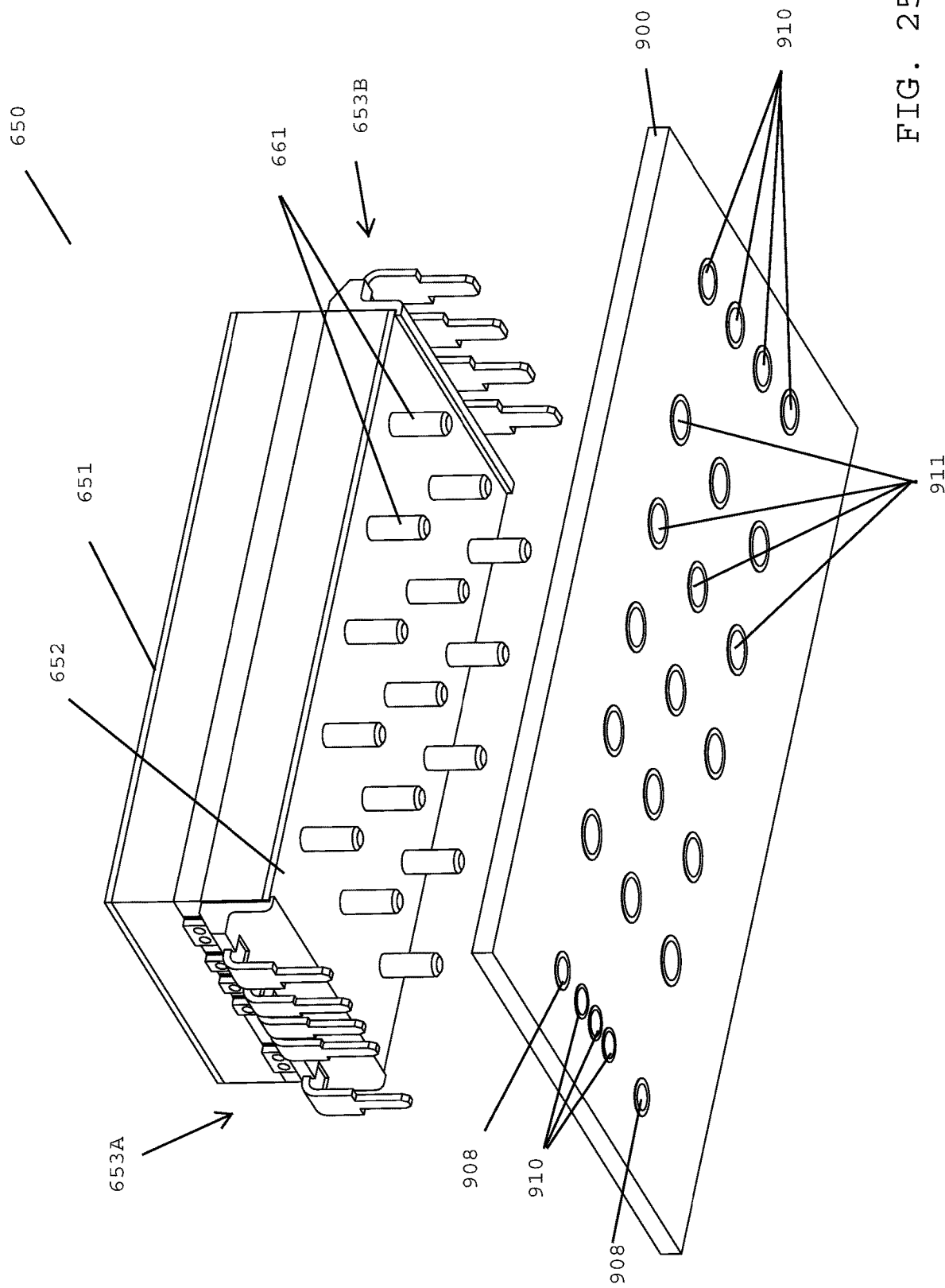
FIG. 25A shows an alternative horizontal through-hole flush-mount module 650 exploded from a customer PCB.

Another flush mount module 650 may include a plurality of pins 661 protruding from the bottom heat sink 652 for engagement in through holes 911 in the customer mother board 900 as shown in FIG. 25A. Similar to the flush mount module 600 of FIGS. 25 and 26, the flush mount module 650 may include adapters 653A and 653B adapted for making electrical connections with through holes on the customer mother board 900. Instead of fins, the top heat sink 651 may include a flat surface to create a low-profile package as shown in FIG. 25A. The pins 661 may be formed as an integral part of the bottom heat sink panel instead of fins. Alternatively, blind holes may be provided in the heat sink panel into which the pins may be press fit at any suitable stage of the fabrication process. The pins 661 may be used to electrically connect the bottom heat sink 652 to the customer board, e.g. to ground, conduct heat out of the module into the customer board 900, and provide mechanical support. The through holes 908, 909, 910, 911 in the customer board may be sized to provide clearance between the hole and the respective pin to compensate for any dimensional variations. The pins 661 may optionally protrude beyond the bottom surface of the customer board 900 into forced air along the bottom surface of the board for additional heat removal. Additionally, a heat sink component (not shown) may be fitted onto the protruding pins to help dissipate heat.

H. Heat Sink Setback

Figure 9B:
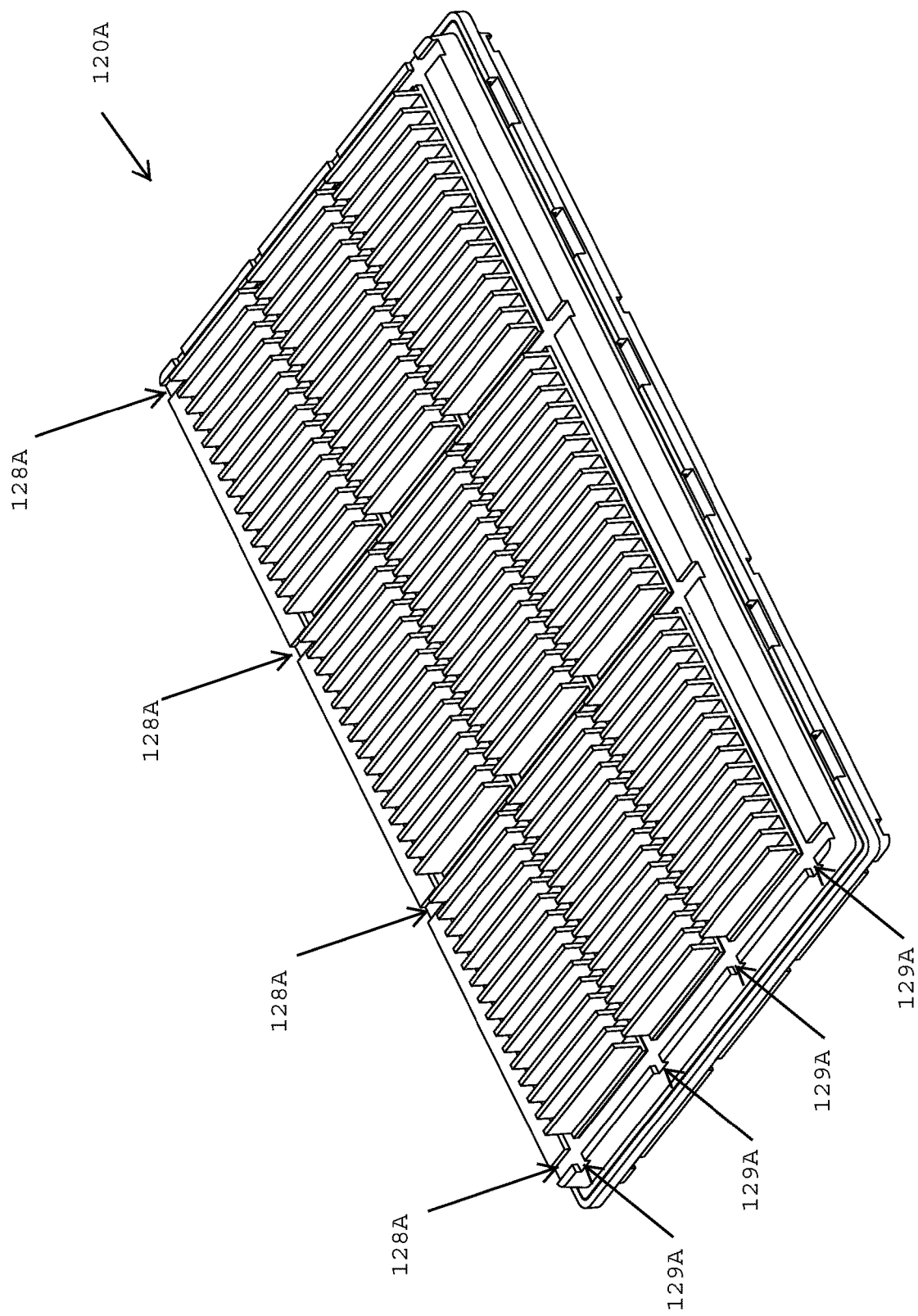
FIGS. 9B, 9C show optional channels formed in the panel before singulation.
Figure 9C:
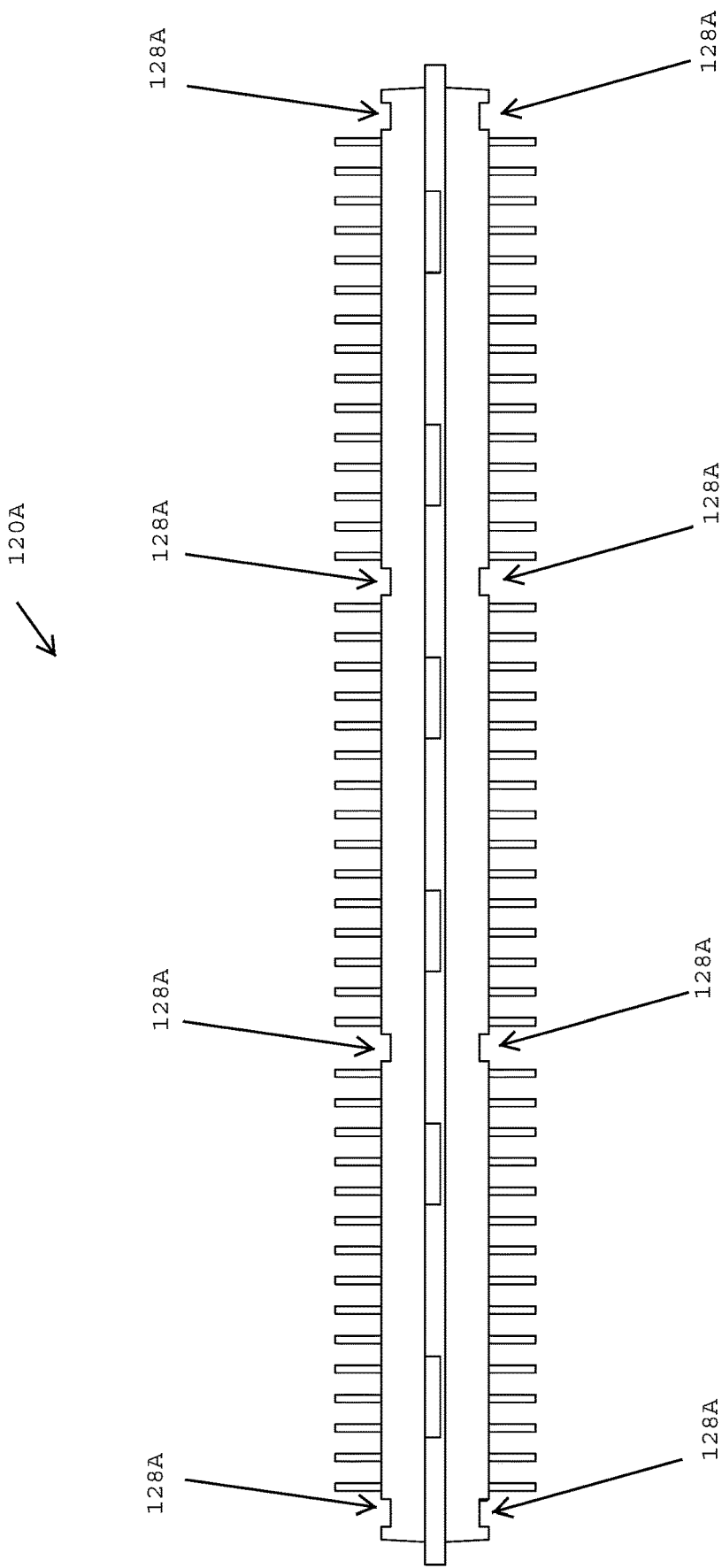
Figure 10B:
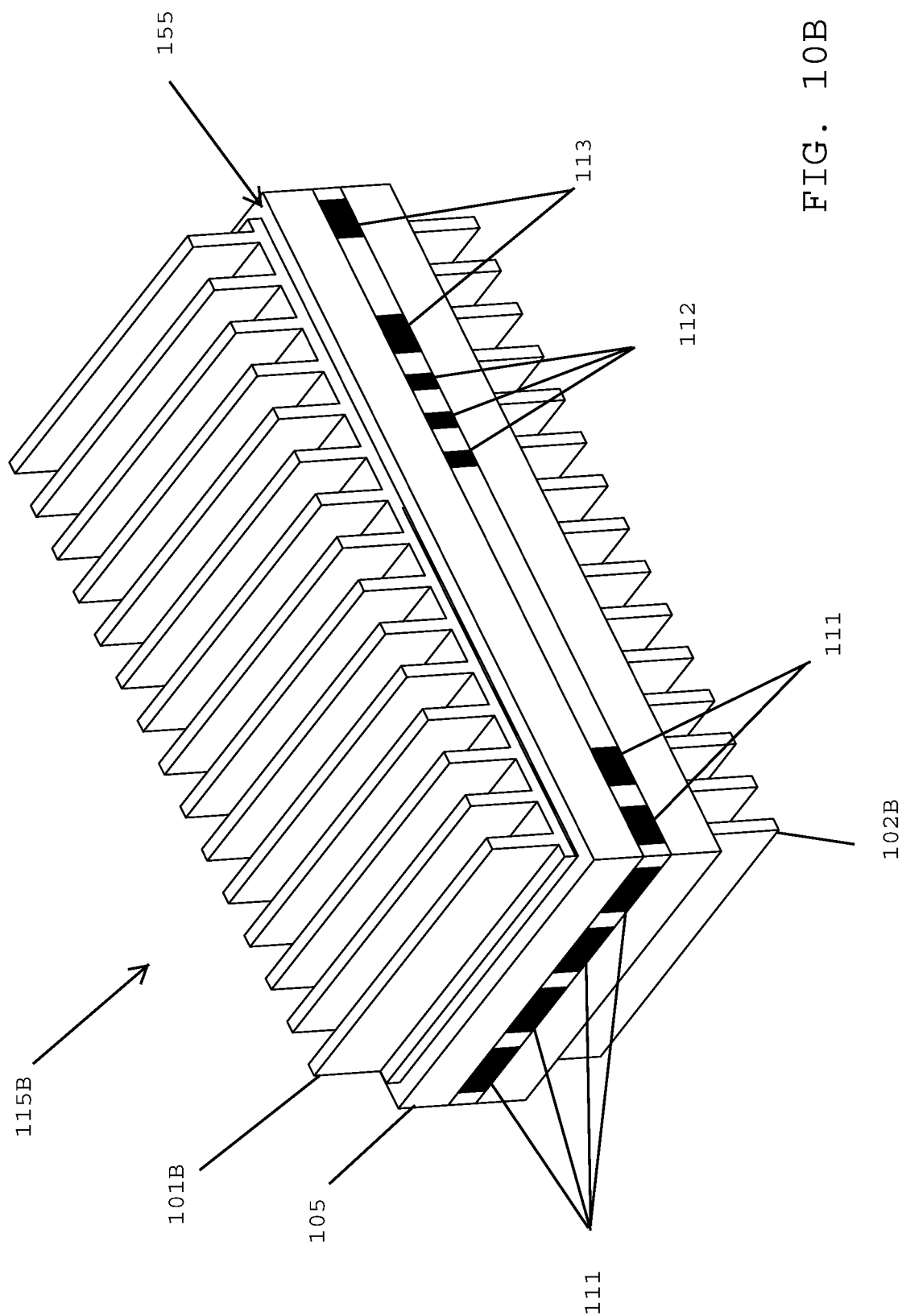

As internal components are reduced in height, e.g. reducing the thickness of the magnetic core, the depth of the interior cavity may be decreased bringing the heat sink panels closer together, reducing the encapsulant thickness and the resulting module thickness. However, reduction of the encapsulant thickness has the potentially undesirable effect of reducing the spacing between the electrical interconnects and the edges of the heat sink panels in the finished module. When desirable, e.g. to satisfy safety agency requirements, the separation between the exposed interconnects, e.g. interconnects 111, 112, 113, and the edge of the heat sink, e.g. heat sink 101B, may be increased using a setback, e.g. setback 155, between the edges of the heat sink panels and the edges of the module 115B as shown in FIG. 10B. The setback 155 may be created by making wide cuts through the heat sink panels 121, 122 along the singulation lines prior to singulation. The wide cuts preferably extend through the heat sink material, e.g. aluminum, and partially into the encapsulation material to form channels 128A and 129A in the panel assembly 120A as shown in FIGS. 9B and 9C. If machined while the assembly is still hot from the encapsulation process, the channels 128A and 129A may be used to divide the heat sink panels into singulated module dimensions reducing stresses due to differential contraction between the heat sink and the encapsulant due to differences in thermal coefficients of expansion while the panel assembly cools. Stresses on the narrow saw may also be reduced by eliminating the heat sink metal through which the saw must cut during singulation as a result of the channels 128A, 129A.

I. Process Efficiencies

Using interconnection features that may be exposed during singulation allows the PCB panel 124, containing a plurality of modules, to be molded as a single unit. Providing embedded interconnects along the perimeter of the circuit that occupy little or no PCB surface area help reduce wasted PCB area that would otherwise be cut away, allowing close to full utilization of the PCB for product which may save on cost. Encapsulating the PCB panel with the heat sink panels simplifies the structural aspects of the modules. Using interior contours in the heat sink to match component heights helps reduce the amount of molding compound required for encapsulation. Furthermore, controlling the distance between the magnetic cores and the internal surface of the heat sink can be used as an alternative to and eliminating the complications of the exposed core molding process described in the Exposed Core Application.

Furthermore, using the mold panels to form the mold cavity for encapsulating the PCB panel helps free the molding equipment from product specific requirements that may otherwise require customized molds, allowing a single piece of molding equipment to be used for a wide variety of product mixes. The finished products, e.g. modules 115 made using a standard panel size, may have diverse dimensions not only in the lateral (length and width) directions, but also in the vertical (thickness) direction (e.g. due to heat sink fin height or component thickness). However, because the lateral panel dimensions remain the same, and variations in thickness from panel to panel may be accommodated by the molding press, the same general purpose molding equipment may be used for a wide variety of products of diverse dimensions. Using power converters as an example, the same mold press may be used to encapsulate panels of power converters ranging in (1) footprint size from full size, to half, to quarter, to eighth size (or any other size), and in (2) thickness (height), and in (3) topology, e.g. isolated DC-DC regulating converter, non-isolated buck regulator, DC transformer, etc. to produce a large mix of products.

A panel molding manufacturing process for a mix of products may include some or all of the following steps. Select a specific product to build. Select the requisite blank heat sink panels, e.g. based upon fin orientation, spacing, and height for the specific product. Alternatively, machine the exterior of the heat sink blank panels to produce the requisite external surface (heat sink surface, mounting features such as threaded holes, fin orientation, thickness, and spacing). Machine the interior surfaces of the heat sink blanks to form the recesses and other features (i.e. the contours of interior cavity to match some or all component locations, size, and height), of the finished heat sink panels required for the specific product, preferably under computer control. Select the appropriate PCB panel for the specific product. Select and assemble the magnetic cores and other components onto the PCB panel, e.g. by surface mount soldering, etc. Dispense a measured quantity of molding compound into the bottom heat sink panel. Press the bottom side of PCB panel up against bottom heat sink panel. Dispense a measured quantity of molding compound on the top side of the PCB panel. Press top heat sink panel into place on the PCB panel. Place the panel assembly on a rotary table away from the axis of rotation, preferably a large distance from the axis, and spin the rotary table and panel assembly to evacuate air bubbles in the interior cavity to achieve essentially void free fill of panel assembly with molding compound. Cure the molding compound. Cut the panel along the cut lines for singulation. Apply a conformal coating to protect the interconnects, or plate the interconnects, or attach a lead frame, motherboard, or connector to the exposed interconnects.

J. PCB Symmetries

Figure 27:
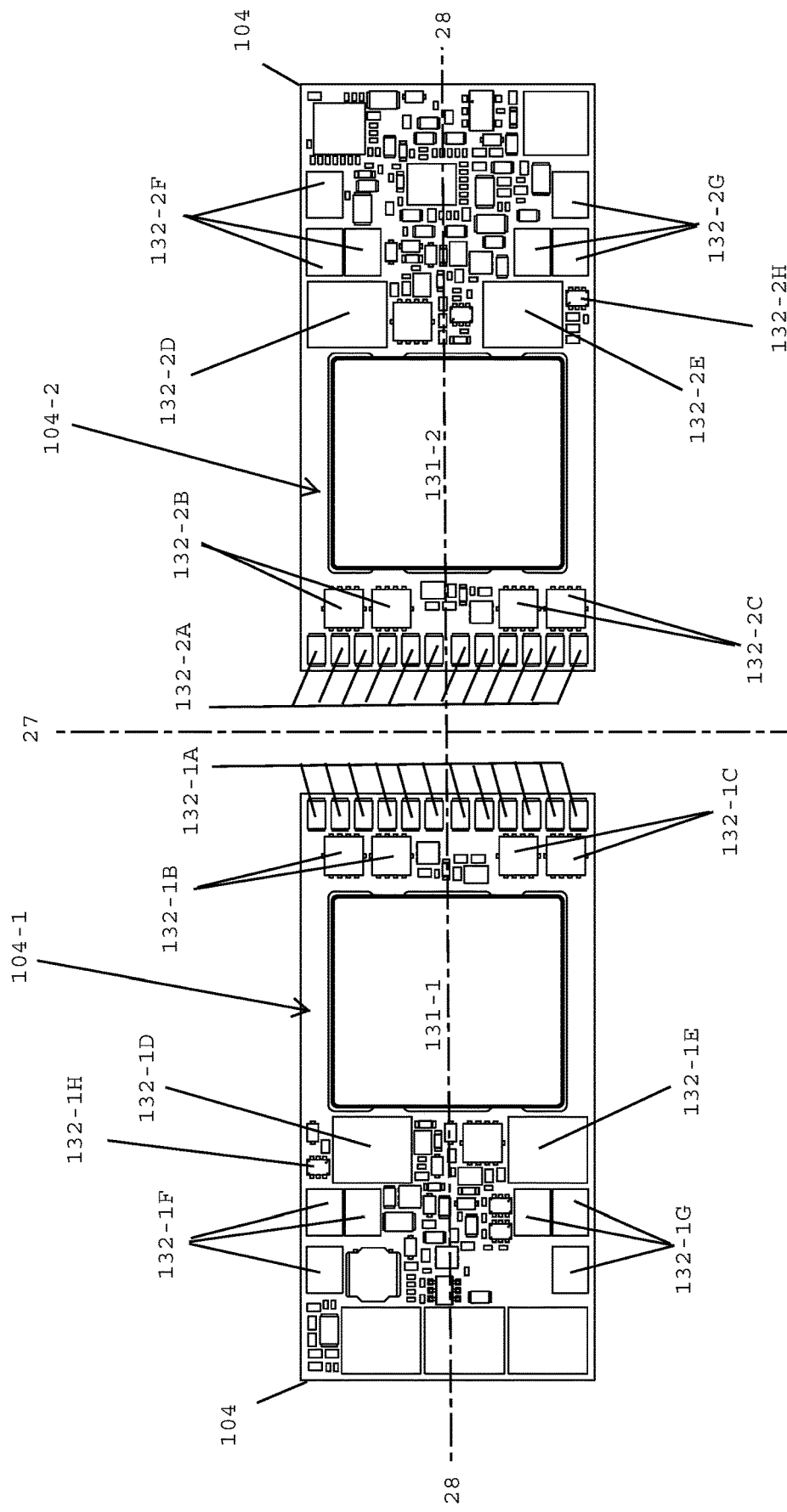
FIG. 27 shows top and bottom plan views of a section of a PCB illustrating symmetry of component layouts.

The components may be symmetrically arranged on the PCB such as shown in the power converter example of FIG. 27. The top 104-2 and bottom 104-1 faces of a populated PCB 104 from an individual power converter module are shown in plan view in FIG. 27. The populated PCB 104 is shown rotated along the vertical axis 27 in FIG. 27 to show the symmetry of the components.

J1. Symmetrical Distribution Between PCB Surfaces

Many of the larger components may be distributed equally between both faces of PCB 104 as shown in FIG. 27. For example, the four input field effect transistors (FETs) 132-2D, 132-2E, 132-1D, 132-1E are shown equally distributed between the top 104-2 and bottom 104-1 surfaces with two FETs on each surface. Similar equal distribution between the top 104-2 and bottom 104-1 surfaces of the PCB 104 are shown for the eight output FETs 132-2B, 132-2C, 132-1B, 132-1C with four output FETs on each surface; the twelve input capacitors, 132-2F, 132-2G, 132-1F, 132-1G, with six input capacitors on each surface; and twenty four output capacitors 132-2A, 132-1A with twelve output capacitors on each surface. Some of the FETs can function as switches. Distributing larger components between the two surfaces of the PCB may decrease stresses on the PCB, e.g. due to differences in the coefficient of expansion of the encapsulant, e.g. while curing, which may improve the co-planarity and mechanical integrity of the device.

J2. Symmetrical Distribution on a PCB Surface

On each surface of the PCB, components having similar characteristics, such as size or in-circuit power dissipation, may be arranged symmetrically for example as shown in FIG. 27 with respect to horizontal axis 28. It can be seem that relative to the horizontal axis 28, which is drawn longitudinally through the midline of the top and bottom surfaces of PCB 104, many of the components are arranged symmetrically. For example, the six input capacitors 132-1F and 132-1G on the bottom surface 104-1 are symmetrically distributed in a mirror-image relationship to each other relative to longitudinal midline axis 28. The same basic mirror image relationship is true for the six input capacitors 132-2F and 132-2G on the top 104-2 surface of the PCB. Similarly, the mirror image relationship is shown for the following pairs of components: bottom-side input FETs 132-1D and 132-1E, topside input FETs 132-2D and 132-2E, bottom-side output FETs 132-1B and 132-1C, topside output FETs 132-2B and 132-2C and also within the bottom-side and top-side banks of output capacitors 132-1A and 132-2A.

Distributing larger components symmetrically on a surface especially with respect to the longitudinal axis of the PCB may also decrease stresses on the PCB, e.g. due to differences in the coefficient of expansion of the encapsulant, e.g. while curing, which may also improve the mechanical integrity of the device. Additionally, spreading the components out symmetrically on each surface helps to spread the heat produced by power dissipating devices using a greater surface area for heat extraction improving the thermal performance.

J3. Symmetrical Footprints Between PCB Surfaces

In addition to being equally distributed between the top and bottom surfaces and being symmetrically distributed on each PCB surface, the components may also be situated such that pairs of components (wherein each component on one surface has a respective counterpart on the other surface) may be arranged to occupy essentially the same space on the PCB, i.e. a component may occupy a space on one surface that substantially overlaps with the footprint of a component on the other surface. For example, input capacitors 132-1F on the bottom surface are in the same position as their counterparts 132-2F on the top surface, i.e. they share the same footprint on the PCB. The same relationship is generally true for: input capacitors 132-1G and 132-2G; output capacitors 132-1A and 132-2A; input FETs 132-1D and 132-2D; input FETs 132-1E and 132-2E; output FETs 132-1B and 132-2B; output FETs 132-1C and 132-2C; in which the pairs of components occupy the same basic footprint, albeit on opposite surfaces, of the PCB. One benefit of sharing footprints allows the pair of components to share a common set of conductive vias used to electrically connect the components on the PCB surfaces to internal conductive layers, e.g. used to form the windings of the transformer. Because each via is used for both components in the pair, the total number of vias for making connections to the pair of components may be reduced (by as much as a factor of two) increasing the area of conductive layers useable for making connections and thus reducing resistance. For example, assuming 6 vias are required for each output FET (a total of 12 vias for two FETs), using symmetrical footprint approach, the pair of FETs can share the same 6 vias (without increasing the via resistance) and because the number has been reduced the useable area for conductors may be increased. Alternatively, while reducing the total number of vias from 12 to some intermediate number, e.g. 8, the resistance of the vias may be decreased because of the increase in effective vias per FET while still increasing the area useable for conductors.

J4. Symmetrical Power Dissipation Between PCB Surfaces

The components may be arranged between the PCB surfaces according to heat dissipated during operation. For example, the heat dissipative components may be arranged in a manner that distributes the heat evenly between the two PCB surfaces allowing heat produced by power dissipating devices to be extracted from both surfaces of the PCB improving the thermal performance. This type of heat dissipation symmetry is also factored into the component layout shown in the power converter of FIG. 27. For example, two input cells each using the same basic circuit topology are shown, one above and another below axis 28. As shown, the components of each input cell occupy both sides of the PCB in observance of other factors influencing component layout such as winding locations, etc. In this example, the upper input cell includes the two input FETs 132-1D and 132-2D, and the six input capacitors 132-1F and 132-2F. The lower input cell includes the two input FETs 132-1E and 132-2E, and the six input capacitors 132-1G and 132-2G. To ensure heat dissipation symmetry between the two surfaces, the cells may be arranged in mirror image layouts as shown. In FIG. 27, input FET 132-2E (top surface) in the lower cell corresponds to input FET 132-1D (bottom surface) in the upper cell. Similarly, lower cell input FET 132-1E (bottom surface) corresponds to upper cell input FET 132-2D (top surface). As can be seen, the significant power dissipative components of the input cells are arranged to have one component of one cell mounted on one surface with the respective component from the other cell mounted on the other surface. This type of symmetry may be seen in FIG. 27 with lower cell component 132-2H mounted on the top surface and the respective upper cell component 132-1H mounted on the bottom surface. In some examples, the FETs are arranged such that during operation, the power FETs on the top surface dissipate power at a level that is comparable to the level of power dissipated by the power FETs on the bottom surface. Also, the level of power dissipated by the power FETs in the upper input cell is comparable to the level of power dissipated by the power FETs in the lower input cell. For example, the level of power dissipated by the power FETs on one surface is less than 150% of the level of power dissipated by the power FETs on the other surface. The level of power dissipated by the power FETs in the upper cell is less than 150% of the level of power dissipated by the power FETs in the lower cell, and vice versa.

Laying out the components using any or all of the above symmetries produces several key benefits including, enhanced thermal performance, reducing top to bottom and side to side imbalances during encapsulation caused by asymmetrical distribution of components may enhance the co-planarity and structural integrity, and shared component footprints on top and bottom PCB surfaces may help reduce conduction losses and increase efficiency.

K. Center Plate Panel Assembly

In an alternate embodiment, an optional center plate 727 may be used between the top 721 and bottom 722 heat sink panels as illustrated in FIG. 28 through FIG. 32. The center plate 727, which may be made from aluminum, a molded high temperature plastic or any other material suitable for the molding process, includes an opening 729 in which the populated PCB panel 724 may sit during the panel molding process. As shown in the side view of FIG. 29 and the cross-sectional view of FIG. 32, the PCB panel 724 may sit entirely within the opening 729 and may have some high profile components, such as magnetic cores 131 and capacitors 132 (continuing with the power converter example), extending beyond the planar surfaces of the center plate. The recesses formed in the interior surfaces of the heat sink panels 721, 722 (described above) may accommodate portions of the components extending beyond the center plate surface. Conversely, protrusions from the interior surface of the heat sink panels may be used to reduce the distance between the heat sink and lower profile components. However, it may be preferable for ease of fabrication and tolerance control to avoid protrusions of the heat sink beyond the surface of the center plate which may put an upper limit on the thickness of the center plate in some embodiments.

Figure 28:
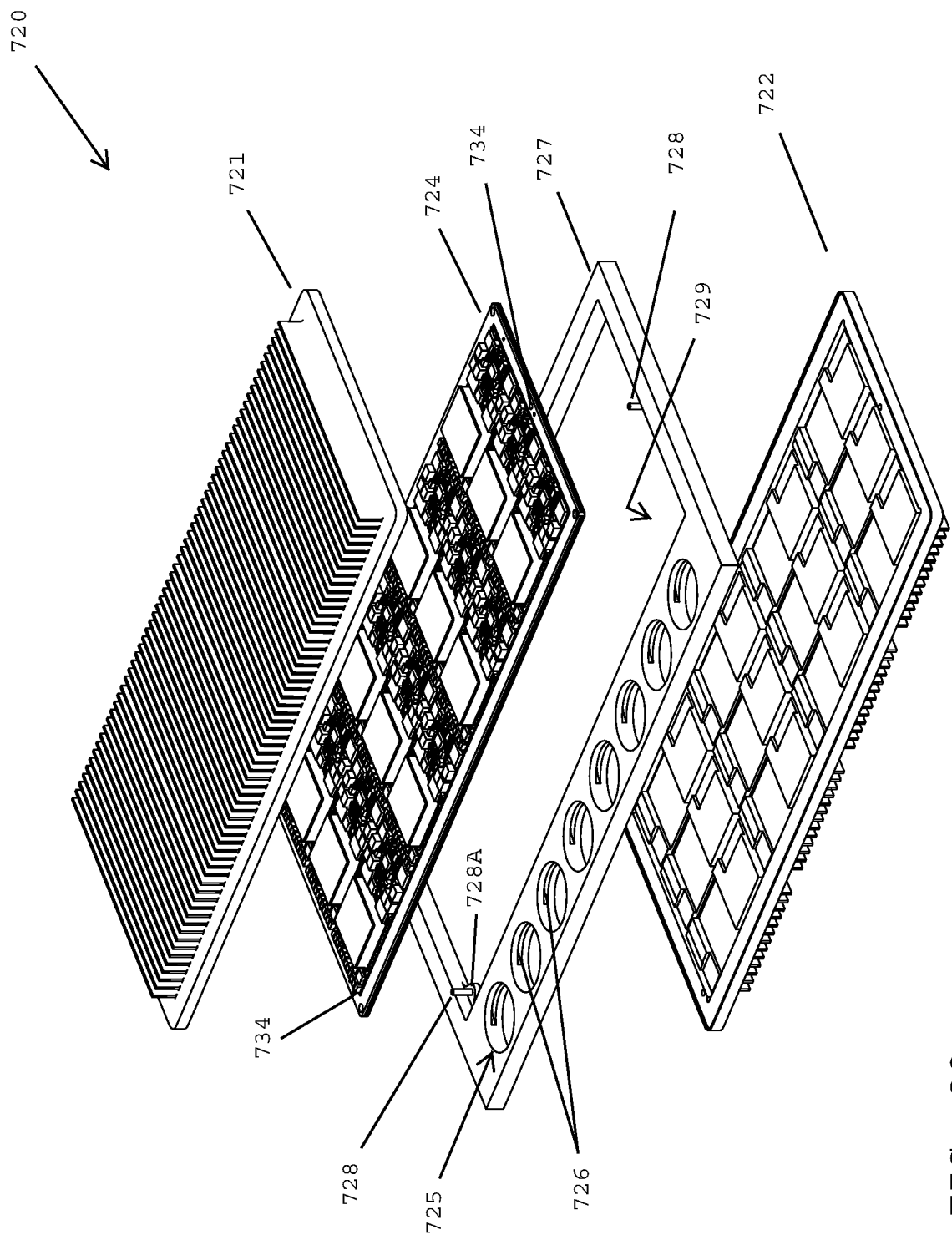
FIG. 28 shows an exploded perspective view of a panel assembly 720 including a manifold plate.
Figure 29:
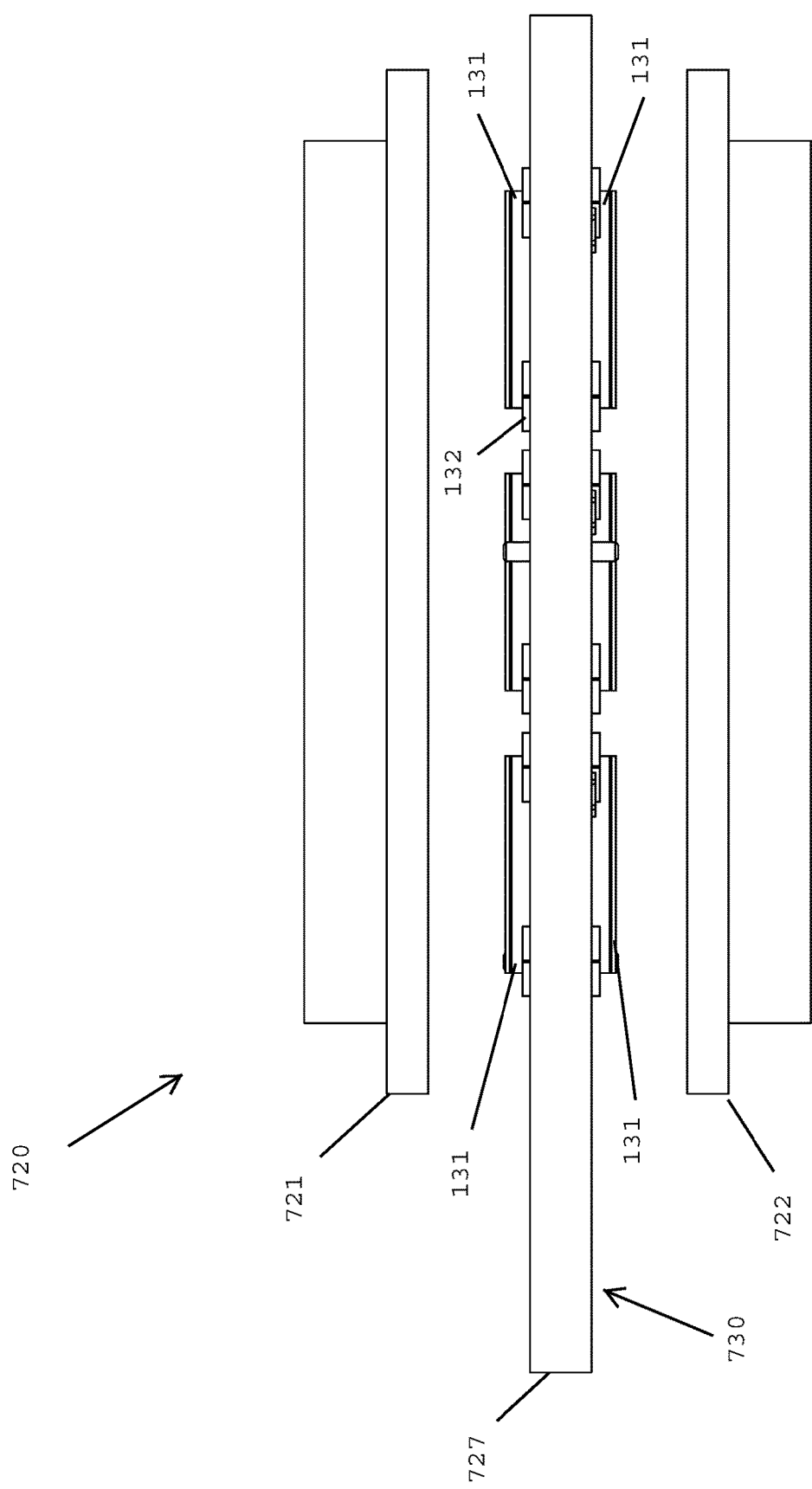
FIG. 29 is an exploded side view of the panel assembly 720 showing the PCB mated with the manifold plate.
Figure 31:
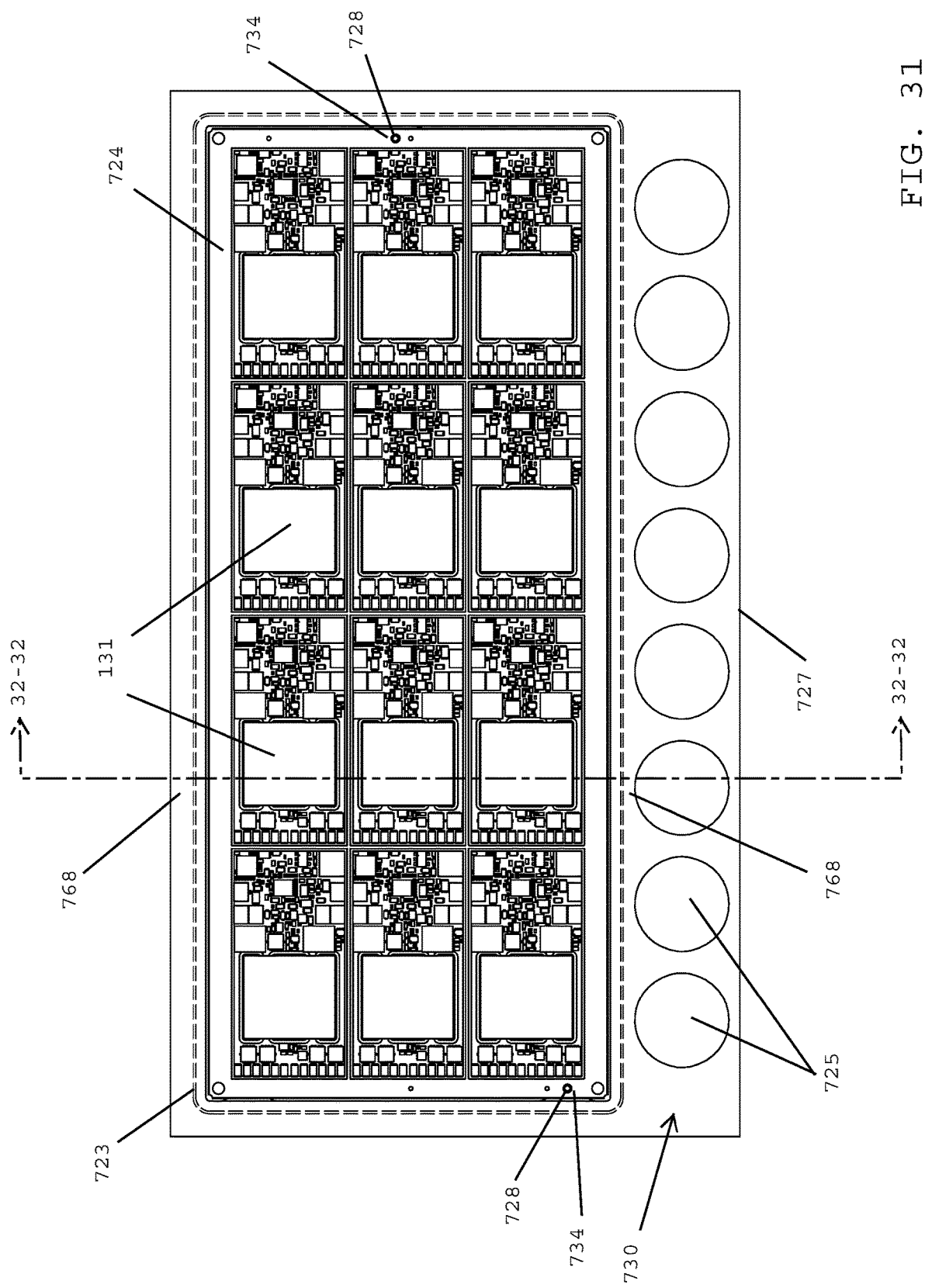
FIG. 31 shows a top plan view of the panel assembly 720 with the top heat sink panel removed.

As shown in the exploded perspective view of FIG. 28 and the top plan view of FIG. 31, registration features may be provided in the center plate 727. For example, registration pins 728 may mate with corresponding holes 734 in the PCB 724 to establish the horizontal position, i.e. in the X and Y directions, of the PCB relative to the center plate 727. Additional registration features such as the illustrated horizontal shelf 728A (FIG. 28), may be provided to establish the vertical position, i.e. in the Z direction, of the PCB relative to the center plate. The registration pins 728 may be long enough to extend beyond the upper surface of the PCB panel 724 in the upward direction and beyond the horizontal shelf in the downward direction to mate with holes (analogous to holes 152 and 153 in FIG. 4B) which may be provided in the top and bottom heat sink panels 721, 722 establishing the horizontal positions of the mold panels relative to the center plate 727. Provision of the registration features in the center plate may help relax certain precision requirements, the complexity, and thus the cost of the heat sink panels.

Figure 30:
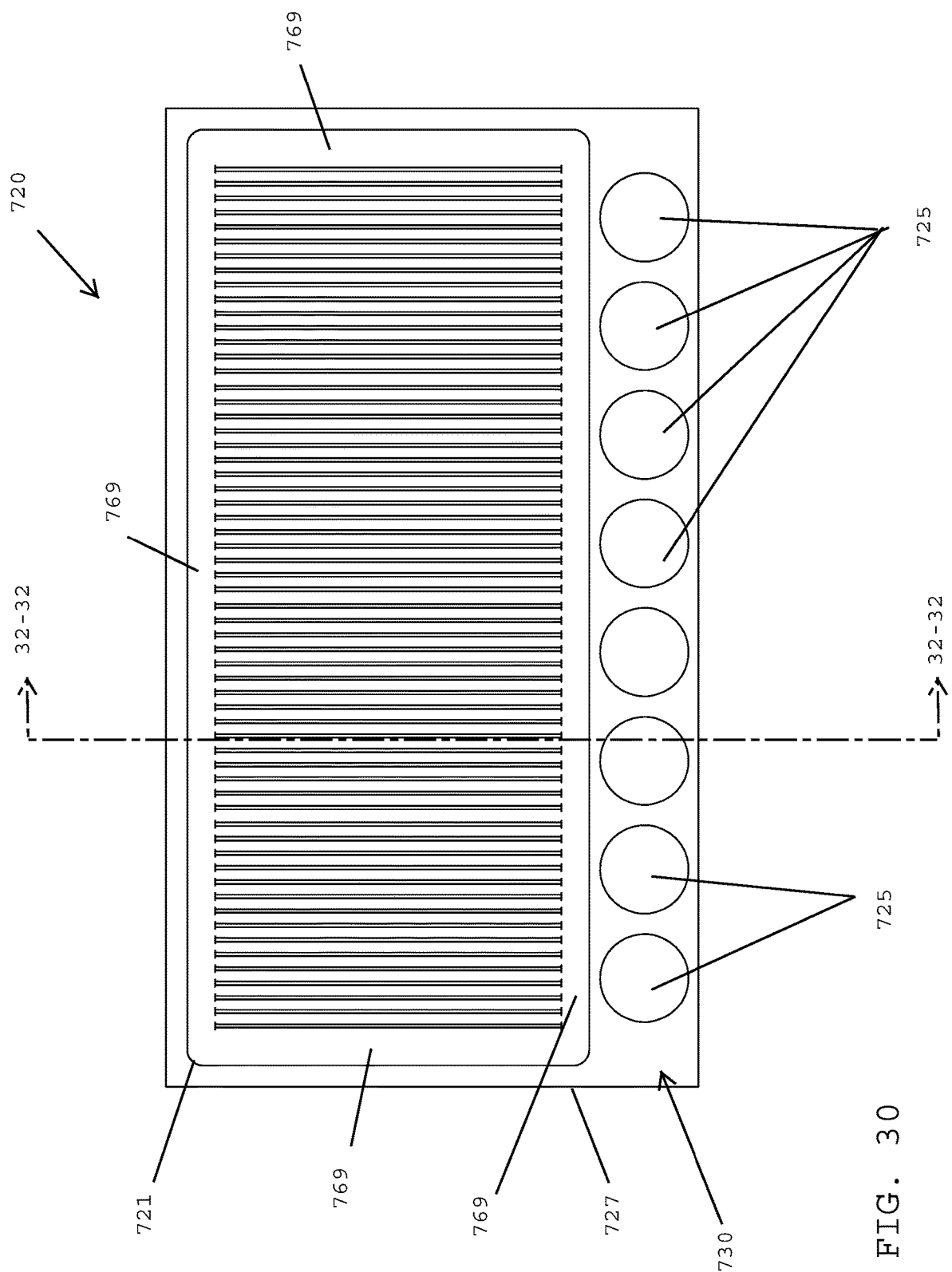
FIG. 30 shows a top plan view of the panel assembly 720.
Figure 32:
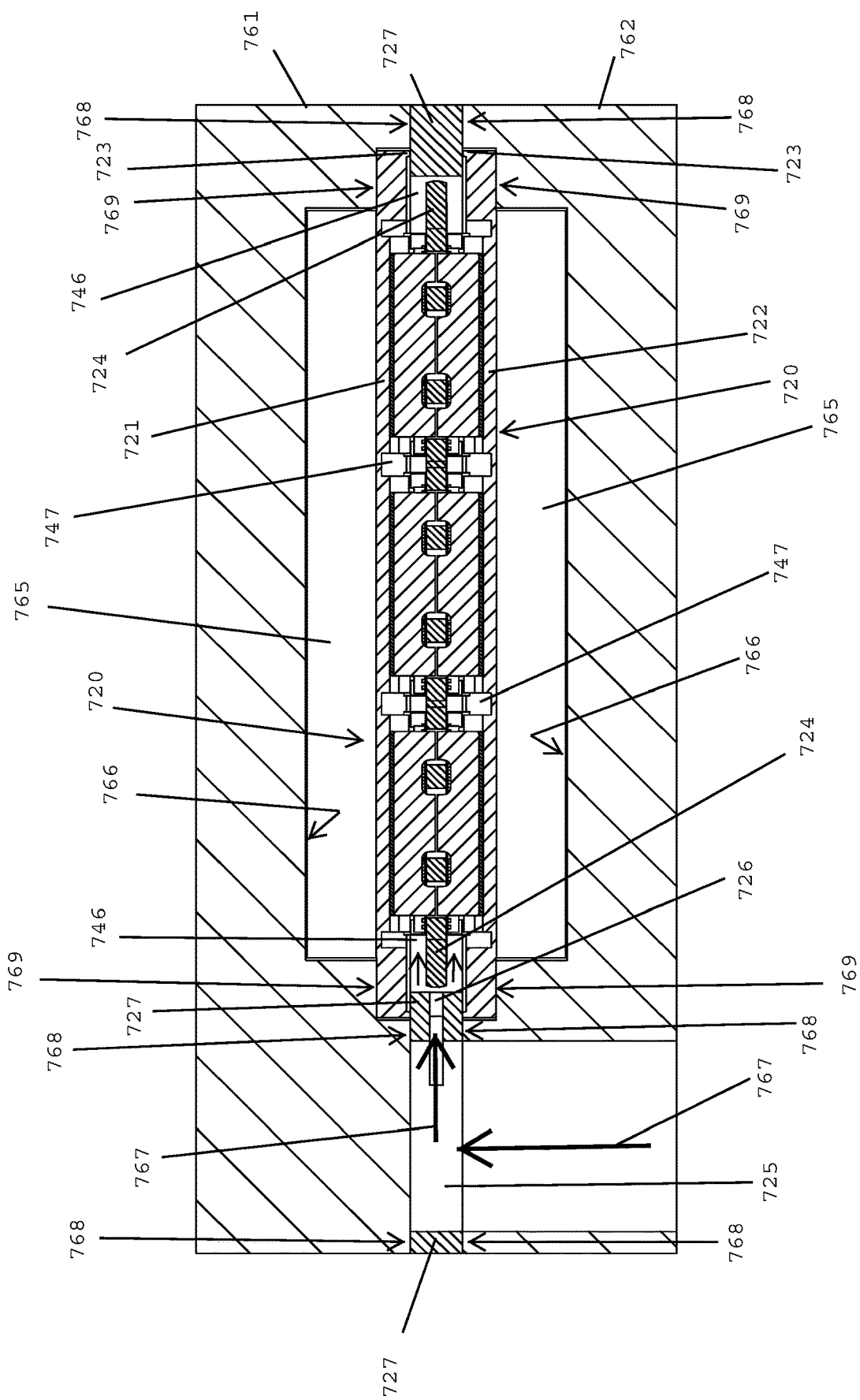
FIG. 32 shows a side view of the panel assembly 720 closed in a mold.

A cross-section of the panel assembly 720 closed in a mold press taken through line 32-32 in FIGS. 30 and 31 is shown in FIG. 32. As shown, the upper mold press 761 engages the center plate 727 directly along its perimeter in regions 768 and engages the heat sink panels directly along their perimeters in regions 769. Preferably the mold press includes recessed surfaces 766 providing cavities 765 large enough to accommodate a full range of fin heights (or other heat sink panel features) supporting a diverse range of products. To compensate for dimensional differences between the thickness of the heat sink panels in regions 769 and the difference in elevation between interface regions 768 and 769 in the mold press, one or more compressible features may be provided at the interface between the heat sink panels 721, 722 and the center plate 727. For example, a small crushable feature 723 may be formed along the perimeter of and as an integral part of the heat sink panels as illustrated in FIG. 32. Alternatively a gasket may be used between the center plate and one or both of the heat sink panels. As the press closes on the panel assembly 720 the crushable features 723 are compressed until the press is closed securely against both the center plate 727 and the heat sink panels 721, 722. As shown in FIG. 31, the crushable features may extend along the perimeter of the interior cavity forming a seal between each heat sink panel and the center plate.

The center plate may preferably include an extension, e.g. extension 730, to at least one side of opening 729 providing space for one or more chambers 725 as shown in FIGS. 30, 31, and 32. During the transfer molding process, encapsulation material may be forced from the chambers through one or more channels 726 (as shown in FIGS. 28 and 32) in the center plate into opening 729 and thus the cavity in which the populated PCB panel 724 is enclosed. An example of encapsulant flow through a chamber 725, channel 726, and into the interior cavity 746 is illustrated by the arrows 767 shown in FIG. 32.

In the center plate panel mold assembly, the top and bottom mold panels (i.e., heat sink panels 721, 722) close against the center plate instead of each other, reducing the thickness of the top and bottom mold panels, increasing the symmetry between, and reducing the complexity of, the top and bottom heat sink panels 721, 722, potentially simplifying the molding press, eliminating critical tolerance accumulations in the assembly, simplifying the process and reducing cost. For example, provision of the chambers 725 and conduits 726 in the center plate 727 eliminates the need for sealing along a second axis, e.g. in a horizontal direction and allows for use of a simpler cull-on-plate molding press. Critical tolerances are reduced to the one vertical dimension of the heat sink panels which can be relaxed using a crushable feature or a compliant material on the surface that interfaces with the center plate. Additionally, the center plate 727 may be standardized allowing a single configuration to be used with a large variety of heat sink panels such that the center plate may be cost-effectively molded.

A number of embodiments of the invention have been described. Nevertheless, it will be understood that various modifications may be made without departing from the spirit and scope of the invention. For example, non-metallic mold panels may be used. The center plate may be provided as a single-use consumable or may be modified to be used as a reusable fixture in the molding process. The center plate may be provided with or without the encapsulation channels. The registration holes in the heat sink panels may extend completely through the heat sink panels similar to hole 152 shown in FIG. 4B and the registration pins, e.g. pins 728 (FIGS. 28 and 31), may extend completely through each of the heat sink panels allowing fasteners to be used in conjunction with the pins to hold the panel assembly together before and after the encapsulation process. The fasteners may function as or be used in conjunction with a seal around the pin to contain any encapsulant. Throughput through the mold press may be increased by using panel assemblies that are secured together and removed from the mold press before the panel has cooled or the encapsulant has set or both. The registration pins 728 and corresponding holes 734 may be used to align the panel assembly during the singulation process. In some examples, a panel assembly (e.g., 120) may be formed by dispensing encapsulant into a bottom panel mold (e.g., heat sink panel 122), assembling a substrate (e.g., PCB panel 124) into the bottom panel mold, dispensing encapsulant onto a top of the substrate, and assembling a top panel mold (e.g., heat sink panel 121) onto the substrate. In some examples, the surfaces of the PCB panel 124 may have conductive features that are covered by an insulative layer. Blank mold panels may be machined to provide some or all of the various features described above in an on-demand manufacturing system.

In some examples, the upper and lower heat sinks 121, 122 are clamped together by the upper and lower mold presses 161, 162 at respective clamp regions of the upper and lower heat sinks 121, 122. The clamp region of the upper heat sink 121 can be located at points along a circumference of an internal cavity defined by the interior surface of the upper heat sink 121. The clamp region of the lower heat sink 122 can be located at points along a circumference of an internal cavity defined by the interior surface of the lower heat sink 122. In some examples, the clamp regions are cut away from the panel assembly 120 to expose the interconnects 111, 112, and 113. After the cut, portions of the upper and lower heat sinks 121, 122 near an active circuit area remain attached to the panel assembly 120, allowing heat from the active circuit area during operation to be dissipated through the remaining portions of the upper and lower heat sinks 121, 122. The active circuit area can be, e.g., an area of the PCB panel 124 having active components, such as magnetic core structures 131 and electronic components 132. Interlocking contours, other than the undercuts 148 shown in FIGS. 6, 7, and 12, can also be formed in the interior surface of the mold panel, the contour being filled with cured mold compound enhancing the structural integrity of the singulated module. In some examples, most of the large-footprint components (e.g., 132-2D, 132-2E, 132-2B, 132-2C) are distributed substantially symmetrically between quadrants surrounding the transformer core (e.g., 131-2) on a surface of the PCB panel 124. For example, in FIG. 27, the input FETs 132-2D and 132-2E are distributed substantially symmetrically between the upper-right and lower-right quadrants surrounding the transformer core 131-2. The output FETs 132-2B and 132-2C are distributed substantially symmetrically between the upper-left and lower-left quadrants surrounding the transformer core 131-2.

Accordingly, other embodiments are within the scope of the following claims.

What is claimed is:

1. An apparatus comprising:
a modular package having a first external surface, a second external surface opposite the first external surface, and a side wall extending along the perimeter of and connecting with the first and second external surfaces, the modular package including a first layer of metal defining the first external surface and a second layer of metal defining the second external surface, the first and second layers being separated by and in contact with cured mold compound; and
an electrical circuit for converting power, including a printed circuit board ("PCB"), a plurality of components including semiconductors mounted to the PCB, and a plurality of interconnects electrically connected to the components, the electrical circuit being located between the first and second layers and within the cured mold compound;
the side wall comprising a strip formed by the first layer, a strip formed by the second layer, a strip formed by the PCB, and one or more strips formed by the cured mold compound;
the interconnects being disposed within the side wall.

2. The apparatus of claim 1 wherein the first and second layers further comprise aluminum, and the first external surface further comprises a plurality of fins.

3. The apparatus of claim 1 wherein the first and second layers further comprise aluminum, and the first external surface comprises an essentially flat area.

4. The apparatus of claim 3 wherein the essentially flat area is adapted for a solder joint.

5. The apparatus of claim 1 wherein the PCB includes a top surface and a bottom surface, the semiconductors include large-footprint switches, a number, T, of top-side large-footprint switches are mounted on the top surface, a number, B, of bottom-side large-footprint switches are mounted on the bottom surface, and the number T is approximately equal to the number B.

6. The apparatus of claim 5 wherein each large-footprint switch is connected to one or more other components by a respective set of conductive vias in the PCB, and each of a plurality of the top-side large-footprint switches shares its respective set of conductive vias with a corresponding one of the bottom-side large-footprint switches.

7. The apparatus of claim 5 wherein each of most of the large-footprint switches is positioned on one surface in a location substantially overlapping a location on the other surface occupied by another large-footprint switch.

8. The apparatus of claim 1 wherein the PCB includes a top surface and a bottom surface, the semiconductors include large-footprint switches mounted on the top surface, most of the large-footprint components are distributed symmetrically between a left side of the top surface and an opposite right side of the top surface.

9. The apparatus of claim 1 wherein the PCB includes a top surface and a bottom surface, the semiconductors include large-footprint switches mounted on the top surface, and most of the large-footprint components are distributed symmetrically between quadrants on the top surface.

10. The apparatus of claim 9 wherein the components further comprise a transformer core, and the quadrants surround the transformer core.

11. The apparatus of claim 1 wherein the PCB includes a top surface and a bottom surface, the components include a set of high-profile components having similar heights, a number, T, of the high-profile components are mounted on the top surface, a number, B, of the high-profile components are mounted on the bottom surface, and the number T is approximately equal to the number B.

12. The apparatus of claim 11 wherein a spatial distribution of the high-profile components on the top surface roughly matches a spatial distribution of the high-profile components on the bottom surface.

13. The apparatus of claim 1 further comprising:
an adapter for providing mechanical and electrical connections between the modular package and an external mounting surface, the adapter having a body and a plurality of electrical terminals supported by the body; and
electrical connections formed between the adapter terminals and respective interconnects on the modular package,
the adapter body being mechanically secured to the modular package;
the adapter terminals being arranged to mate with the external mounting surface.

14. The apparatus of claim 13 wherein the external mounting surface is a circuit board and the terminals comprise ends constructed and arranged to be inserted into conductive holes in the circuit board.

15. The apparatus of claim 13 wherein the external mounting surface is a circuit board and the terminals comprise ends constructed and arranged to be surface mount soldered to the circuit board.

16. The apparatus of claim 13 wherein the external mounting surface includes a connector and the terminals comprise ends constructed and arranged to mate with the connector.

17. The apparatus of claim 13 wherein the interconnects are disposed along a long edge of the modular package, the adapter is secured to the long edge of the modular package, and the first and second layers of the modular package are oriented perpendicular to the mounting surface.

18. The apparatus of claim 13 wherein the interconnects are disposed along opposite edges of the modular package, the adapter is secured to the opposite edges, and the first and second layers of the modular package are oriented essentially parallel to the mounting surface.

19. The apparatus of claim 18 wherein the adapter is constructed and arranged to maintain one of the first or second layers in contact with the mounting surface.

20. The apparatus of claim 1 wherein the interconnects further comprise a surface constructed and arranged for engagement with a connector terminal.

21. The apparatus of claim 1 wherein the interconnects further comprise a layer of metal plating.

22. The apparatus of claim 1 wherein the first layer further comprises contours formed in an interior surface of the first layer, the contours including a first feature having a shape and an elevation to accommodate a first component on the PCB, the first component having a height greater than or less than other components on the PCB.

23. The apparatus of claim 22 wherein the first component includes a magnetic core structure and the elevation is a recess in the interior surface.

24. The apparatus of claim 22 wherein the first component includes a semiconductor switch and the elevation is a protrusion from the interior surface.

25. The apparatus of claim 1 further comprising interlocking features comprising a contour formed in an interior surface of the first layer, the contour being filled with cured mold compound.

26. The apparatus of claim 1 wherein the modular package further comprises a recess formed in the first layer adjacent one or more of the interconnects providing a setback between the first layer and the one or more interconnects.

\* \* \* \* \*

UNITED STATES PATENT AND TRADEMARK OFFICE
CERTIFICATE OF CORRECTION

PATENT NO. : 10,791,645 B1  
APPLICATION NO. : 16/791478  
DATED : September 29, 2020  
INVENTOR(S) : Patrizio Vinciarelli et al.

It is certified that error appears in the above-identified patent and that said Letters Patent is hereby corrected as shown below:

In the Specification

Column 7, Line 48, delete "apparatus of claim 151 wherein the".

Column 18, Line 56, delete "FIG." and insert -- FIGS. --.

Signed and Sealed this
Twenty-third Day of March, 2021

Drew Hirshfeld
*Performing the Functions and Duties of the
Under Secretary of Commerce for Intellectual Property and
Director of the United States Patent and Trademark Office*